United States Patent [19] [11] Patent Number: 5,696,472
Kaida [45] Date of Patent: Dec. 9, 1997

[54] STACKED LADDER-TYPE FILTER UTILIZING AT LEAST ONE SHEAR MODE PIEZOELECTRIC RESONATOR

[75] Inventor: Hiroaki Kaida, Nagaokakyo, Japan

[73] Assignee: Murata Manufacturing Co., Ltd., Japan

[21] Appl. No.: 443,783

[22] Filed: May 18, 1995

Related U.S. Application Data

[62] Division of Ser. No. 287,530, Aug. 8, 1994.

[30] Foreign Application Priority Data

| Aug. 17, 1993 | [JP] | Japan | 5-203426 |
| Sep. 2, 1993 | [JP] | Japan | 5-218585 |
| Sep. 30, 1993 | [JP] | Japan | 5-244569 |
| Sep. 30, 1993 | [JP] | Japan | 5-244570 |
| Oct. 1, 1993 | [JP] | Japan | 5-247182 |
| Dec. 16, 1993 | [JP] | Japan | 5-316282 |

[51] Int. Cl.$^6$ .................................................. H03H 9/54
[52] U.S. Cl. ................................................ 333/189; 310/368
[58] Field of Search ................................ 333/187, 189; 310/320, 367, 368

[56] References Cited

U.S. PATENT DOCUMENTS

| 2,231,483 | 2/1941 | Smalts | 310/350 |
| 2,443,471 | 6/1948 | Mason | 333/187 |
| 3,185,943 | 5/1965 | Honda et al. . | |
| 3,411,023 | 11/1968 | Quate | 310/323 |
| 3,488,530 | 1/1970 | Staudte | 310/321 |
| 3,723,920 | 3/1973 | Sheahan et al. | 333/181 |
| 3,745,385 | 7/1973 | Nakajima | 310/367 X |
| 4,101,795 | 7/1978 | Fukomoto et al. | 310/336 |
| 4,104,553 | 8/1978 | Engdahl | 310/352 |
| 4,287,493 | 9/1981 | Masaie | 333/197 |
| 4,323,865 | 4/1982 | Tanaka | 333/189 |
| 4,348,609 | 9/1982 | Inoue | 310/367 |
| 4,350,918 | 9/1982 | Sato | 310/368 |

(List continued on next page.)

FOREIGN PATENT DOCUMENTS

| 0365268 | 4/1990 | European Pat. Off. | 310/367 |
| 0496583 | 1/1992 | European Pat. Off. . | |
| 2547458 | 2/1984 | France | 310/346 |
| 2939844 | 7/1980 | Germany . | |
| 3220032 | 12/1982 | Germany . | |
| 4321949 | 1/1994 | Germany . | |
| 55-49013 | 4/1980 | Japan . | |
| 55-52621 | 4/1980 | Japan | 310/368 |
| 55-64414 | 5/1980 | Japan | 310/344 |
| 57-48818 | 3/1982 | Japan | 310/344 |
| 57-91016 | 6/1982 | Japan | 333/187 |
| 60-137113 | 7/1985 | Japan . | |
| 0154211 | 7/1986 | Japan . | |
| 63-187907 | 8/1988 | Japan | 333/187 R |
| 63-253711 | 10/1988 | Japan | 333/189 |
| 63-260310 | 10/1988 | Japan . | |

(List continued on next page.)

OTHER PUBLICATIONS

Co-pending U.S. Patent Application No. 08/423,466.
Co-pending U.S. Patent Application No. 08/524,052.
Co-pending U.S. Patent Application No. 08/459,185.
J. Ormondroyd et al., "The Theory of the Dynamic Vibration Absorber", pp. 9–22, *Transactions of the American Society of Mechanical Engineers*, APM–50–7, 1929.

(List continued on next page.)

*Primary Examiner*—Benny T. Lee
*Assistant Examiner*—Justin P. Bettendorf
*Attorney, Agent, or Firm*—Ostrolenk, Faber, Gerb & Soffen, LLP

[57] ABSTRACT

A ladder-type filter having a circuit structure obtained by connecting a plurality of series resonators and a plurality of parallel resonators with each other. At least one plate type series resonator and at least one plate type parallel resonator are stacked with each other. At least one of the series and parallel resonators is an energy trap type piezo-resonator having a plate type piezoelectric vibrating part, a support part which is coupled to the piezoelectric vibrating part, and a holding part which is coupled to the support part.

15 Claims, 44 Drawing Sheets

U.S. PATENT DOCUMENTS

| | | | |
|---|---|---|---|
| 4,355,257 | 10/1982 | Kawashima et al. | 310/320 X |
| 4,356,421 | 10/1982 | Shimizu et al. | 310/320 |
| 4,360,754 | 11/1982 | Toyoshima et al. | 310/366 |
| 4,365,181 | 12/1982 | Yamamoto | 310/320 |
| 4,443,728 | 4/1984 | Kudo | 310/312 |
| 4,447,753 | 5/1984 | Ochiai | 310/312 |
| 4,454,444 | 6/1984 | Fujiwara et al. | 310/360 |
| 4,462,092 | 7/1984 | Kawabuchi et al. | 310/336 X |
| 4,484,382 | 11/1984 | Kawashima | 310/312 X |
| 4,511,202 | 4/1985 | Kasai | 333/189 |
| 4,555,682 | 11/1985 | Gounji et al. | 333/189 |
| 4,562,372 | 12/1985 | Nakamura et al. | 310/321 |
| 4,564,825 | 1/1986 | Takahashi et al. | 333/189 X |
| 4,571,794 | 2/1986 | Nakamura | 29/25.35 |
| 4,609,844 | 9/1986 | Nakamura et al. | 310/321 |
| 4,757,581 | 7/1988 | Yamada et al. | 310/368 X |
| 4,900,971 | 2/1990 | Kawashima | 310/361 |
| 5,001,383 | 3/1991 | Kawashima | 310/367 |
| 5,006,824 | 4/1991 | Paff | 333/197 |
| 5,059,853 | 10/1991 | Kawashima | 310/367 |
| 5,107,164 | 4/1992 | Kimura | 310/367 |
| 5,117,147 | 5/1992 | Yoshida | 310/320 |
| 5,118,980 | 6/1992 | Takahashi | 310/320 |
| 5,159,301 | 10/1992 | Kaida et al. | 333/187 |
| 5,192,925 | 3/1993 | Kaida | 310/362 X |
| 5,202,652 | 4/1993 | Tabuchi et al. | 333/193 |
| 5,218,260 | 6/1993 | Kawashima | 310/367 |
| 5,260,675 | 11/1993 | Ogawa et al. | 333/189 |
| 5,274,297 | 12/1993 | Hermann et al. | 310/367 X |
| 5,302,880 | 4/1994 | Kaida | 310/370 |
| 5,341,550 | 8/1994 | Kaida | 310/321 X |
| 5,361,045 | 11/1994 | Beaussier et al. | 310/366 X |
| 5,394,123 | 2/1995 | Inoue et al. | 333/189 |
| 5,422,532 | 6/1995 | Inoue et al. | 310/367 X |
| 5,442,251 | 8/1995 | Kaida et al. | 310/321 |
| 5,495,135 | 2/1996 | Zimnicki et al. | 310/320 X |

FOREIGN PATENT DOCUMENTS

| | | | |
|---|---|---|---|
| 63-260311 | 10/1988 | Japan | 310/367 |
| 63-311810 | 12/1988 | Japan | 310/367 |
| 0180109 | 7/1989 | Japan . | |
| 0275213 | 3/1990 | Japan . | |
| 0279509 | 3/1990 | Japan . | |
| 0279510 | 3/1990 | Japan . | |
| 0279511 | 3/1990 | Japan | 310/367 |
| 3226106 | 10/1991 | Japan . | |
| 4192909 | 7/1992 | Japan . | |
| 5075372 | 3/1993 | Japan | 333/187 |
| 0661775 | 3/1994 | Japan . | |
| 6164307 | 6/1994 | Japan . | |
| 1358596 | 6/1970 | United Kingdom . | |
| 2004434 | 3/1979 | United Kingdom . | |
| 2043995 | 10/1979 | United Kingdom . | |
| 2102199 | 5/1982 | United Kingdom . | |
| 2117968 | 3/1983 | United Kingdom . | |
| 2213013 | 8/1989 | United Kingdom . | |
| 2224159 | 4/1990 | United Kingdom . | |
| 2277228 | 10/1994 | United Kingdom . | |
| 2278721 | 12/1994 | United Kingdom . | |
| 9216997 | 10/1992 | WIPO . | |

OTHER PUBLICATIONS

Co-pending U.S. Patent application No. 08/443,783.
Co-pending U.S. Patent application No. 08/292,244.
Co-pending U.S. Patent application No. 08/426,689.
Co-pending U.S. Patent application No. 08/444,831.
Co-pending U.S. Patent Application No. 08/227,279.
Co-pending U.S. Patent application No. 08/287,530.
*Transducers & Their Elements: Design & Application,* Alexander D. Khazan "Strain-gage, Elements," p. 41, 1993.
Mechanical Vibrations, J.P. Den Hartog, 1984, "3,2. The Undamped Dynamic Vibration Absorber.", pp. 87–93.
Vibration Engineering, Osamu Taniguchi, pp. 112–116, and English Translation.
Co-pending U.S. Patent Application No. 08/485,171.
Co-pending Patent Applicaiton No. 08/452,516.
Co-pending U.S. Patent Application No. 08/227,607.
Co-pending U.S. Patent Application No. 08/285,233.
Co-pending U.S. Patent Application No. 08/506,262.
Inoue, et al., "First and Second Order Group Timing tank Ceramic Filters for PCM Carriers Systems," Japanese Journal of Applied Physics, vol. 20 (1981) Supplemental 20–4, pp. 101–104.

FIG. 1 PRIOR ART
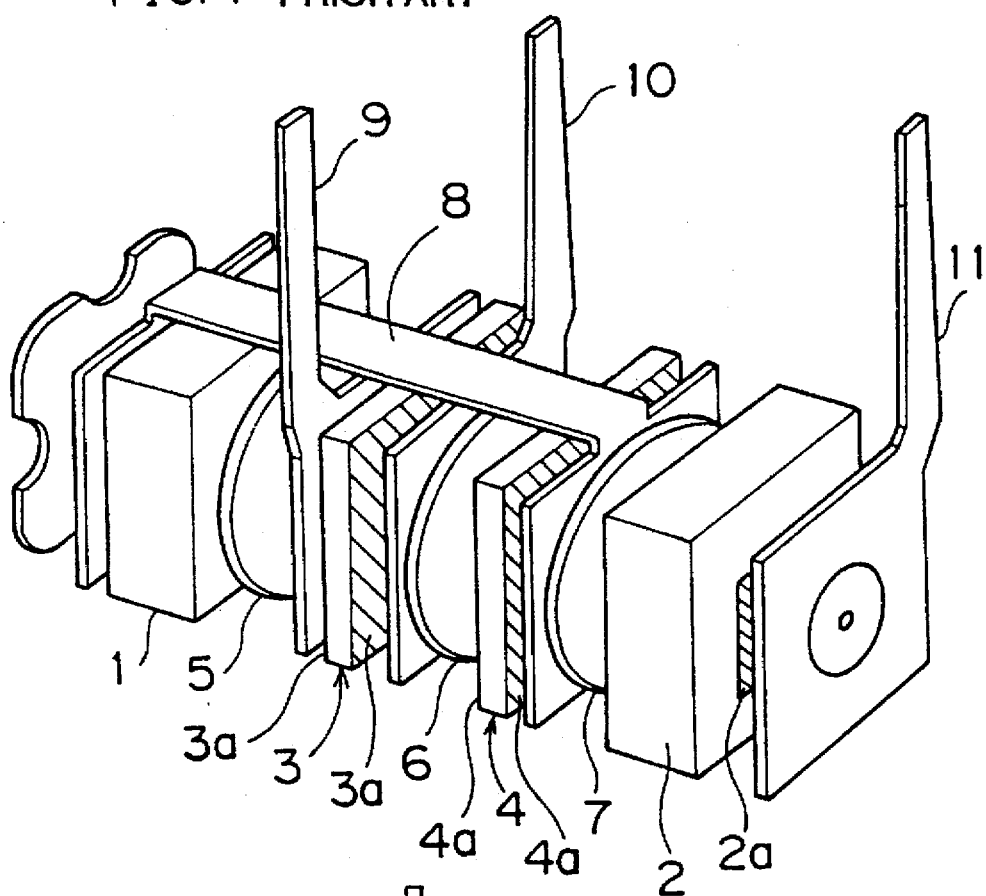
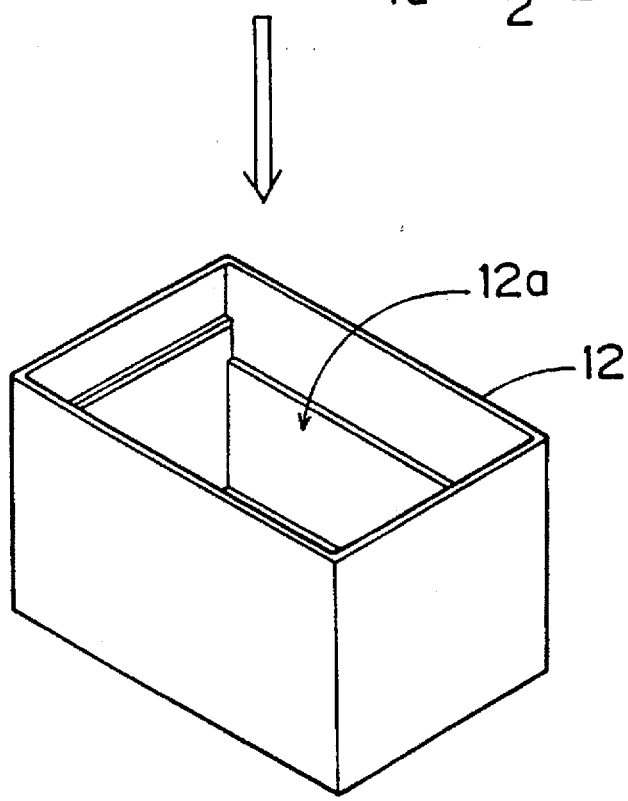

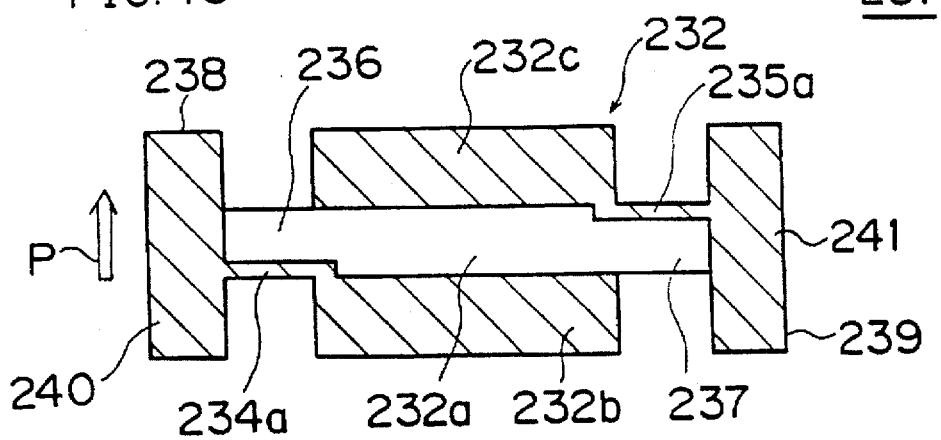
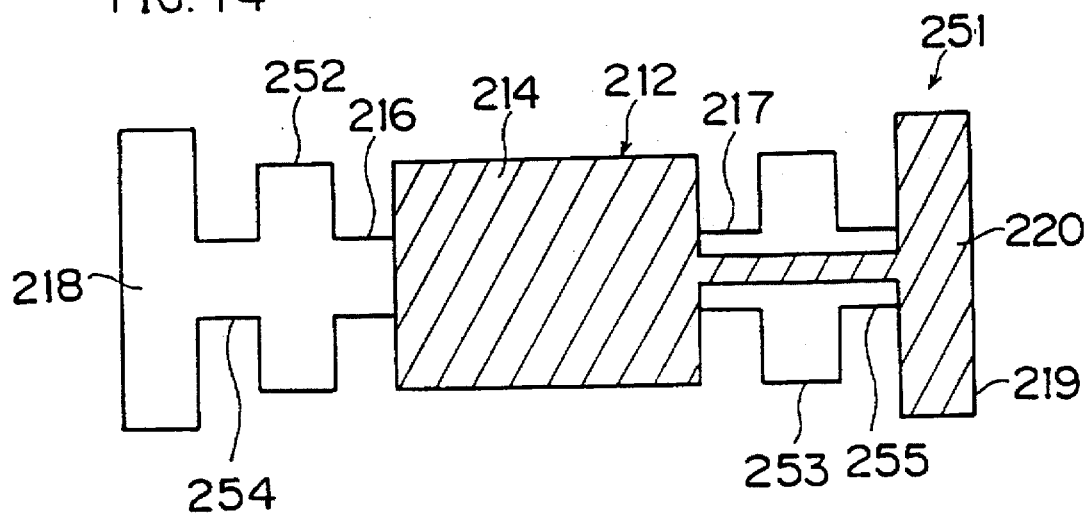
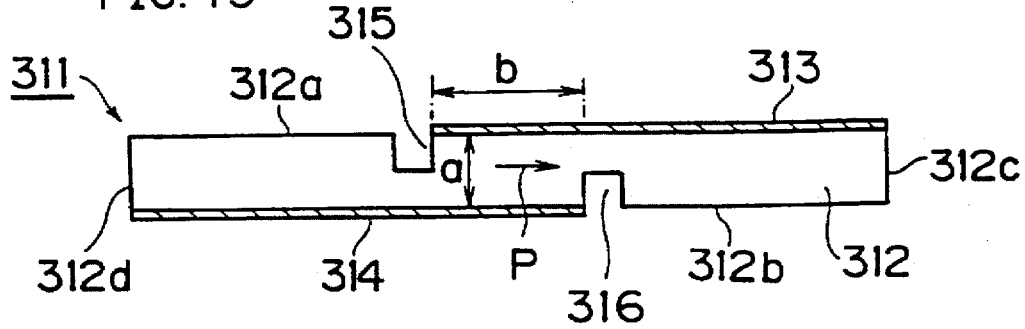

STACKED LADDER-TYPE FILTER UTILIZING AT LEAST ONE SHEAR MODE PIEZOELECTRIC RESONATOR

This is a division of Ser. No. 08/287,530, filed Aug. 8, 1994, pending.

BACKGROUND OF THE INVENTION

1. Field of the Invention

The present invention relates to a ladder-type filter comprising at least one series resonator and at least one parallel resonator which are connected with each other in the form of a ladder, and more particularly, the present invention relates to a ladder-type filter which has an improved resonator structure forming the series and parallel resonators.

2. Description of the Background Art

FIG. 1. shows an exemplary structure of a conventional ladder-type filter. This ladder-type filter is formed by a plurality of angular piezo-resonators utilizing an expansion vibration mode. Namely, a two-stage ladder-type filter having four elements shown in a circuit diagram in FIG. 2 is formed by rectangular plate type series resonators 1 and 2 and rectangular plate type parallel resonators 3 and 4.

Referring to FIG. 1, numeral 2a denotes an electrode which is formed on one major surface of the series resonator 2, while a similar electrode is also formed on another major surface of the series resonator 2. Further, similar electrodes are also formed on both major surfaces of the series resonator 1. On the other hand, electrodes 3a and 4a are formed entirely over both major surfaces of the series resonators 3 and 4, respectively.

Numerals 5 to 11 denote metal terminals, which are employed to electrically connect the series resonators 1 and 2 and the parallel resonators 3 and 4 with each other as shown in FIG. 2. These metal terminals 5 to 11 are stored in a case member 12, which is made of an insulating material, with the series resonators 1 and 2 and the parallel resonators 3 and 4. A cover member (not shown) closes an upper opening 12a of the case member 12, thereby forming a ladder-type filter component. The metal terminals 9 to 11 are drawn out from the case member 12, to be employed as terminals for connection with an exterior component.

In order to drive the aforementioned ladder-type filter, it is necessary that the series resonators 1 and 2 and the parallel resonators 3 and 4 which are stored in the case member 12 can vibrate in desired modes. In other words, the resonators 1 to 4 must not be inhibited from vibrating within the case member 12. Therefore, the metal terminal 11 which is located on an end portion is formed of a spring terminal having a spring property.

In the ladder-type filter shown in FIG. 1, however, a considerably large unnecessary space is required due to the metal terminal 11 which is formed by a spring terminal for allowing vibration of the resonators 1 to 4 stored in the case member 12, and hence the overall ladder-type filter has a considerably large size. For example, the complete two-stage ladder-type filter containing four elements shown in FIG. 1 is about 7.0 mm by 8.0 mm by 8.0 mm.

In recent years, there has been a demand for a filter which is formed as a surface-mount type electronic component.

To this end, co-pending U.S. patent application Ser. No. 07/941,081 and International Laying-open No. WO 92/16997 describe a ladder-type filter which can be reduced in overall size and formed as a surface-mount type electronic component. In this ladder-type filter, series and parallel resonators are formed by tuning fork type piezo-resonators defining tuning fork type vibrating parts on one edge of a piezoelectric plate. Further, a plurality of tuning fork type piezo-resonators forming the series and parallel resonators are stacked with each other through a cavity forming member for ensuring cavities for allowing vibration of the tuning fork type vibrating parts, to be integrated with each other.

In the aforementioned ladder-type filter employing tuning fork type piezo-resonators, it is possible to implement simplification of assembling steps, miniaturization and surface mounting. In this ladder-type filter, however, it is impossible to ensure a sufficient bandwidth, due to employment of the tuning fork type piezo-resonators.

SUMMARY OF THE INVENTION

An object of the preferred embodiments of the present invention is to provide a ladder-type filter which achieves simplification of manufacturing steps, miniaturization and surface mounting, as well as insurance of a sufficient bandwidth.

According to one aspect of the preferred embodiments of the present invention, a ladder-type filter includes at least one series resonator forming a series arm, and at least one parallel resonator forming a parallel arm, and at least two of the series and parallel resonators are stacked along the thickness direction.

The ladder-type filter according to the preferred embodiments of the present invention can be reduced in height, since at least two of the series and parallel resonators are laterally coupled with each other in a direction which is parallel to a mounting surface. Further, the ladder-type filter can also be readily formed as a chip-type component, due to such a structure.

According to the preferred embodiments of the present invention, further, at least one of the series and parallel resonators comprises an energy trap type piezo-resonator having a plate type piezoelectric vibrating part, a support part which is coupled to the piezoelectric vibrating part, and a holding part which is coupled to the support part, so that no vibrational energy is transmitted to the support part. Therefore, it is possible to fix this piezo-resonator to another piezo-resonator or a case substrate through the holding part, without deteriorating resonance characteristics of the piezo-resonator.

The energy trap type piezo-resonator can be selected from various types of piezo-resonators.

A first type piezo-resonator is an energy trap type piezo-resonator utilizing a width expansion mode.

As will be explained below, the width expansion mode is a newly discovered vibration mode that results in no vibration being transmitted to a support part. Because of the structure of the width expansion mode vibrator, vibration is trapped within the vibration part and is not transmitted to the support part. The width expansion mode vibrator includes a rectangular plate type piezoelectric vibrating part having longer and shorter sides which are selected so as to define a ratio b/a which is within the range of ±10% of the following value:

$$b/a = n(-1.47\sigma + 1.88) \quad (1)$$

where a and b represent lengths of the shorter and longer sides, respectively, a represents the Poisson's ratio of the material forming the piezoelectric vibrating part and n represents an integer, a support part which is coupled to the center of each shorter side of the piezoelectric vibrating part, and a holding part which is coupled to an outer end of the support part.

As clearly understood from the preferred embodiments described later, the aforementioned width expansion mode is one of the vibration modes of a rectangular plate type vibrator, which vibrates in a vibrating state between expansion mode vibration of a square vibrator and width mode vibration of a rectangular vibrator.

In the aforementioned piezo-resonator utilizing a width expansion mode, it is possible to support the piezoelectric vibrating part while trapping its vibrational energy by simply fixing or integrating the support part to or with the center of each shorter side of the piezoelectric vibrating part, whereby the support structure can be simplified. Thus, it is possible to form a miniature ladder-type filter by combining this piezo-resonator with another resonator through the holding part which is provided on the outer side of the support part.

Further, the piezoelectric vibrating part is excited in a width expansion mode, whereby it is also possible to obtain a ladder-type filter having a wider frequency band as compared with the prior art.

According to another aspect of the preferred embodiments of the present invention, the ratio between the longer and shorter sides of the rectangular plate type piezoelectric vibrating part utilizing a width expansion mode is set in the aforementioned preferred range, whereby width expansion mode vibration is efficiently excited and trapped. This phenomenon has been experimentally confirmed by the inventor.

A second type of piezo-resonator is an energy trap type piezo-resonator utilizing a shear mode comprising a piezoelectric vibrating part having a plate type piezoelectric member which is polarized in one direction and first and second resonance electrodes which are disposed on the piezoelectric member for applying an alternating voltage in a direction perpendicular to the polarization direction, so that a surface of the piezoelectric member which is parallel to the polarization direction has a rectangular shape with a ratio b/a being in a range of ±10% of the following value:

$$b/a = n(0.3\sigma + 1.48) \qquad (2)$$

assuming that a and b represents lengths of shorter and longer sides of the rectangular piezoelectric surface, respectively, $\sigma$ represents the Poisson's ratio of the piezoelectric member and n represents an integer, and further comprising a support part which is coupled to the piezoelectric vibrating part, and a holding part which is coupled to the support part.

In the second type piezo-resonator, the piezoelectric vibrating part is formed to have the aforementioned specific shape, whereby vibrational energy is effectively trapped in the piezoelectric vibrating part when an alternating voltage is applied across the first and second resonance electrodes to resonate the piezoelectric vibrating part. The phenomenon has been experimentally confirmed by the inventor.

The vibrational energy is effectively trapped in the piezoelectric vibrating part also in the second type of energy trap piezo-resonator as described above, whereby the second type of energy trap piezo-resonator can be supported through the holding part with substantially no deterioration of resonance characteristics. Thus, it is possible to readily form a miniature ladder-type filter by combining the piezo-resonator with another resonator through the holding part.

Since this piezo-resonator utilizes a shear mode, it is possible to widen the frequency band of the ladder-type filter as compared with a piezoelectric tuning fork type resonator.

A third type piezo-resonator is an energy trap type piezo-resonator comprising a plate type piezoelectric vibrating part having a pair of opposite rectangular surfaces and four side surfaces coupling the pair of rectangular surfaces with each other, first and second resonance electrodes which are formed on the pair of rectangular surfaces of the piezoelectric vibrating part, a support part which is coupled to each of the shorter sides of the rectangular surface, and a holding part which is coupled to the support part. In this piezo-resonator, a ratio b/a is set in a range of ±10% of the following value:

$$b/a = n(0.3\sigma + 1.48) \qquad (3)$$

assuming that a and b represent shorter and longer sides of the rectangular surfaces, respectively, $\sigma$ represents the Poisson's ratio of the material forming the piezoelectric vibrating part and n represents an integer, the piezoresonator being adapted and constructed for exciting bending mode vibration of degree 2 n through a piezoelectric transverse effect. Also in the third type of piezo-resonator, the piezoelectric vibrating part is formed to have the aforementioned specific shape, whereby bending mode vibration of degree 2 n is effectively trapped in the piezoelectric vibrating part. This phenomenon has been experimentally confirmed by the inventor.

Resonance energy is effectively trapped in the piezoelectric vibrating part also in a ladder-type filter employing the third type piezo-resonator, whereby the third type piezo-resonator can be readily combined with another resonator or bonded to a case substrate through the holding part, with substantially no deterioration of resonance characteristics. Thus, it is possible to form a miniature ladder-type filter having stable characteristics, which can have a simplified support structure.

A fourth type of piezo-resonator is an energy trap type piezoelectric resonator having a dynamic damper provided between a piezoelectric vibrating part and a holding part. In this structure, vibrational energy is effectively trapped in the vibrating part which is connected to the dynamic damper, due to a phenomenon of a dynamic damper. Such a phenomenon of a dynamic damper is described in detail in "Vibration Engineering" by Osamu Taniguchi, Carona Publishing Co., Ltd., pp. 113 to 116, for example. Briefly stated, the phenomenon of a dynamic damper is such a phenomenon that vibration of a principal vibrator which must be prevented from vibration is suppressed when a subvibrator is coupled to the principal vibrator with proper selection of its natural frequency. The aforementioned dynamic damper corresponds to the subvibrator in this phenomenon of a dynamic damper, while the support part which vibrates by vibration from a resonance part corresponds to the principal vibrator.

In a ladder-type filter employing the fourth type of piezo-resonator, at least one resonator is formed by the piezo-resonator having the dynamic damper whereby vibrational energy trap efficiency is improved. Thus, it is possible to miniaturize the piezo-resonator, whereby the ladder-type filter can also be miniaturized by employment of the piezo-resonator.

One feature of the fourth type energy trap piezo-resonator resides in the provision of the dynamic damper as described above, and the piezoelectric vibrating part itself is not restricted. When the dynamic damper is provided in any of the aforementioned first to third type energy trap piezo-resonators, it is possible to suppress slightly leaking vibration by the dynamic damper, if any, thereby further improving energy trap efficiency. Alternatively, it is possible to properly employ a piezoelectric vibrating part such as that utilizing length mode, an ordinary piezoelectric vibrating part utilizing a shear mode, or that of a square plate utilizing an expansion mode, for example, which is different from those provided in the first to third type energy trap piezo-resonators. Namely, the fourth type energy trap piezo-resonator having a dynamic damper can employ any of piezoelectric vibrating parts which are excited in various vibration modes in response to a target resonance frequency, whereby it is possible to readily obtain a ladder-type filter which can be employed in various frequency bands.

Due to provision of the dynamic damper, vibrational energy is effectively trapped in the vibrating part which is connected to the dynamic damper, whereby the piezo-resonator can be held through the holding part similarly to the first to third energy trap piezo-resonators, substantially with no deterioration of resonance characteristics. Thus, it is possible to readily form a miniature ladder-type filter having stable characteristics which is reduced in height.

According to a preferred mode of the present invention, the aforementioned support and holding parts are coupled to both sides of the piezoelectric vibrating part so that the piezoelectric vibrating part is supported by the support parts on both sides thereof, whereby a ladder-type filter having a more stable structure can be obtained. When the holding parts are thus arranged on both sides of the piezoelectric vibrating part, it is possible to hold the piezo-resonator through the holding parts which are arranged on both sides, whereby the support structure is also stabilized.

As hereinabove described, the ladder-type filter according to the preferred embodiments of the present invention has at least two plate type resonators which are laterally coupled with each other in parallel with a mounting surface. In more concrete terms, it is possible to form such a coupled structure by arranging the coupled structure between first and second case substrates so that the former is held by the latter, thereby readily forming a chip-like ladder-type filter. Alternatively, the coupled structure may be stacked on a base substrate so that a cap member is fixed to the base substrate to enclose the coupled structure, thereby forming a chip-like ladder-type filter.

While at least one of the series and parallel resonators has a plate type piezoelectric part, a support part and a holding part as described above, all resonators may have plate type piezoelectric vibrating parts, support parts and holding parts. In this case, all resonators can be coupled with each other through the holding parts as well as fixed to case substrates or the like, whereby a chip-like ladder-type filter can be readily formed.

In the aforementioned structure provided with holding parts on both sides of the piezo-resonator according to the preferred embodiments of the present invention, first and second spacer plates are preferably provided on both sides of at least two aforementioned piezo-resonators. The first and second spacer plates are coupled to the respective piezo-resonators to allow vibration of vibrating parts thereof, whereby a resonance plate is defined by the aforementioned at least two piezo-resonators and the first and second spacer plates. When such a resonance plate is defined, it is possible to readily form a chip-like ladder-type filter having a laminate structure.

When the aforementioned at least two piezo-resonators and the first and second spacer plates defining the resonator plate are integrally formed with each other by the same member, side spaces of the resonator are reliably enclosed so that it is possible to readily obtain a ladder-type filter which is excellent in environment-resistant characteristics such as moisture resistance.

When the holding parts are provided on both sides of at least one piezo-resonator, at least one additional piezo-resonator may be coupled to the same on at least one side of a direction coupling the holding parts with each other, to allow vibration of the piezoelectric vibrating part. In other words, two or more piezo-resonators may be coupled to be flush with each other at a certain vertical position in the ladder-type filter according to the preferred embodiments of the present invention.

When at least one additional piezo-resonator is coupled to a side portion of the piezo-resonator, further, first and second spacer plates may be arranged on both sides of such a coupled structure, to define a resonance plate. Also in this case, the piezo-resonators and the first and second spacer plates defining the resonance plate may be integrally formed with each other by the same member, whereby side portions of a plurality of piezo-resonators can be reliably sealed to form a ladder-type filter which is excellent in environment-resistant characteristics such as moisture resistance.

The piezoelectric vibrating part is preferably provided with first and second resonance electrodes for exciting the piezoelectric vibrating part, while a lead electrode is formed on the holding part. In this case, the first and second resonance electrodes are electrically connected to the lead electrode. Thus, it is possible to resonate the piezoelectric vibrating part by electrically connecting the lead electrode with the exterior.

More preferably, a plurality of external electrodes are formed on outer surfaces of the inventive ladder-type filter, so that the plurality of external electrodes are electrically connected with the aforementioned prescribed lead electrode. Thus, it is possible to form the ladder-type filter as a chip-type electronic component having a plurality of external electrodes stacked on the aforementioned resonance plate. Namely, the inventive ladder-type filter may comprise two or more resonance plates.

According to another aspect of the preferred embodiments of the present invention, a ladder-type filter includes at least one series resonator forming a series arm and at least one parallel resonator forming a parallel arm. This ladder-type filer comprises at least one plate type resonator and at least one additional plate type resonator which is stacked on the aforementioned resonator, and at least one of the series and parallel resonators is a rectangular plate type energy trap piezo-resonator utilizing a width expansion mode having a ratio b/a between longer and shorter sides which is set in a range of ±10% of a value satisfying the aforementioned equation (1) assuming that a and b represent lengths of the shorter and longer sides and σ represents the Poisson's ratio of the material forming a piezoelectric vibrating part. Thus, such a ladder-type filter includes a piezo-resonator which is formed by only the piezoelectric vibrating part of the aforementioned first type energy trap piezo-resonator. Preferably, every one of the series and parallel resonators is formed by a piezo-resonator which is formed by the piezo-electric vibrating part of the first type of energy trap piezo-resonator. In this case, it is possible to provide a ladder-type filter having a further reduced size and a relatively simple shape, since neither a support part nor a holding part is required.

In each of the first to third type energy trap piezo-resonators and the piezo-resonator which is formed by employing only the piezoelectric vibrating part of the first type energy trap piezo-resonator, the piezoelectric material forming the piezoelectric vibrating part may be prepared from a piezoelectric single crystal of $LiTaO_3$ or $LiNbO_3$, in addition to piezoelectric ceramics. Alternatively, a piezo-electric thin film may be applied to a surface of a metal plate or a semiconductor plate, to form the piezoelectric vibrating part by such a composite member. When the piezoelectric vibrating part is formed by the composite member, the aforementioned Poisson's ratio σ is selected in consideration of that of the composite material.

The foregoing and other objects, features, aspects and advantages of the preferred embodiments of the present invention will become more apparent from the following detailed description of the preferred embodiments of the present invention when taken in conjunction with the accompanying drawings.

BRIEF DESCRIPTION OF THE DRAWINGS

FIG. 1 is an exploded perspective view for illustrating a conventional ladder-type filter;

FIG. 11 illustrates relation between the Poisson's ratios and the ratios b/a;

FIG. 13 is a plan view showing another example of the first energy trap type piezo-resonator;

FIG. 14 is a plan view showing still another example of the first energy trap type piezo-resonator;

FIG. 15 is a side elevational view showing an example of a second energy trap type piezo-resonator;

FIG. 19 illustrates relation between Poisson's ratios σ of piezoelectric materials and ratios b/a;

DETAILED DESCRIPTION OF PREFERRED EMBODIMENTS

Non-restrictive preferred embodiments of the present invention are now described, to clarify the present invention.
<First Type Energy Trap Piezo-Resonator>

A first type piezo-resonator having a characteristic structure which is employed in the present invention is first described, followed by description of a ladder-type filter employing the first type piezo-resonator.

Figure 2:
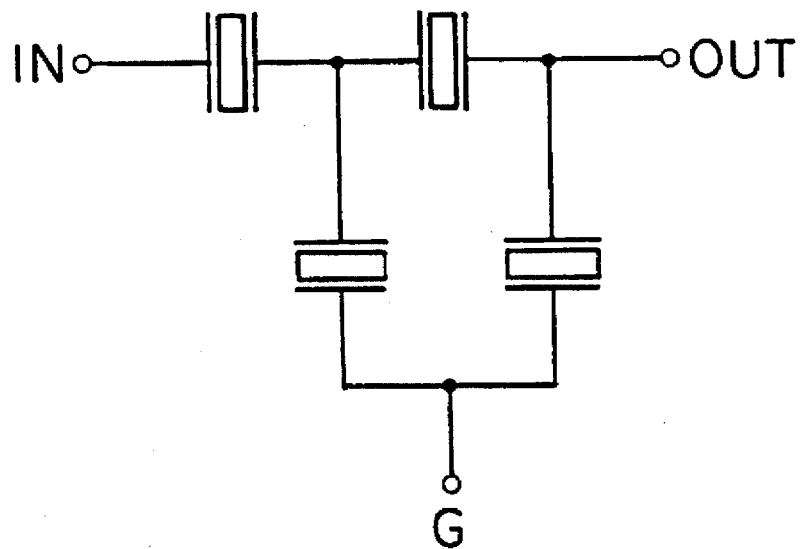
FIG. 2 shows the circuit structure of the conventional ladder-type filter.
Figure 3:
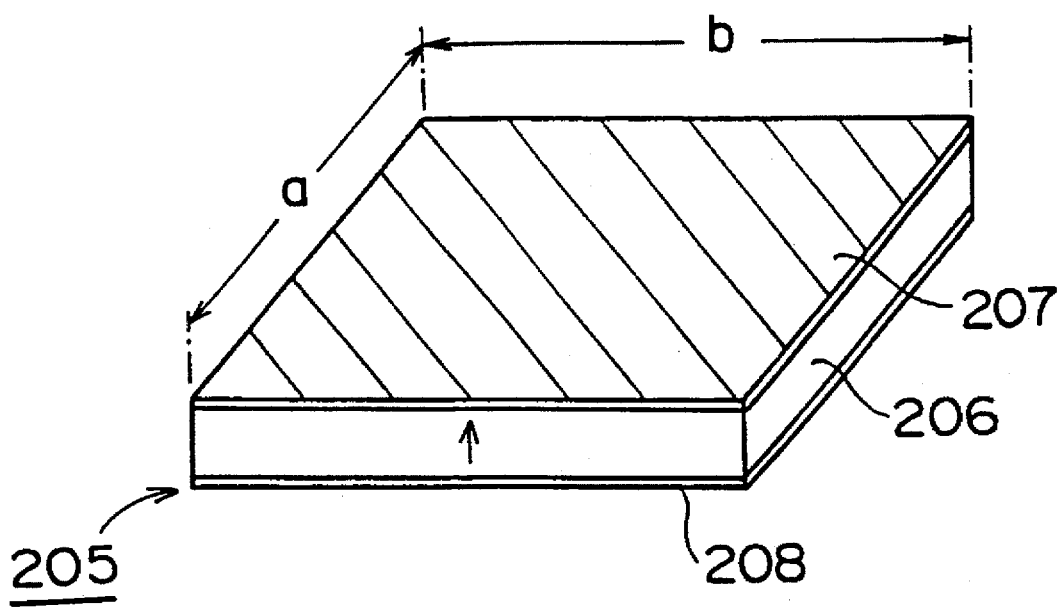
FIG. 3 is a perspective view for illustrating a piezoelectric vibrating part which is employed in a piezo-resonator of a width expansion mode.

FIG. 3 is a perspective view for illustrating a piezoelectric vibrating part in a first type energy trap piezo-resonator 205 which is employed in the preferred embodiments of the present invention. In this piezo-resonator 205, electrodes 207 and 208 are formed on both major surfaces of a rectangular piezoelectric ceramic plate 206 which is polarized so that axes of polarization are regularized along the thickness direction. Assuming that a and b represents lengths of shorter and longer sides of the piezoelectric ceramic plate 206, the ratio b/a is selected in the aforementioned preferred range, whereby a width expansion mode is strongly excited as hereinafter described. Description is now made on the fact that a width expansion mode is strongly excited when the ratio b/a is set in the aforementioned preferred range.

Figure 4:
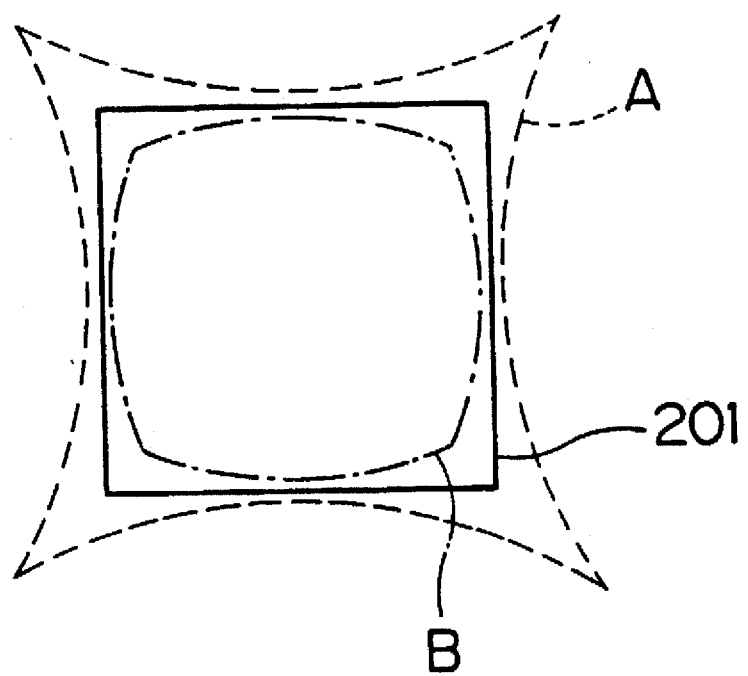
FIG. 4 is a schematic plan view for illustrating an expansion mode.
Figure 5:
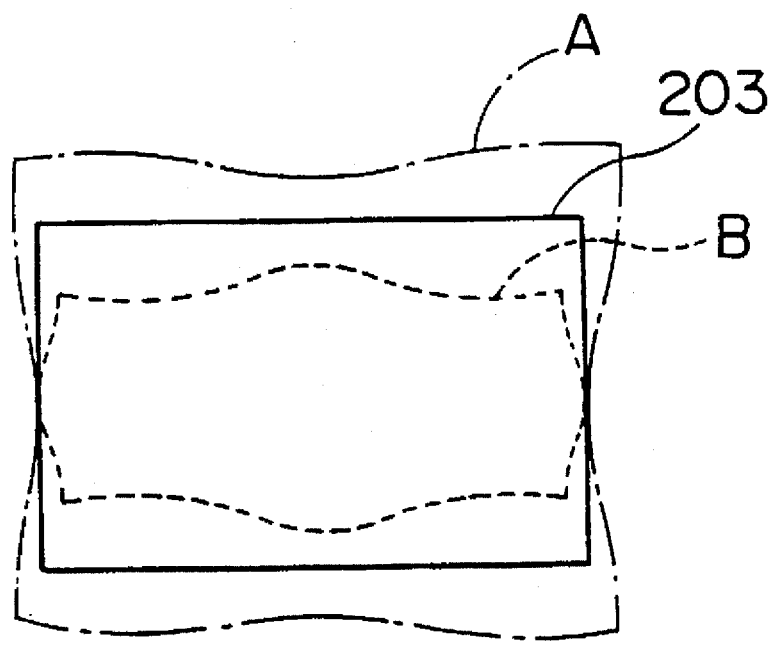
FIG. 5 is a schematic plan view for illustrating a width expansion mode.
Figure 6:
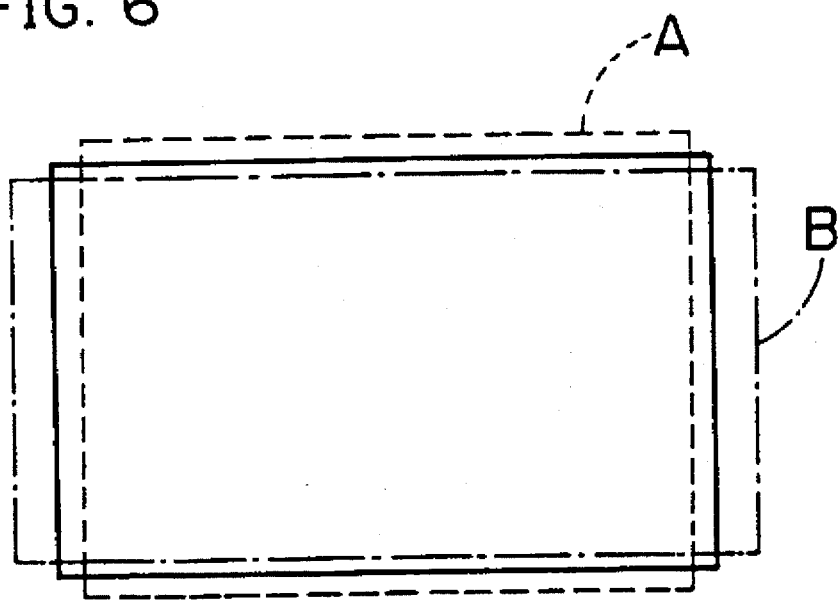
FIG. 6 is a schematic plan view for illustrating a width mode.

FIGS. 4 to 6 are schematic plan views showing vibrating states of vibrators, for illustrating an expansion mode, a width expansion mode and a width mode, respectively. The inventor has analyzed vibrating states of rectangular plate type vibrators by a finite element method, while varying lengths of shorter and longer sides thereof. When the ratio b/a of the length b of each longer side to the length a of each shorter side is 1, i.e., when the vibrator is in the form of a square, vibration of an expansion vibration mode is strongly excited as shown in FIG. 4. Namely, vibration is repeated between a state shown by broken lines A and that shown by one-dot chain lines B in a vibrator 201 having a square planar shape shown in FIG. 4, whereby an expansion mode is strongly excited.

when the ratio b/a is considerably greater than 1, i.e., when b/a $\gg$ 1, a rectangular vibrator vibrates between a state shown by broken lines A and that shown by solid lines B as shown in FIG. 6, whereby width mode vibration is strongly excited.

When the ratio b/a is greater than 1 and less than that exciting the aforementioned width mode vibration, vibration between states shown by one-dot chain lines A and broken lines B, i.e., width expansion mode vibration, is strongly excited in a vibrator 203 shown in FIG. 5.

The aforementioned width expansion mode has been named as such since the same is regarded as an intermediate vibration mode between well-known expansion and width modes.

On the basis of the aforementioned recognition, the inventor has prepared samples of the piezo-resonator 205 shown in FIG. 3 from piezoelectric ceramic plates having ratios b/a which were selected at specific values.

Figure 7A:
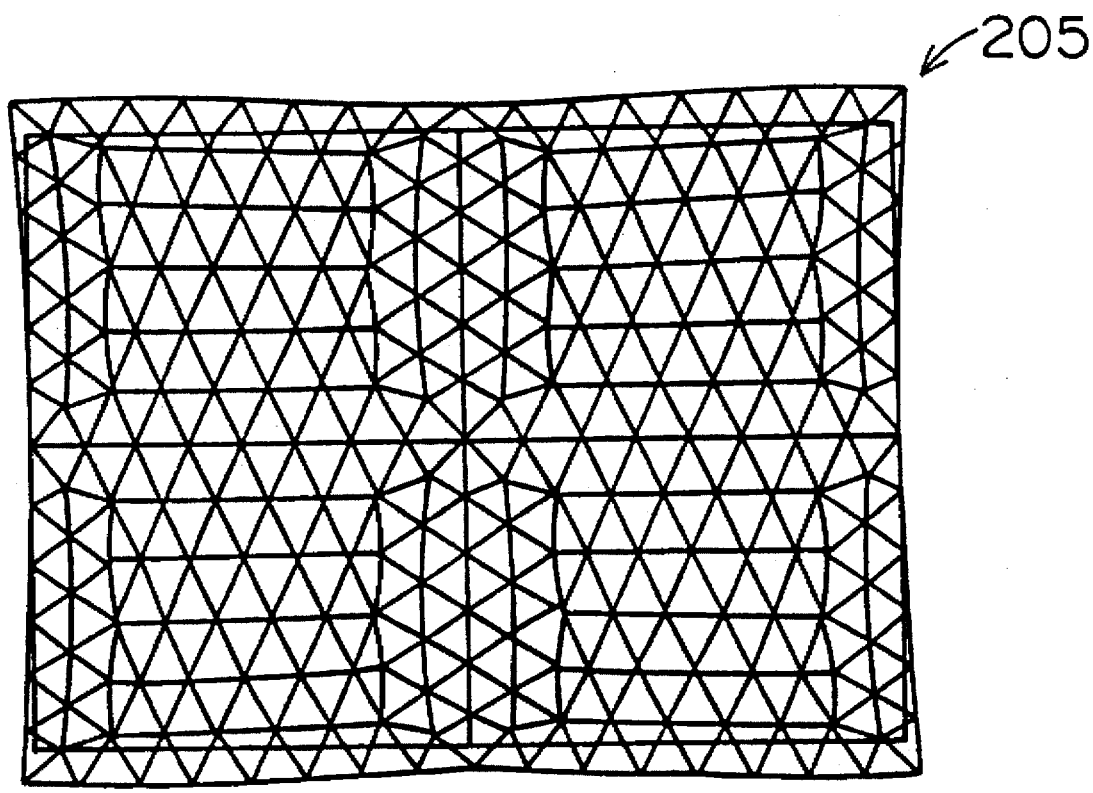
FIGS. 7A and 7B are a diagram showing displacement deviation of width expansion mode vibration analyzed by a finite element method, and a diagram for illustrating coordinates in FIG. 7A, respectively.

When the ratios b/a were varied in the samples of the piezo-resonator 205 to excite the aforementioned width expansion mode, it was confirmed that the width expansion mode is most strongly excited when the ratio b/a satisfies $-1.47\sigma + 1.88$. Displacement distribution in this sample of the piezo-resonator 205 was analyzed by finite element method, whereby a result shown in FIG. 7A was obtained.

Figure 7B:
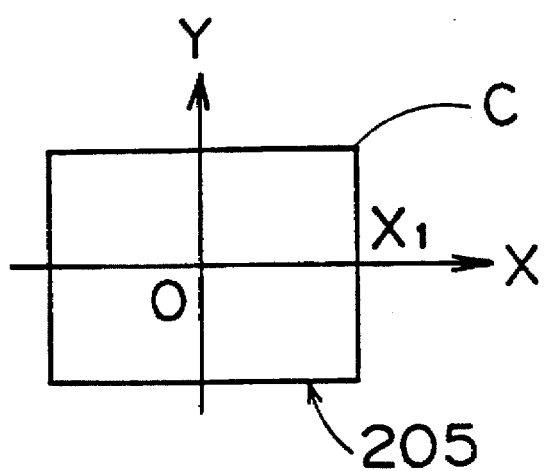
Figure 8:
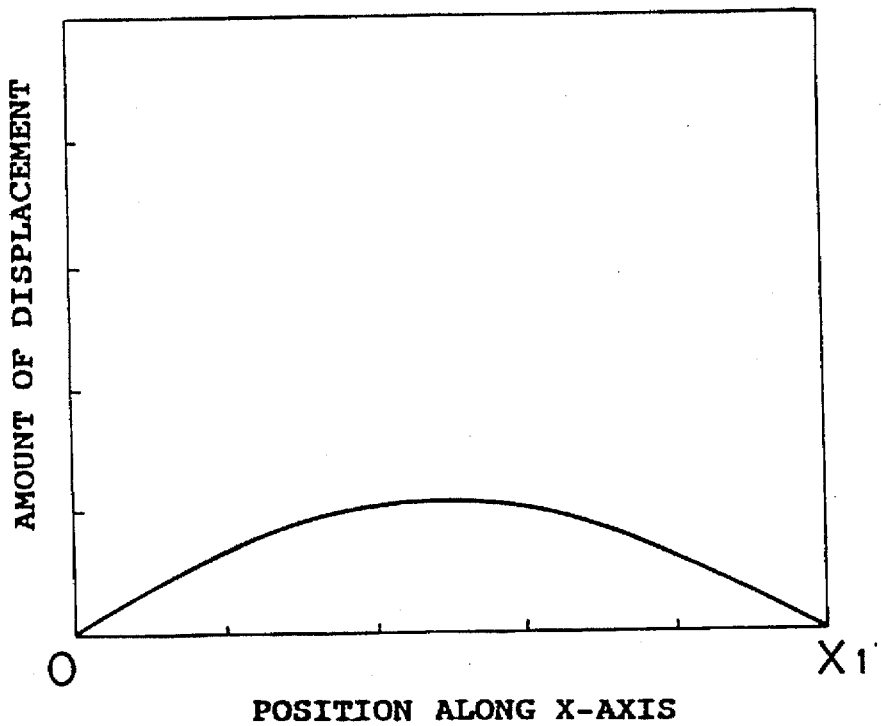
FIG. 8 illustrates relation between positions along a direction x and amounts of displacement in the displacement distribution shown in FIG. 7A.

In the displacement distribution analyzed by the finite element method, displaced states of respective parts were measured while defining x- and y-axes as shown in FIG. 7B with an origin which was set at the center of a major surface of the piezo-resonator 205, whereby a result shown in FIG. 8 was obtained. It is understood that the amounts of displacement are minimized at the center O and a point X, in FIG. 7B, i.e., at the center of the shorter side, and maximized at an intermediate portion therebetween in positions of the piezo-resonator 205 excited in the aforementioned width expansion mode along the x-axis. This means that nodal points are located at the centers of the major surface and both of the shorter sides of the piezo-resonator 205 utilizing a width expansion mode. Because of this structure and the resulting width expansion vibration mode, it is possible to support the piezo-resonator 205 without hindering the width expansion mode, by supporting the center of the major surface or either or both of the shorter sides via another support member.

Figure 9:
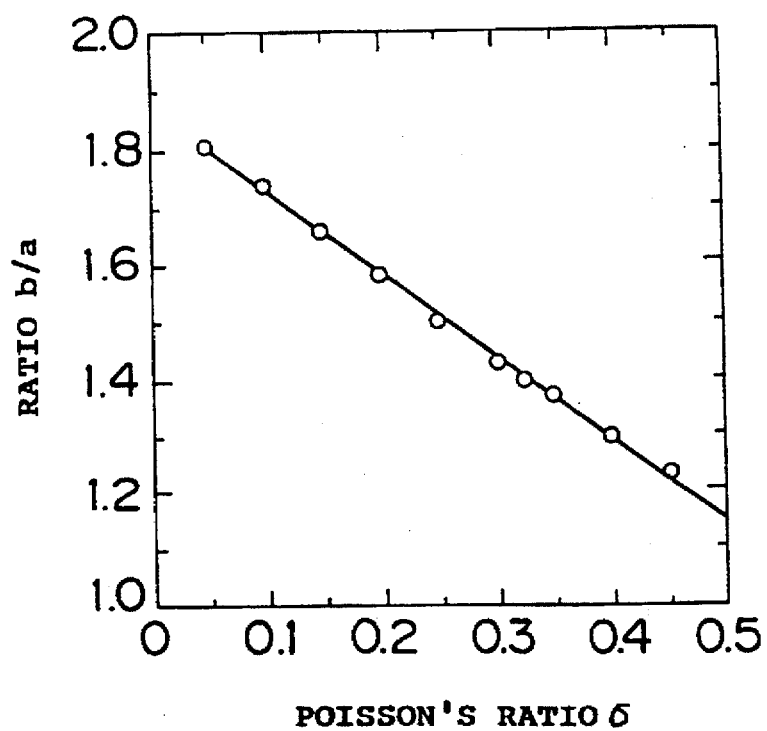
FIG. 9 illustrates relation between Poisson's ratios and dimensional ratios b/a for exciting a width expansion mode.

It has also been discovered that the aforementioned ratio b/a is related to the Poisson's ratio of the piezo-resonator 205. When the Poisson's ratios of vibrators were varied to measure ratios b/a for exciting the aforementioned width expansion mode and to plot such ratios b/a, a result shown in FIG. 9 was obtained. As understood from the straight line shown in FIG. 9, therefore, it has been confirmed that it is possible to reliably excite a width expansion vibration mode by selecting the ratio b/a to satisfy the following equation:

$$b/a = -1.47\sigma + 1.88 \qquad (4)$$

Figure 10:
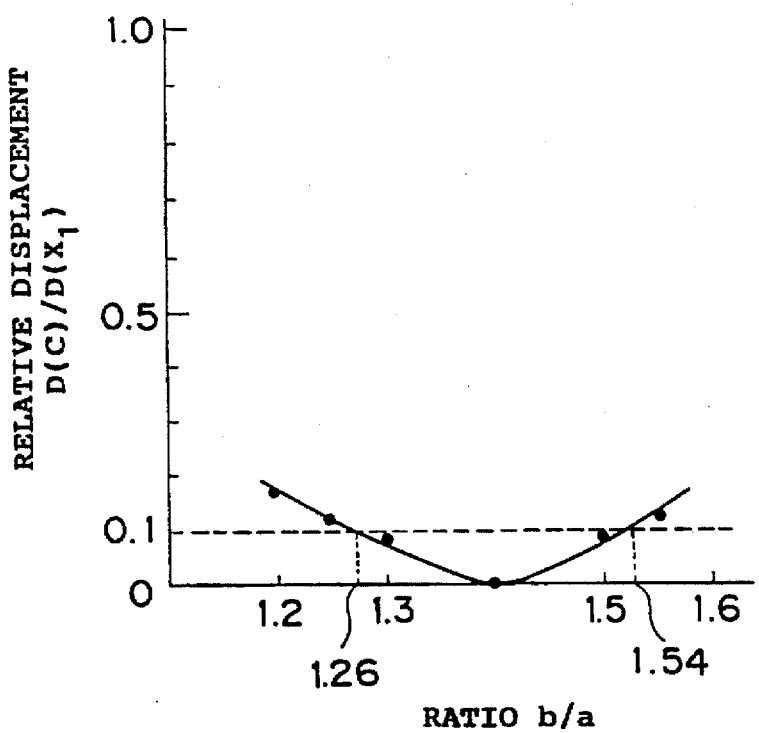
FIG. 10 illustrates relation between the ratios b/a and the amounts of relative displacement in the displacement distribution shown in FIG. 7A.

Further, it has also been recognized that the width expansion vibration mode is strongly excited not only when the ratio b/a satisfies the equation (4) but when the ratio b/a slightly deviates from the equation (4). In one preferred embodiment which was tested, piezoelectric ceramic plates having Poisson's ratios $\sigma$ of 0.324 were employed and the ratios b/a were varied to confirm presence/absence of excitation of a width expansion vibration mode. Assuming that $D(X_1)$ represents an amount of displacement at the point X1 in FIG. 7B and D(C) represents an amount of displacement at a point C (see FIG. 7A) maximizing the amount of displacement in a width expansion mode, relative displacement $D(X_1)/(C)$ of the point $X_1$ to the point C was measured. FIG. 10 shows the result.

It is clearly understood from FIG. 10 that the relative displacement is within ±10% when the Poisson's ratio $\sigma$ is 0.324, as long as the ratio b/a is in a range of 1.26 to 1.54. Then, a plurality of samples of the piezo-resonator 205 shown in FIG. 3 were prepared so that the ratios b/a were in a range of ±10%, a described above, and support members were coupled to centers of shorter sides to measure resonance characteristics. As the result, it was confirmed that a width expansion mode is excellently traps vibration when the relative displacement is within ±10%, as described above.

Figure 11:
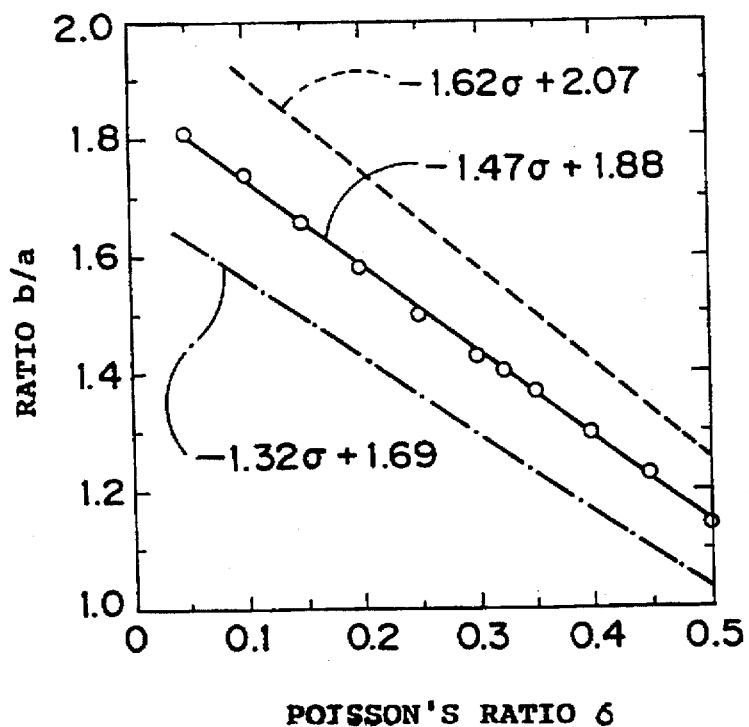

As shown in FIG. 11, therefore, it is understood that the aforementioned width expansion vibration mode is excellently excited when the ratio b/a is set in a range of ±10% from a point satisfying the equation (4). It has also been recognized that the width expansion vibration mode is excellently excited also when the ratio b/a is n times the value (−1.47σ+1.88), where n represents an integer.

Figure 12A:
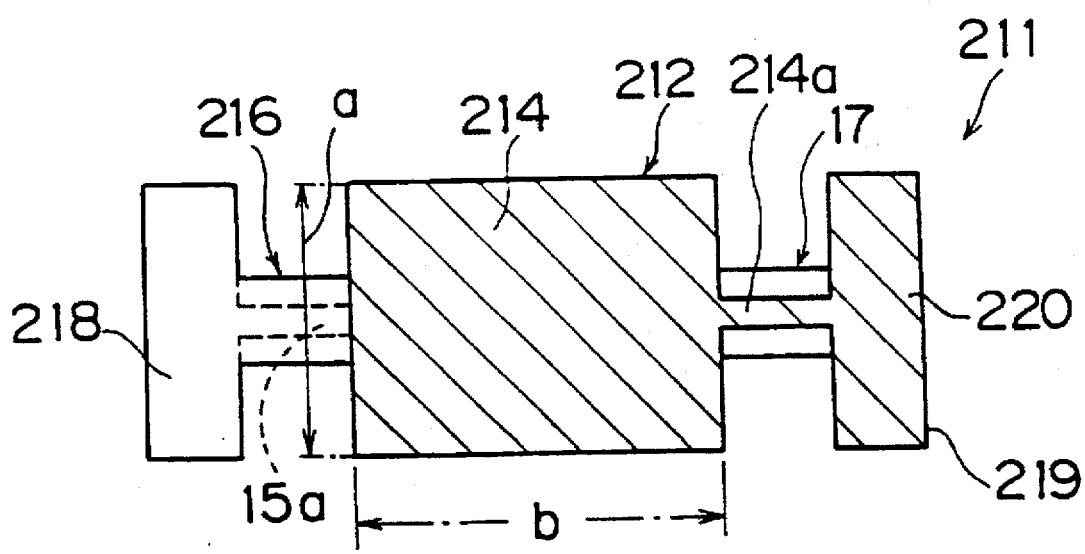
FIGS. 12A and 12B are a plan view and a side elevational view showing an example of a first type energy trap piezo-resonator respectively.
Figure 12B:
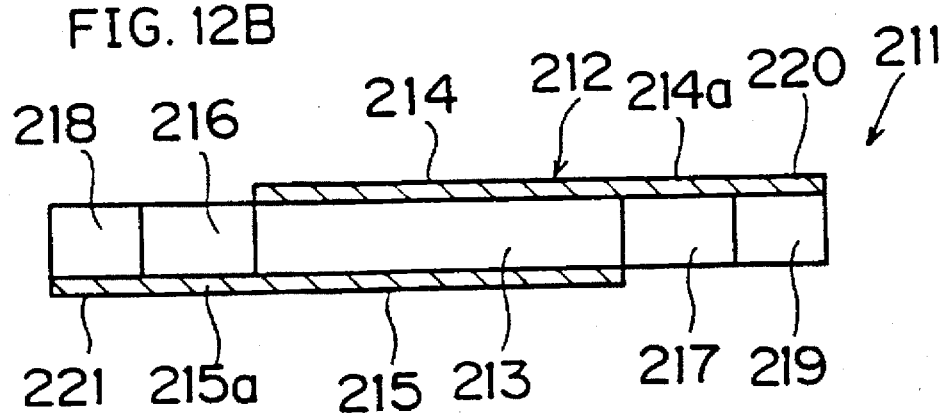

FIGS. 12A and 12B are a plan view and a front elevational view showing an example of a piezo-resonator utilizing a width expansion mode, i.e., a first type piezo-resonator manufactured on the basis of the aforementioned discovery. This piezo-resonator 211 has a piezoelectric vibrating part 212 serving as a rectangular plate type vibrator. The piezoelectric vibrating part 212 has a rectangular planar shape, and has a structure such that resonance electrodes 214 and 215 are formed to extend entirely over both major surfaces of a piezoelectric ceramic plate 213 which is uniformly polarized along its thickness. Support members 216 and 217 are coupled to centers of shorter sides, which serve as nodal points upon excitation in a width expansion vibration mode, of the piezoelectric vibrating part 212. Holding parts 218 and 219 are coupled to outer end portions of the support members 216 and 217, respectively.

The support members 216 and 217 and the holding parts 218 and 219 are integrally formed with the piezoelectric ceramic plate 213. Namely, a rectangular piezoelectric ceramic plate is prepared and machined into the shape shown in FIG. 12A. Alternatively, the support members 216 and 217 and the holding parts 218 and 219 may be formed by members which are independent of the piezoelectric vibrating part 212, to be coupled as illustrated by a method such as bonding.

The resonance electrodes 214 and 215 are electrically connected to lead electrodes 220 and 221, which are formed on the major surfaces of the holding parts 218 and 219, by lead conductive parts 214a and 215a which are formed on surfaces of the support members 216 and 217, respectively.

When an alternating voltage is applied across the lead electrodes 220 and 221, the piezoelectric vibrating part 212 is excited in a width expansion mode in the piezo-resonator 211. In this case, the central portions of the shorter sides of the piezoelectric vibrating part 212 hardly vibrate and form nodal points of vibration, whereby the width expansion mode vibration is hardly inhibited despite the support members 216 and 217 which are coupled to the piezoelectric vibrating part 212. Thus, it is possible to effectively trap the vibration based on the width expansion mode between the support members 216 and 217.

It has been discovered that it is possible to form an energy trap type piezo-resonator which is suitably employed over a frequency range of about 800 kHz to 2 MHz since the piezoelectric vibrating part 212 exhibits resonance frequencies of about 800 kHz and 2 MHz when the same are 2.5 mm n width and 3.5 mm in length and 1.0 mm in width and 1.4 mm in length, respectively.

As to the resonance frequency, the effective frequency band is varied with the material for the piezoelectric resonance part, as a matter of course. Therefore, it is possible to obtain energy trap type piezo-resonators which are suitably employed in various frequency bands by preparing piezoelectric vibrating parts from various piezoelectric materials.

FIG. 13 shows another example of an energy trap piezo-resonator utilizing a width expansion mode. This piezo-resonator 231 has a piezoelectric vibrating part 232 serving as a rectangular plate type vibrator. In this piezoelectric vibrating part 232, a pair of resonance electrodes 232b and 232c are formed on an upper surface of a piezoelectric plate 232a, along edges of its longer sides. The piezoelectric plate 232a is polarized along arrow P, i.e., in a direction extending from the resonance electrode 232b toward the resonance electrode 232c. Also in this example, the ratio b/a of the length b of each longer side of the piezoelectric vibrating part 232 to the length a of each shorter side is set in a range of ±10% of the equation (1).

When an alternating voltage is applied across the resonance electrodes 232b and 232c, therefore, the piezoelectric vibrating part 232 vibrates in a width expansion mode. In this case, the piezoelectric vibrating part 232 is displaced in a direction parallel to the electric field as applied, whereby the piezo-resonator 231 utilizes a piezoelectric longitudinal effect.

Also in the piezo-resonator 231 of this example, support members 236 and 237 are coupled to nodal points of vibration of the piezoelectric vibrating part 232 which is resonated in the width expansion mode, while holding parts 238 and 239 are coupled to outer end portions of the support members 236 and 237, respectively. Referring to FIG. 13, numerals 234a and 235a denote lead conductive parts, and numerals 240 and 241 denote lead electrodes, respectively.

As clearly understood from the example shown in FIG. 13, the resonator utilizing a width expansion mode according to the preferred embodiments of the present invention is applicable not only to a resonator utilizing a piezoelectric transverse effect, but also to a resonator utilizing a piezoelectric longitudinal effect.

FIG. 14 is a plan view showing still another example of an energy trap piezo-resonator utilizing a width expansion mode which is employed in the preferred embodiments of the present invention. The piezo-resonator 251 shown in FIG. 14 is characterized in that the same is provided with dynamic dampers 252 and 253 and coupling portions 254 and 255, while other points of this example are similar to those of the energy trap type piezo-resonator 211 shown in FIG. 12. Therefore, identical portions are denoted by the same reference numerals, to omit redundant description.

The dynamic dampers 252 and 253, which are coupled to outer sides of support members 216 and 217, are formed as vertically extending bar-type portions. The coupling parts 254 and 255 are formed between the dynamic dampers 252 and 253 and holding parts 218 and 219, respectively.

Since the support members 216 and 217 are coupled to nodal points of vibration of a piezoelectric resonance part 212, leakage of vibration toward the support members 216 and 217 is extremely small. In this example, however, the dynamic dampers 252 and 253 are resonated by the slightly leaking vibration, thereby suppressing this vibration. Thus, it is possible to effectively trap vibrational energy in a portion of the resonance part 212 located between the dynamic dampers 252 and 253. Therefore, it is possible to form a piezo-resonator having a substantially reduced size.

The piezo-resonator 251 shown in FIG. 14 is also an example of a fourth type energy trap piezo-resonator which is employed in the inventive ladder-type filter, since one of its features resides in the provision of the dynamic dampers 252 and 253.

<Second Type Piezo-Resonator>

Figure 16:
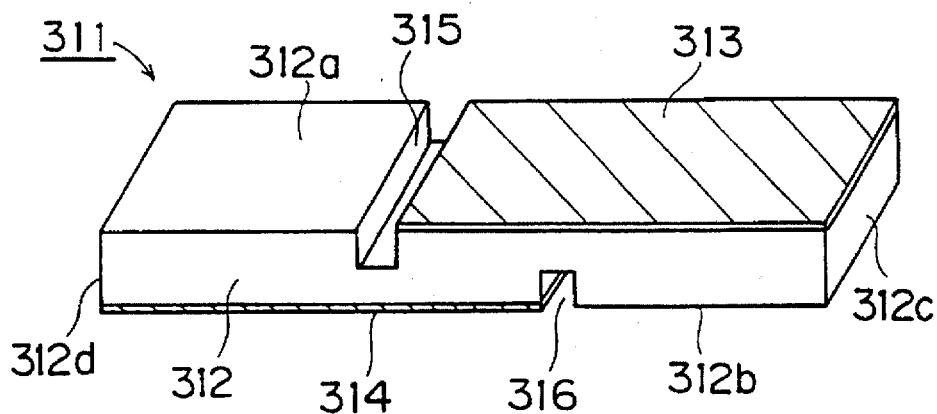
FIG. 16 is a perspective view showing the piezo-resonator appearing in FIG. 15.

FIGS. 15 and 16 are a side elevational view and a perspective view, respectively, for illustrating an energy trap type piezo-resonator 311 (second type piezo-resonator) utilizing a shear mode, which is employed in the preferred embodiments of the present invention.

The piezo-resonator 311 is formed by a rectangular piezoelectric ceramic plate 312. This piezoelectric ceramic plate 312 is polarized so that axes of polarization are regularized in a direction parallel to its major surface, i.e., along arrow P.

A first resonance electrode 313 is formed on an upper surface 312a of the piezoelectric ceramic plate 312 to extend from an end surface 312c toward another end surface 312d, but not to reach this end surface 312d. Similarly, a second resonance electrode 314 is formed on a lower surface 312b of the piezoelectric ceramic plate 312 extend from the end surface 312d toward the end surface 312c, but not to reach this end surface 312c.

Further, first and second cross-directionally extending grooves 315 and 316 are formed in the upper and lower surfaces 312e and 312b of the piezoelectric ceramic plate 312, respectively. The first and second resonance electrodes 313 and 314 overlap with each other through the piezoelectric ceramic plate 312 in a portion of the piezoelectric ceramic plate 312 which is held between the first and the second grooves 315 and 316, thereby forming a piezoelectric vibrating part. In other words, the first and the second grooves 315 and 316 are formed on forward ends of the first and the second resonance electrodes 313 and 314, respectively, thereby defining a resonance part therebetween. When an alternating voltage is applied across the first and second resonance electrodes 313 and 314 to make the piezoelectric vibrating part vibrate, shear mode vibration is strongly excited so that this shear mode vibration is effectively trapped in the piezoelectric vibrating part due to formation of the first and second grooves 315 and 316.

In the piezo-resonator 311, the portion located between the grooves 315 and 316 defines the piezoelectric vibrating part, while piezoelectric plate portions located under and above the grooves 315 and 316 form support parts in the present invention, respectively. Further, piezoelectric plate portions extending outwardly beyond the grooves 315 and 316 define holding parts in the present invention. In addition, the resonance electrodes 313 and 314 serve as electrodes for resonating the piezoelectric vibrating part in portions located therein, while the same serve as the aforementioned lead electrodes in portions reaching the holding parts.

In the piezo-resonator 311, a piezoelectric surface which is parallel to the polarization direction of the piezoelectric vibrating part is in the form of a rectangular surface having longer and shorter sides of lengths b and a, respectively. The ratio b/a is set in a range of ±10% of a value satisfying the equation (2), assuming that a $\sigma$ represents the Poisson's ratio of the piezoelectric material forming the piezoelectric ceramic plate 312. In other words, the grooves 315 and 316 are formed so that the ratio b/a is in the aforementioned preferred range, thereby determining the dimensions of the piezoelectric vibrating part.

It has been experimentally confirmed by the inventor that vibrational energy of a shear mode is further effectively trapped in the piezoelectric vibrating part when the ratio b/a is set in the aforementioned preferred range in the piezo-resonator 311. This is now described with reference to FIGS. 17A to 21.

Figure 17A:
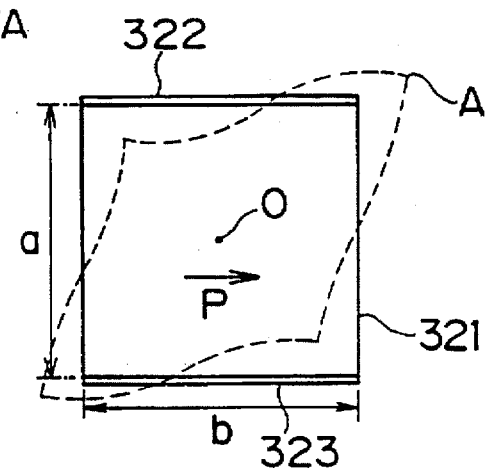
FIG. 17A and 17B are a model diagram for illustrating a vibrating state of a vibrator vibrating in a shear vibration mode and a diagram showing coordinates in FIG. 17A respectively.

As shown in FIG. 17A in a side elevational view, it is assumed that resonance electrodes 322 and 323 are formed on a piezoelectric member 321 which is polarized along arrow P, i.e., in a direction parallel to its upper and lower surfaces, with a ratio b/a of 1. When an alternating voltage is applied across the resonance electrodes 322 and 323, the piezoelectric member 321 vibrates in a contour shear mode. Consequently, the piezoelectric member 321 vibrates in a vibrating state shown by broken lines A in FIG. 17A and another vibrating state which is horizontally symmetrical to that shown by the broken lines A.

Figure 17B:
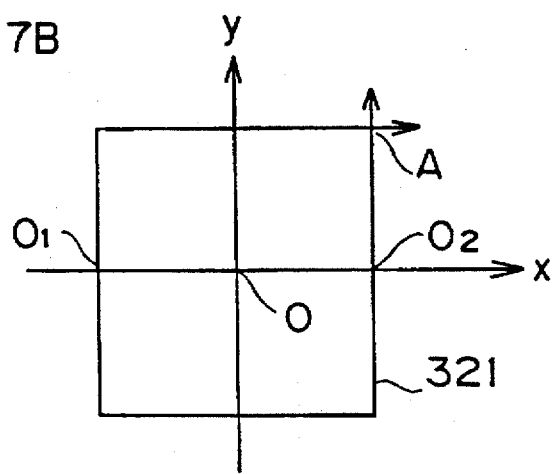

FIG. 17B shows positions of the respective portions of the vibrator 321 in an x-y coordinate system. In this case, a corner portion C is displaced at the maximum in vibration, in both of directions x and y. A central point O of the piezoelectric member 321 serves as a nodal point of vibration. On the other hand, displacement is also recognized in points $O_1$ and $O_2$ which are at intermediate vertical positions of side surfaces of the piezoelectric member 321.

Since displacement is thus recognized also in the points $O_1$ and $O_1$, it is understood that vibrational energy trap efficiency is insufficient when piezoelectric plates are further connected to outer side surfaces of the piezoelectric member 321 to form a resonator of a contour shear mode.

Figure 18:
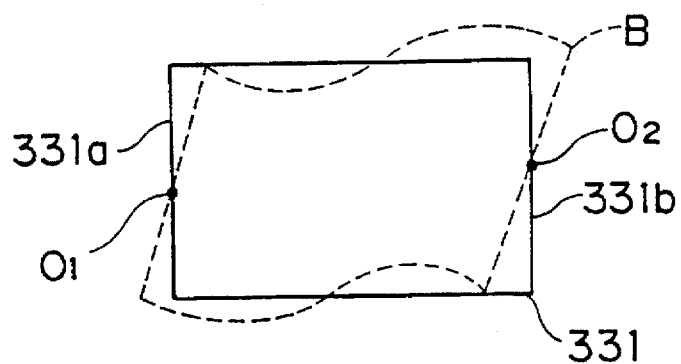
FIG. 18 is a schematic side elevational view showing a piezoelectric member.

On the other hand, it has been recognized that displacement distribution is as shown in FIG. 18 when the ratio b/a is as follows:

$$b/a = 0.3\sigma + 1.48$$

Figure 19:
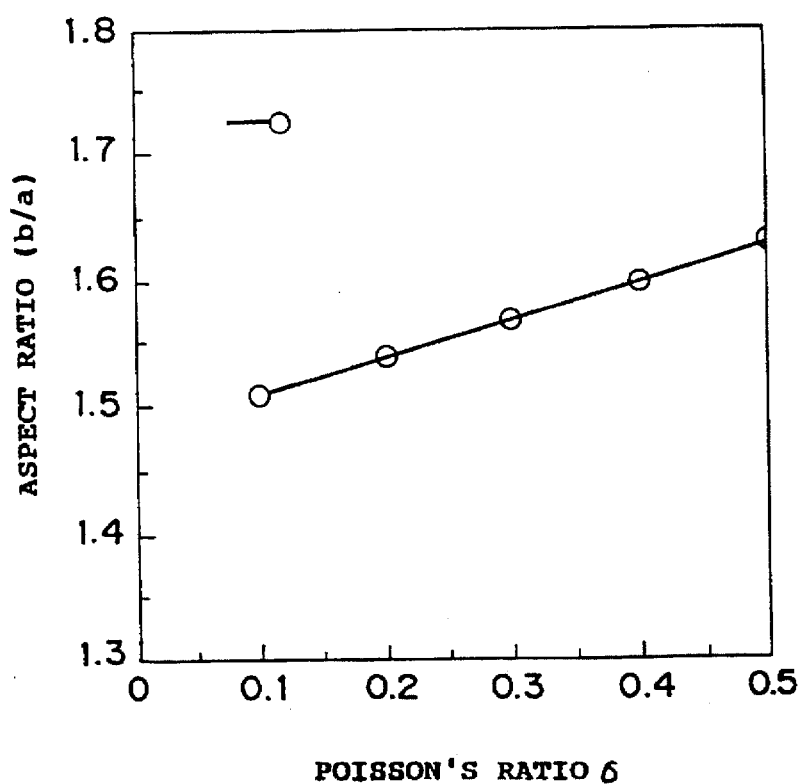

Namely, a piezoelectric member 331 shown in FIG. 18 in a schematic side sectional view vibrates between a vibrating state shown by broken lines B and that which is horizontally symmetrical to this vibrating state. In this case, a displacement vector on each short side has only a component in a direction x, as shown in FIG. 19. On side surfaces 331a and 331b of the piezoelectric member 331, further, directions of displacement are reversed in upper and lower halves.

The aforementioned ratio b/a was varied and various piezoelectric materials were employed, to examine states of displacement of structures obtained by connecting supports with piezoelectric members. As the result, it has been confirmed that relation shown in FIG. 19 holds between the Poisson's ratios of the piezoelectric materials as employed and the ratios b/a. From the result shown in FIG. 19, it has been discovered that it is possible to reduce transmission of displacement toward the supports, i.e., to effectively trap vibrational energy in the piezoelectric vibrating part, by setting the ratio b/a as follows:

$$b/a = 0.3\sigma + 1.48$$

Further, it has also been also discovered that vibrational energy can be effectively trapped also when the ratio b/a is n times the value $(0.3\sigma+1.48)$, where n represents an integer.

Thus, it has been confirmed that it is possible to trap vibration in the piezoelectric vibrating part by selecting dimensions thereof to satisfy the equation (2). On the basis of this result, a piezoelectric material having a Poisson's ratio $\sigma$ of 0.31 was employed as a material for the piezoelectric vibrating part 341 having a ratio of b/a of 1.57. Further, when support parts 344 and 345 having thicknesses which were equal to that of a piezoelectric vibrating part 341 were integrally formed with the piezoelectric vibrating part 341 through support parts 342A and 343A for forming a resonator 346 which in turn was subjected to examination of displacement distribution by finite element method, a result shown in FIG. 20 was obtained.

Figure 20:
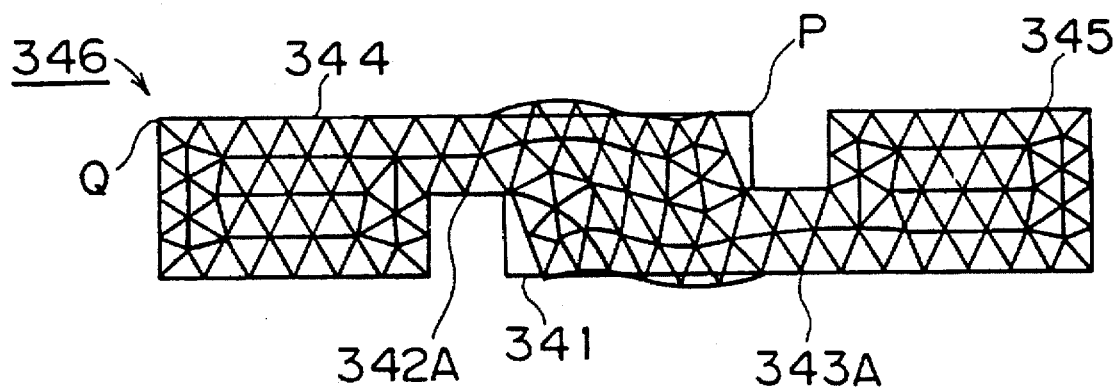
FIG. 20 illustrates displacement distribution of vibration in a second type piezo-resonator analyzed by a finite element method.

It is clearly understood from FIG. 20 that shear mode vibration energy in the piezoelectric vibrating part 341 hardly leaked toward the support parts 342A and 343A in this resonator 346. Thus, it is understood that it is possible to form a resonator utilizing a shear mode having a high energy trap efficiency by selecting the ratio b/a to satisfy the equation (2).

Figure 21:
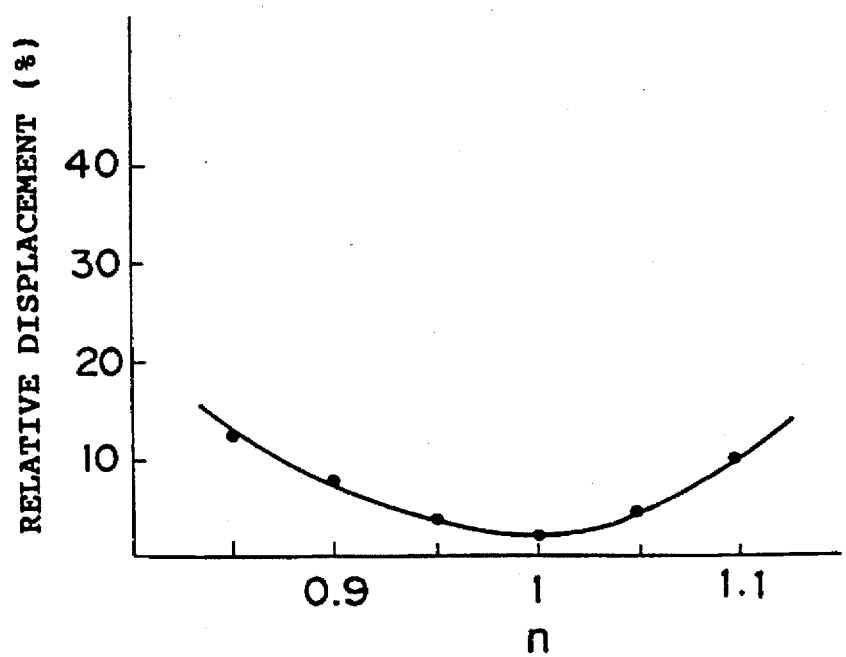
FIG. 21 illustrates relation between amounts of relative displacement and values of integers n.

Then, the factor n in the above equation $n(0.3\sigma+1.48)$ was changed to a non-integer number and varied in a range of 0.85 to 1.1 at a certain Poisson's ratio $\sigma$, to measure a ratio of an amount of displacement at a point Q exhibiting the minimum value to that of a point P exhibiting the maximum value shown in FIG. 20, i.e., relative displacement (%). FIG. 21 shows the result.

It is clearly understood from FIG. 21 that the relative displacement is not more than 10% when the value of the non-integer number n is in a range of 0.9 to 1.1. On the other hand, it has been recognized that substantially no problem is caused in formation of a resonator when the relative displacement is not more than 10%. Therefore, it is possible to effectively trap vibrational energy in the resonance part when the ratio b/a is in a range of ±10% from a value satisfying the equation (2).

In the second type piezo-resonator 311 shown in FIGS. 15 and 16, the first and second grooves 315 and 316 are formed so that the thickness a of the piezoelectric ceramic plate in the piezoelectric vibrating part and the longitudinal dimension b along the polarization direction P of the resonance part, i.e., lengths a and b of the shorter and longer sides of the rectangular piezoelectric surface which is parallel to the polarization direction of the piezoelectric vibrating part are set at the ratio b/a within the range of ±10% from the value expressed in the equation (2), thereby improving energy trap efficiency.

Figure 22:
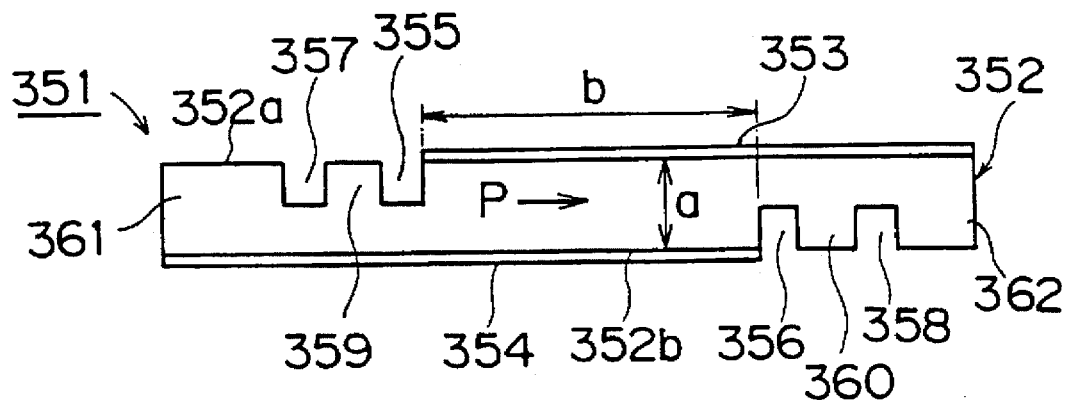
FIG. 22 is a side elevational view showing another example of the second type piezo-resonator.

FIG. 22 is a side elevational view showing another example of the second type piezo-resonator.

In this piezo-resonator 351, a third groove 357 is formed in a portion extending outwardly beyond a first groove 355 on an upper surface 352 of a piezoelectric ceramic plate 352 which is polarized along arrow P while a fourth groove 358 is formed in a portion outward beyond a second groove 356 also on a lower surface 352b of the piezoelectric ceramic plate 352, thereby forming first and second dynamic dampers 359 and 360, respectively. These dynamic dampers 359 and 360 are resonated by leaking vibration due to a well-known phenomenon of a dynamic damper, to cancel the leaking vibration. Therefore, the dynamic dampers 359 and 360 have dimensions selected for canceling the vibration via the phenomenon of a dynamic damper.

The piezo-resonator 351 is identical to the piezo-resonator 311 except that the third and fourth grooves 357 and 358 are formed to define the dynamic dampers 359 and 360, and hence other portions are denoted by corresponding reference numerals, to omit redundant description.

In the piezo-resonator 351, the ratio b/a in the resonance part is set in a range of ±10% from a value expressed in the equation (2), whereby vibrational energy is effectively trapped in the resonance part. Further, slightly leaking vibration is cancelled by the dynamic dampers 359 and 360 due to the a phenomenon of a dynamic damper. When the piezo-resonator 351 is mechanically held at holding parts 361 and 362 which are located outside the third and fourth grooves 357 and 358, respectively, therefore, substantially no deterioration is caused in resonance characteristics. Thus, it is possible to further improve energy trap efficiency as compared with the piezo-resonator 311, thereby providing a further miniaturized piezo-resonator.

The piezo-resonator 351, having the dynamic dampers 359 and 360, is also the fourth type of piezo-resonator employed in the preferred embodiments of the present invention.

Figure 23:
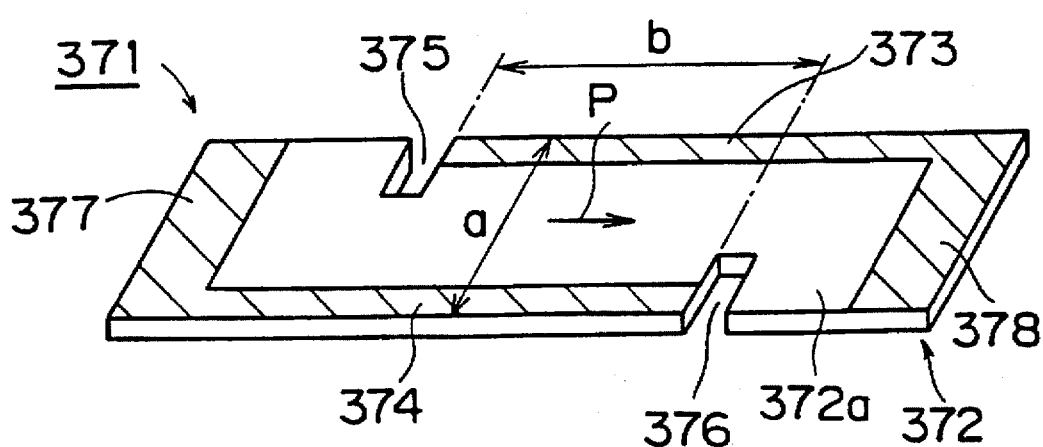
FIG. 23 is a perspective view showing still another example of the second type piezo-resonator.

FIG. 23 is a perspective view showing still another example of the second type energy trap piezo-resonator. This piezo-resonator 371 is formed by an elongated rectangular piezoelectric ceramic plate 372 which is polarized along its longitudinal direction P. In the piezoelectric ceramic plate 372, first and second resonance electrodes 373 and 374 are formed on its upper surface along both edges. Further, grooves 375 and 376 are formed in the both edges, respectively. A piezoelectric plate portion which is held between these grooves 375 and 376 defines a piezoelectric vibrating part. In this piezoelectric vibrating part, an upper surface, i.e., a piezoelectric surface which is parallel to the polarization direction P, has a rectangular shape. The shape of the upper surface of the piezoelectric vibrating part is selected so that lengths a and b of shorter and longer sides are set at a ratio b/a within a range of ±10% from a value satisfying the above equation (2). When an alternating voltage is applied across the first and second resonance electrodes 373 and 374, therefore, the piezoelectric vibrating part is resonated in a shear mode similarly to the piezo-resonator 311 shown in FIG. 15, and the resonance energy is effectively trapped in the piezoelectric vibrating part. Piezoelectric plate portions located on sides of the grooves 375 and 376 define support parts of the preferred embodiments of the present invention, while those located outward beyond the grooves 375 and 376 define holding parts according to the preferred embodiments of the present invention, respectively. Further, lead electrodes 377 and 378 are formed on upper surfaces of the holding parts to be electrically connected to the first and second resonance electrodes 373 and 374, respectively.

Figure 24:
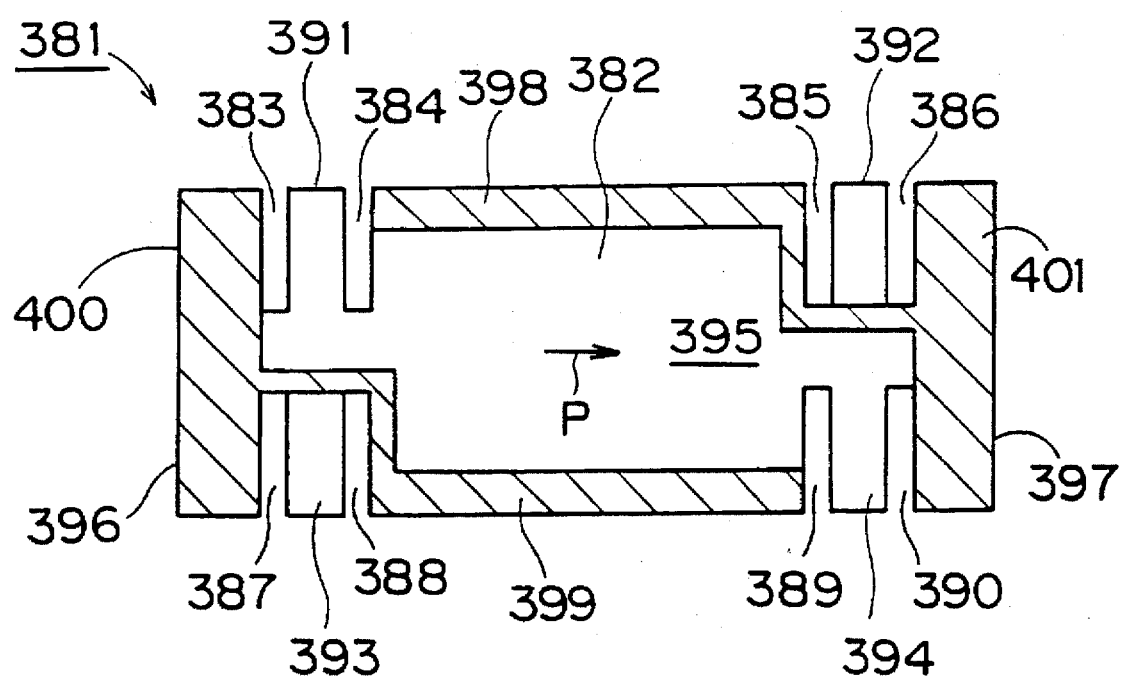
FIG. 24 is a plan view showing a further example of the second type piezo-resonator.

FIG. 24 is a plan view showing a further example of the second type energy trap piezo-resonator. In this piezo-resonator 381, grooves 383 to 386 are formed on one side surface while grooves 387 to 390 are formed on another side surface, thereby defining dynamic dampers 391 to 394, respectively. Further, a piezoelectric substrate portion located between the grooves 384 and 385 defines a piezoelectric vibrating part 395 according to the preferred embodiments of the present invention. In addition, holding parts 396 are formed outside of the grooves 383 and 386, respectively. Support parts according to the preferred embodiments of the present invention are defined by piezoelectric substrate portions which are held between the grooves 384 and 388 as well as between the grooves 385 and 389. Further, a piezoelectric substrate portion located between the grooves 383 and 387 and thin piezoelectric substrate portion located between the grooves 386 and 390 define coupling parts, respectively.

The piezoelectric vibrating part 395 is polarized along arrow P, i.e., along the longitudinal direction of a piezoelectric substrate 382. On the other hand, resonance electrodes 398 and 399 are formed on an upper surface of the piezoelectric substrate 382 and disposed to be parallel with the polarization direction P. An upper surface of the piezoelectric vibrating part 395 has a rectangular shape, and the ratio b/a is set in a range of ±10% from a value satisfying the equation (2) assuming that a and b represent lengths of shorter and longer sides of the upper surface, respectively.

When an alternating voltage is applied across the resonance electrodes 398 and 399, therefore, the piezoelectric vibrating part 395 is resonated in a shear mode, so that resonance energy is effectively trapped in the piezoelectric vibrating part 395. Further, the dynamic dampers 391 to 394 suppress slight leaking vibration via a phenomenon of a dynamic damper. In the piezo-resonator 381, therefore, vibrational energy is reliably trapped in the portion of the resonance part located between the dynamic dampers 391 to 394.

Lead electrodes 400 and 401 are formed on the holding parts 396 and 397, respectively.

Figure 25:
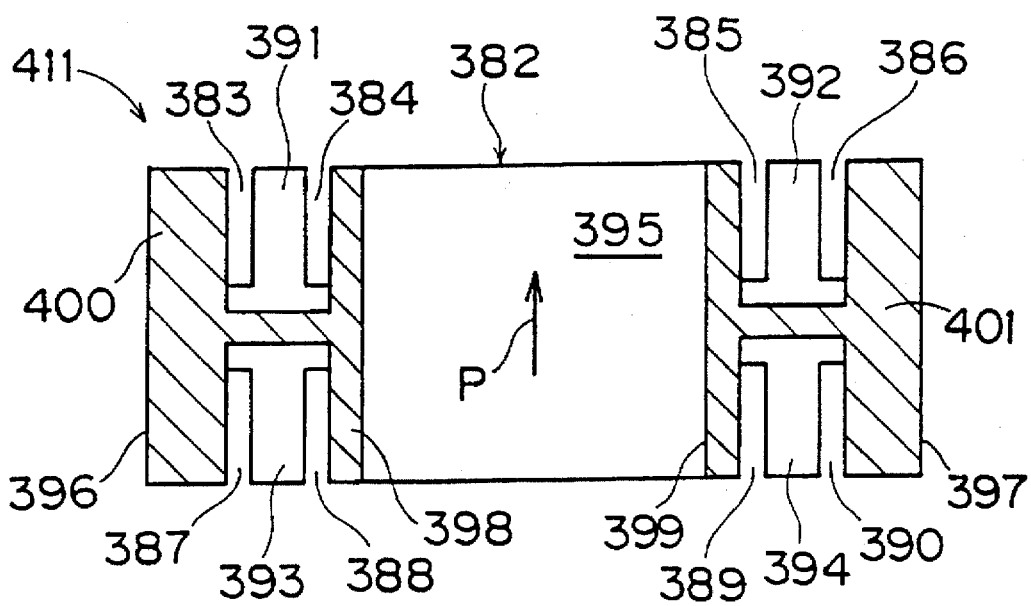
FIG. 25 is a plan view showing a further example of the second type piezo-resonator.

FIG. 25 shows a modification of the piezo-resonator 381 shown in FIG. 24. This piezo-resonator 411 is different from the piezo-resonator 381 in that a piezoelectric vibrating part 395 is polarized along arrow P, i.e., in parallel with the width direction of a piezoelectric substrate 382, and resonance electrodes 398 and 399 are formed to extend along the width direction.

Figure 26:
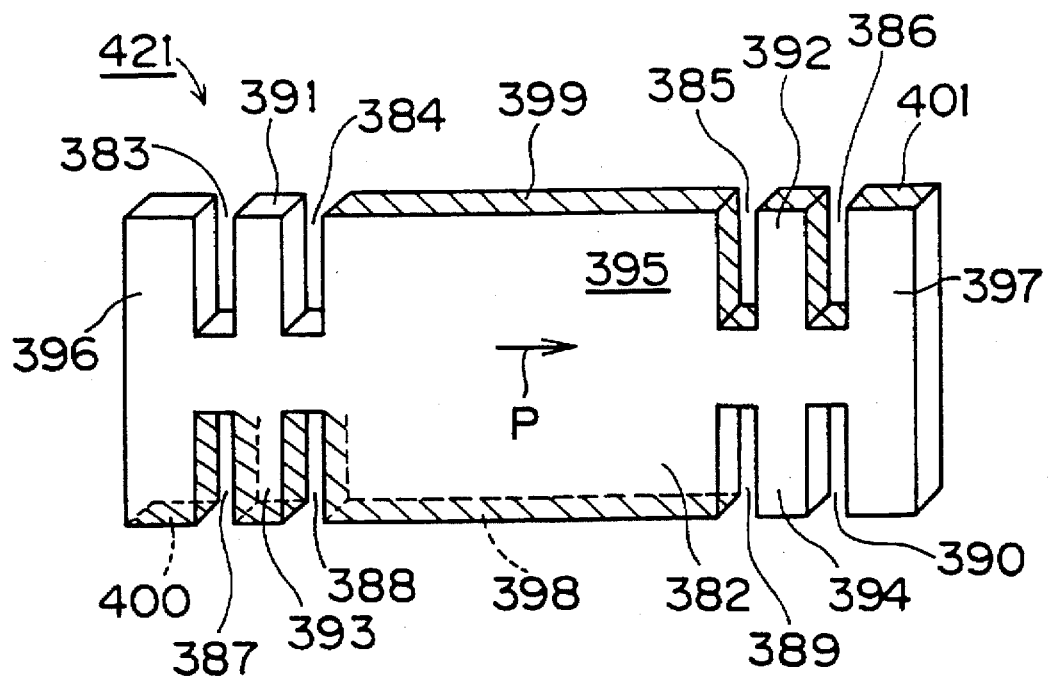
FIG. 26 is a perspective view showing a further example of the second type piezo-resonator.

FIG. 26 is a perspective view showing another modification of the piezo-resonator 381 shown in FIG. 24. In this piezo-resonator 421, a piezoelectric vibrating part 395 is polarized along arrow P, i.e., in parallel with the longitudinal direction of a piezoelectric substrate 382. This piezo-resonator 421 is different from the piezo-resonator 381 in the positions provided with electrodes.

In the piezo-resonator 421, resonance electrodes 398 and 399 are formed on both side surfaces of the piezoelectric substrate 382 in the piezoelectric vibrating part 395.

In the piezo-resonator 421, further, lead electrodes 400 and 401 are formed on the side surfaces of the piezoelectric substrate 382 holding parts 396 and 397, respectively. Further connecting conductive parts for electrically connecting the lead electrodes 400 and 401 with the resonance electrodes 398 and 399 are also formed along the side surfaces of the piezoelectric substrate 382, respectively.

As clearly understood from the piezo-resonator 421, resonance electrodes may be formed on side surfaces of a piezoelectric plate forming a piezoelectric vibrating part in addition to upper and lower surfaces thereof in the second type piezo-resonator. In the piezo-resonator 381 shown in FIG. 24, for example, the resonance electrode 399 may be formed on a lower surface of the piezoelectric substrate 382, while one of the resonance electrodes 398 and 399 may be formed on one major surface of the piezoelectric substrate 382 in the piezo-resonator 421, for example.

Also in the second type of piezo-resonator, a piezoelectric vibrating part, support parts and holding parts, as well as dynamic dampers which are provided as needed may be formed by machining a single piezoelectric substrate, or these parts may be formed by separate members.

Figure 27:
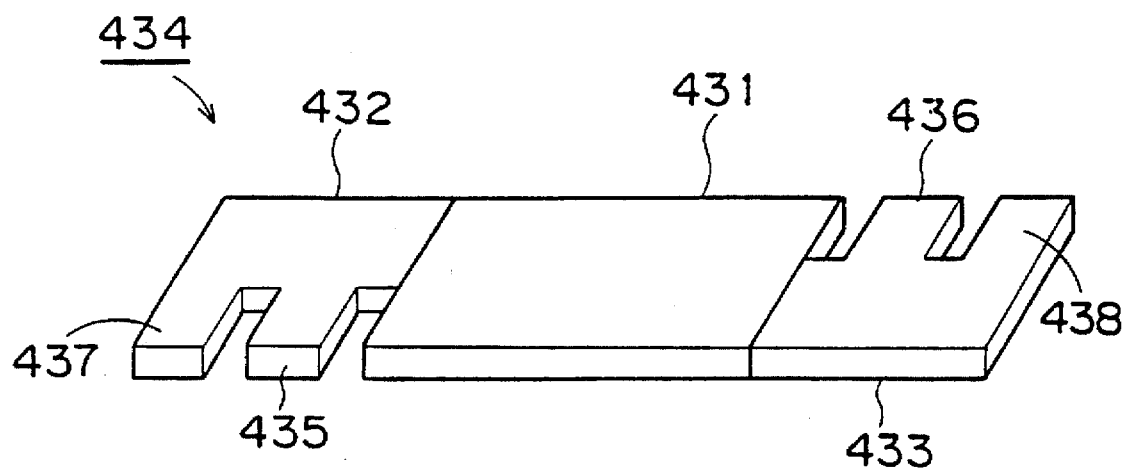
FIG. 27 is a perspective view showing a structure obtained by integrating a piezoelectric vibrating part, support parts, dynamic dampers and holding parts with each other for forming second type piezo-resonator.

As shown in FIG. 27, for example, insulating plates 432 and 433 may be bonded to a rectangular piezoelectric plate 431 of the same thickness for forming a piezoelectric vibrating part, thereby forming a substrate 434. It is possible to form the aforementioned second type of piezo-resonator by this substrate 434. While dynamic dampers 435 and 436 and holding parts 437 and 438 are integrally formed with the insulating plates 432 and 433 in the substrate 434 shown in FIG. 27, these parts may alternatively be formed by separate members.

Figure 28:
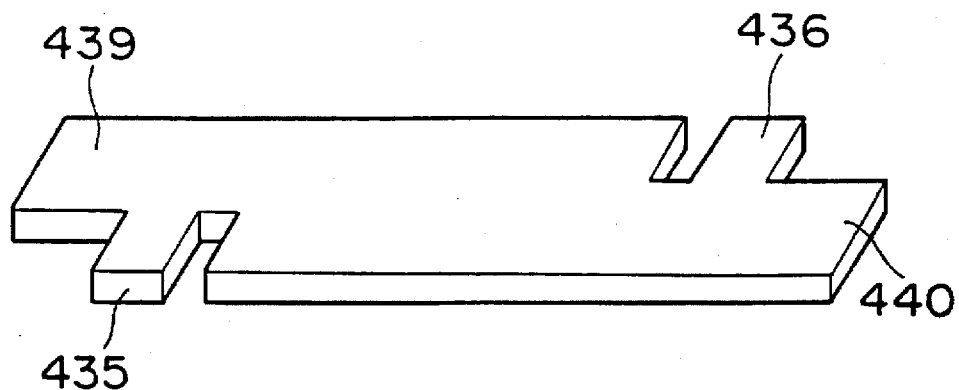
FIG. 28 is a perspective view showing a piezoelectric plate having coupling parts and holding parts which are integrated with each other.

As shown in FIG. 28, further, substrate parts 439 and 440 of the same widths may be formed outside of the dynamic dampers 435 and 453. In this case, the substrate parts 439 and 440 also serve as both coupling and holding parts.

First Preferred Embodiment

Figure 29:
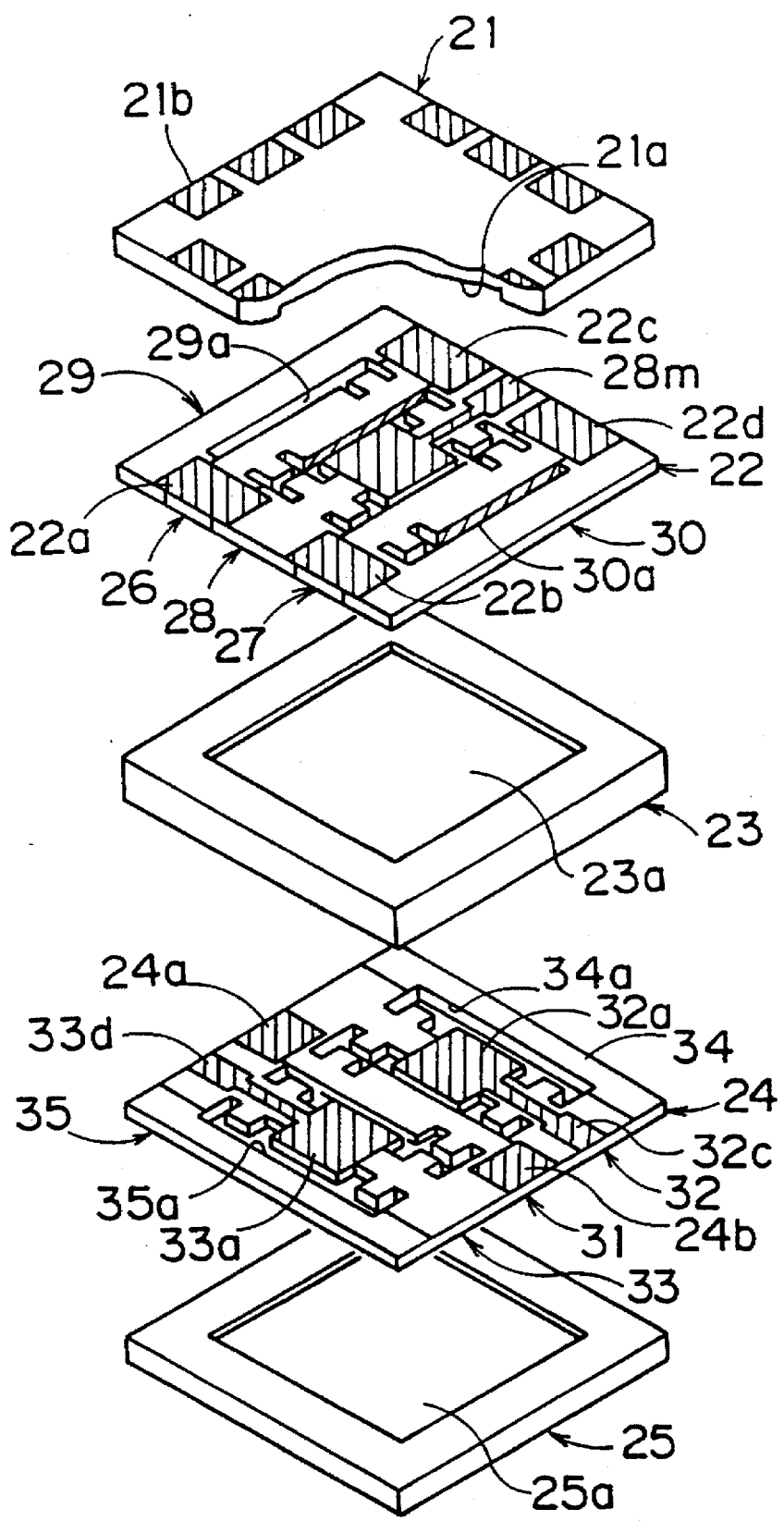
FIG. 29 is an exploded perspective view showing a ladder-type filter according to a first preferred embodiment of the present invention.
Figure 30:
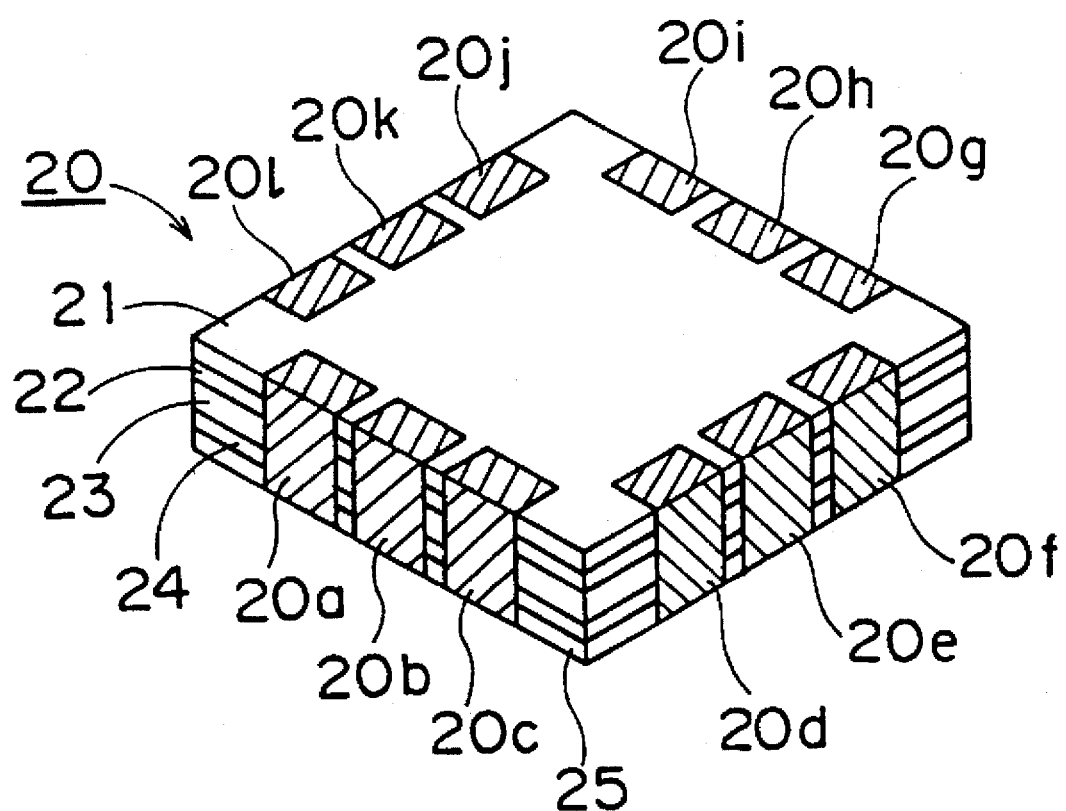
FIG. 30 is a perspective view showing the appearance of the ladder-type filter according to the first preferred embodiment.

FIG. 29 is an exploded perspective view showing a ladder-type filter 20 according to a first preferred embodiment of the present invention, and FIG. 30 is a perspective view showing its appearance.

The ladder-type filter 20 has a structure obtained by stacking a case substrate 21, a first resonance plate 22, an isolating spacer 23, a second resonance plate 24 and a case substrate 25 shown in FIG. 29.

The first resonance plate 22 has a structure formed by bonding and integrating piezo-resonators 26 and 27 having dynamic dampers and utilizing a shear vibration mode and a piezo-resonator 28 having dynamic dampers and utilizing a width expansion mode thereby coupling the same with each other, and further bonding spacer plates 29 and 30 which are substantially equal in thickness to the piezo-resonators 26 to 28 to outer sides of the integrated structure by an adhesive or some other connecting material or method. The spacer plates 29 and 30 are made of a suitable insulating material having a certain degree of strength such as insulating ceramics, i.e., alumina or synthetic resin, and has notches 29a and 30a for allowing vibration of vibrating parts of the piezo-resonators 26 and 27.

Figure 31A:
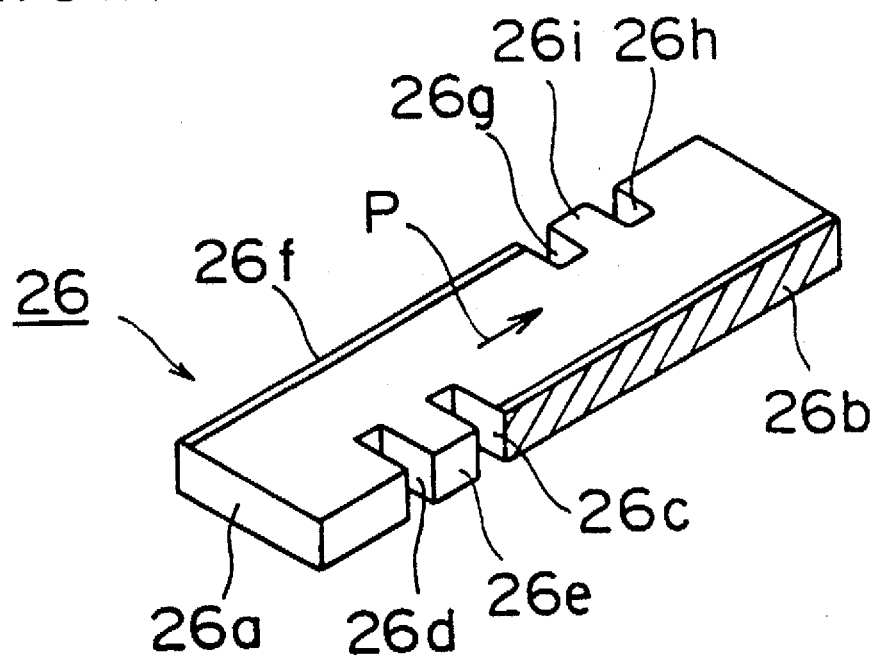
FIGS. 31A and 31B are perspective views for illustrating a piezo-resonator having dynamic dampers which is employed in the first preferred embodiment.

As shown in FIG. 31A, the piezo-resonator 26 having dynamic dampers is formed by an elongated rectangular piezoelectric ceramic plate 26a which is uniformly polarized along arrow P. A resonance electrode 26b is formed on one side surface of the piezoelectric ceramic plate 26a, to extend from a first end toward a second end of the piezoelectric ceramic plate 26a. A forward end of the resonance electrode 26b is terminated at a portion reaching a cavity 26c which is defined by notching the side surface. Another cavity 26d is formed at a prescribed distance from the cavity 26c, thereby defining a dynamic damper 26e between the cavities 26c and 26d.

Similarly, a resonance electrode 26f is formed on another side surface of the piezoelectric ceramic plate 26a to extend from the second end toward the first end thereof. Similarly to the side provided with the resonance electrode 26b, two cavities 26g and 26h are formed to define a dynamic damper 26i therebetween.

In the second type piezo-resonator 26, an overlapping portion of the resonance electrodes 26b and 26f defines a piezoelectric vibrating part, and a dimensional ratio b/a of this piezoelectric vibrating part is set in a range of ±10% from a value satisfying the above equation (2). Namely, the piezo-resonator 26 is formed similarly to the piezo-resonator 371 shown in FIG. 23. Portions located between the piezoelectric vibrating part and the dynamic dampers 26e and 26i define support parts, piezoelectric ceramic plate portions extending outwardly beyond those provided with the cavities 26d and 26h define holding parts, and piezoelectric ceramic portions having relatively narrow widths located between the holding parts and the dynamic dampers 26e and 26i define coupling parts.

When an alternating voltage is applied across the resonance electrodes 26b and 26f in the piezo-resonator 26 having dynamic dampers, the overlapping region of the resonance electrodes 26b and 26f is resonated in a shear vibration mode, to implement an operation for serving as a piezo-resonator. Further, the resonance part is formed to have the aforementioned specific dimensional ratio, whereby resonance energy is effectively trapped.

Even if vibration caused in the overlapping region of the resonance electrodes 26b and 26f leaks, this vibration is reliably trapped in vibrating portion located between the dynamic dampers 26e and 26i. Namely, even if resonance of a shear vibration mode outwardly leaks from the resonance part, the dynamic dampers 26e and 26i are resonated by the leaking vibration, to damp this leaking vibration via a phenomenon of a dynamic damper. Therefore, substantially no vibration is transmitted to the piezoelectric ceramic plate portions which are located outward beyond the dynamic dampers 26e and 26i. Therefore, it is possible to mechanically hold the piezo-resonator 26 without inhibiting resonance of the resonance part, by coupling the piezoelectric ceramic plate portions located outward beyond the dynamic dampers 26e and 26i to other members.

Referring again to FIG. 29, the piezo-resonator 28 having dynamic dampers employed for the first resonance plate 22 is described with reference to FIG. 31B. The piezo-resonator 28 having dynamic dampers is the aforementioned first or fourth type of piezo-resonator, and formed by a piezoelectric ceramic plate 28a having a planar shape shown in FIG. 31B. This piezoelectric ceramic plate 28a is provided on its center with a piezoelectric vibrating part 28b having a rectangular planar shape. The piezoelectric vibrating part 28b is polarized along arrow P, and provided with resonance electrodes 28c on both major surfaces (that provided on a lower surface is not shown in FIG. 31B).

In the piezoelectric vibrating part 28b, a dimensional ratio b/a is selected to be in a range of ±10% from a value satisfying the equation (1).

When an alternating voltage is applied across the resonance electrodes 28c which are provided on both major surfaces of the piezoelectric vibrating part 28b, the piezoelectric vibrating part 28b is resonated in a width expansion vibration mode, while resonance energy is effectively trapped in this piezoelectric vibrating part 28b due to the ratio b/a which is set in the aforementioned specific range.

On the other hand, elongated bar-type support parts 28d and 28e are coupled to centers of opposite side surfaces of the piezoelectric vibrating parts 28b, while dynamic dampers 28f and 28g are formed on outer sides of the support parts 28d and 28e, respectively. The dynamic dampers 28f and 28g are formed to be resonated by vibration transmitted from the piezoelectric vibrating part 28b. Even if resonance energy leaks from the piezoelectric vibrating part 28b, therefore, this energy is reliably trapped in a vibrating portion located between the dynamic dampers 28f and 28g.

Further, coupling parts 28h and 28i are coupled to outer sides of the dynamic dampers 28f and 28g, respectively, while holding parts 28j and 28k are coupled to outer ends of the coupling parts 28h and 28i, respectively. The holding parts 28j and 28k are adapted to couple the piezo-resonator 28 with other members or to mechanically hold the same, and have relatively large areas, as shown in FIG. 31B.

Figure 31B:
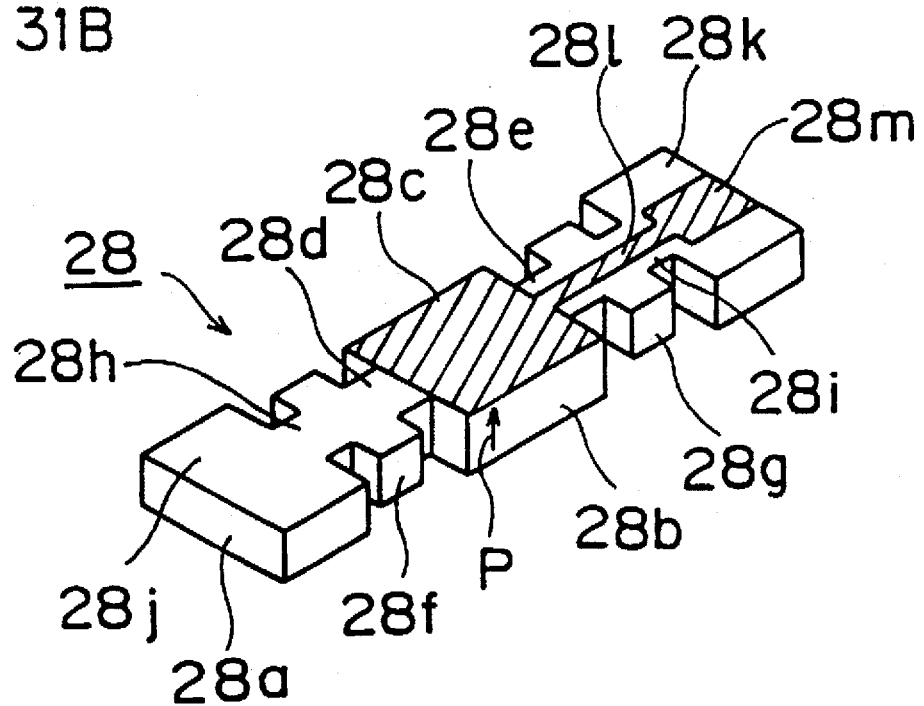

Each of the piezo-resonators 26 and 28 having dynamic dampers shown in FIGS. 31A and 31B can be formed by machining a single piezoelectric ceramic plate as described above, while the respective parts thereof may alternatively be formed by separate members to be coupled with each other through an adhesive or the like. In place of the piezoelectric ceramic plate 28a shown in FIG. 31B, for example, a rectangular piezoelectric ceramic plate for forming a piezoelectric vibrating part may be employed so that members forming the support parts 28d and 28e, the dynamic dampers 28f and 28g, the coupling parts 28h and 28i and the holding parts 28j and 28k are bonded to its side portions by an adhesive or the like and integrated with each other. It is pointed out here that a piezoelectric ceramic plate and parts for defining each piezo-resonator may be formed by machining a piezoelectric ceramic plate, or coupling a plurality of members with each other also in each piezo-resonator having dynamic dampers in each of second to tenth preferred embodiments described later.

The resonance electrode 28c appearing in FIG. 31B is electrically connected to an electrode 28m which is formed on an upper surface of the holding part 28k through a connecting conductive part 28l. Similarly, the other resonance electrode which is formed on the lower surface of the resonance part 28b is also electrically connected to an electrode which is formed on a lower surface of the holding part 28j through a connecting conductive part.

Referring again to FIG. 29, the piezo-resonator 27 having dynamic dampers, which has the same structure as the piezo-resonator 26 having dynamic dampers, and the piezo-resonators 26 and 28 having dynamic dampers are integrated with each other by bonding side surfaces of the holding parts thereof with each other by an insulating adhesive, while the first and second spacer plates 29 and 30 are further bonded on side portions of the integrated substance, thereby forming the first resonance plate 22.

The resonance plate 22 is provided on its upper surface with electrodes 22a and 22d for electrically connecting the piezo-resonators 26 to 28 with each other for forming a ladder-type filter as described later. The electrode 22a is electrically connected with the resonance electrode 26f (see FIG. 31A) of the piezo-resonator 26. Similarly, the electrode 22c is electrically connected with the resonance electrode 26b, while the electrodes 22b and 22d are electrically connected with single ones of the resonance electrodes formed on the side surfaces of the piezo-resonator 27. The piezo-resonator 28 is provided with an electrode 28m, which is connected with the resonance electrode 28c to reach an edge of the resonance plate 22 as shown in FIG. 31B, as well as, another electrode which is electrically connected with the resonance electrode provided on its lower surface to reach an opposite edge on the lower surface of the resonance plate 22.

In the second resonance plate 24, piezo-resonators 32 and 33 having dynamic dampers and utilizing a width expansion vibration mode, which are formed similarly to the piezo-resonator 28 having dynamic dampers, are bonded to both sides of a piezo-resonator 31 having dynamic dampers and utilizing a shear vibration mode provided with the same structure as the piezo-resonator 26. Further, first and second spacer plates 34 and 35 having the same thickness as the piezo-resonators 31 to 33, which are made of a proper insulating material having a certain degree of strength such as insulating ceramics or synthetic resin, are bonded to side portions of the piezo-resonators 32 and 33. As shown in FIG. 29, the spacer plates 34 and 35 have substantially U-shaped notches 34a and 35a on edges close to the piezo-resonators 32 and 33. These notches 34a and 35a are adapted to ensure spaces for allowing vibration of resonance and dynamic resonance parts of the piezo-resonators 32 and 33.

The structures of the piezo-resonators 31 to 33 themselves are similar to those of the piezo-resonators 26 and 28, and hence redundant description is omitted.

In the second resonance plate 24, electrodes 24a and 24b are formed on the upper surface so to extend to different edges. The electrodes 24a and 24b are electrically connected to single ones of the resonance electrodes which are provided on both side surfaces of the piezo-resonator 31. In the piezo-resonators 32 and 33, on the other hand, electrodes 32c and 33d provided on the holding parts which are electrically connected with resonance electrodes 32a and 33a provided on the upper surfaces are formed so as to extend to different edges of the resonance plate 24. Further, resonance electrodes which are formed on lower surfaces of the resonance parts of the piezo-resonators 32 and 33 are electrically connected to electrodes reaching opposite edges on the lower surfaces.

The case substrates 21 and 25 have cavities 21a and 25a on lower and upper surfaces thereof, respectively. The cavities 21a and 25a are adapted to allow vibration of the resonance parts and the dynamic dampers of the adjacent piezo-resonators upon stacking. The isolating spacer 23 is also provided with a cavity 23a on its upper surface, as well as with another cavity (not clearly shown in FIG. 29) of the same shape on its lower surface. These cavities are adapted to allow vibration of the resonance parts and the dynamic dampers of the vertically arranged piezo-resonators.

Alternatively, the case substrate 21, the isolating spacer 23 and the case substrate 25 may be in the form of flat plates with no provision of the cavities 21a, 23a and 25a. In this case, it is necessary to form similar spaces for allowing vibration of the piezoelectric vibrating parts and the dynamic dampers, by interposing rectangular frame type spaces having thicknesses corresponding to depths of the cavities 21a, 23a and 25a, or applying an insulating adhesive in the form of rectangular frames.

The case substrates 21 and 25 and the isolating spacer 23 can be prepared from an insulating material having a certain degree of strength such as insulating ceramics such as alumina or synthetic resin, for example.

According to this preferred embodiment, the case substrate 21, the first resonance plate 22, the isolating spacer 23, the second resonance plate 24 and the case substrate 25 are stacked with and bonded to each other by an insulating adhesive, to be integrated as a ladder-type filter having a laminate structure. This is now described with reference to FIG. 30.

Figure 32:
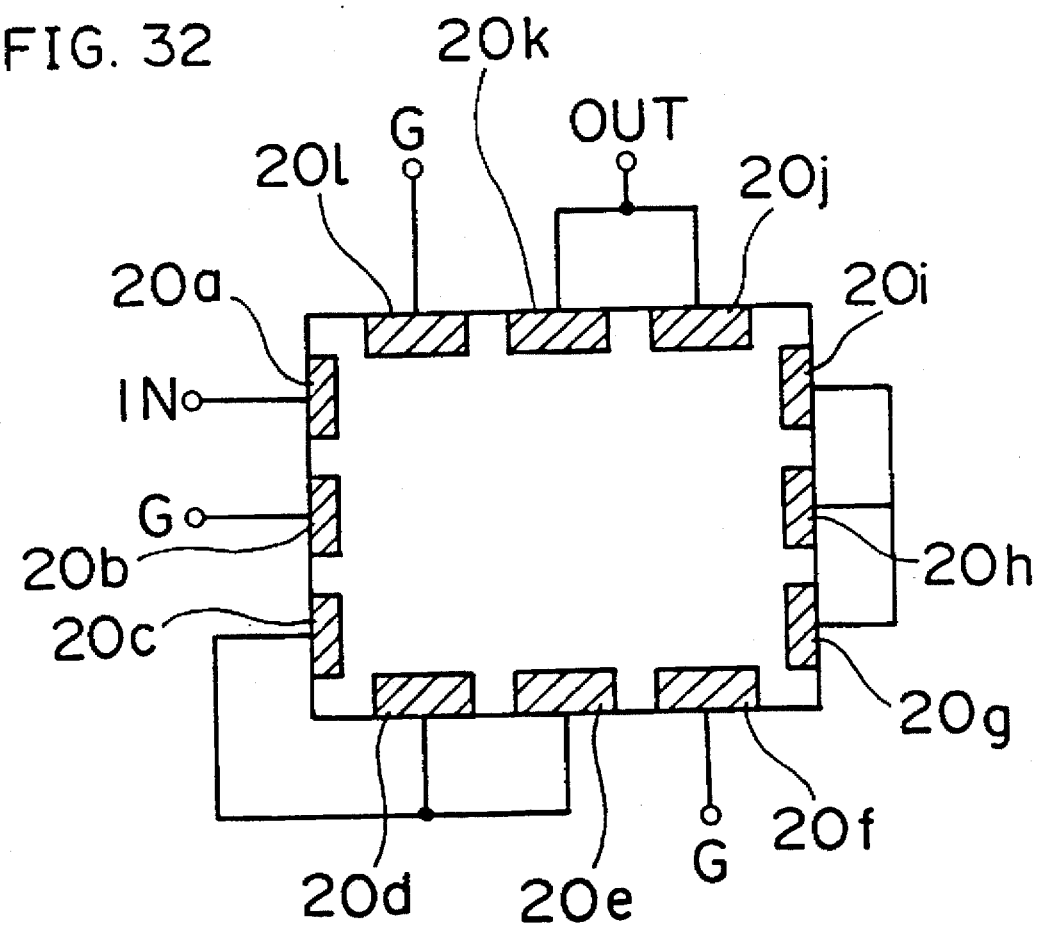
FIG. 32 is a typical plan view for illustrating connected states of terminal electrodes in the first preferred embodiment.
Figure 33:
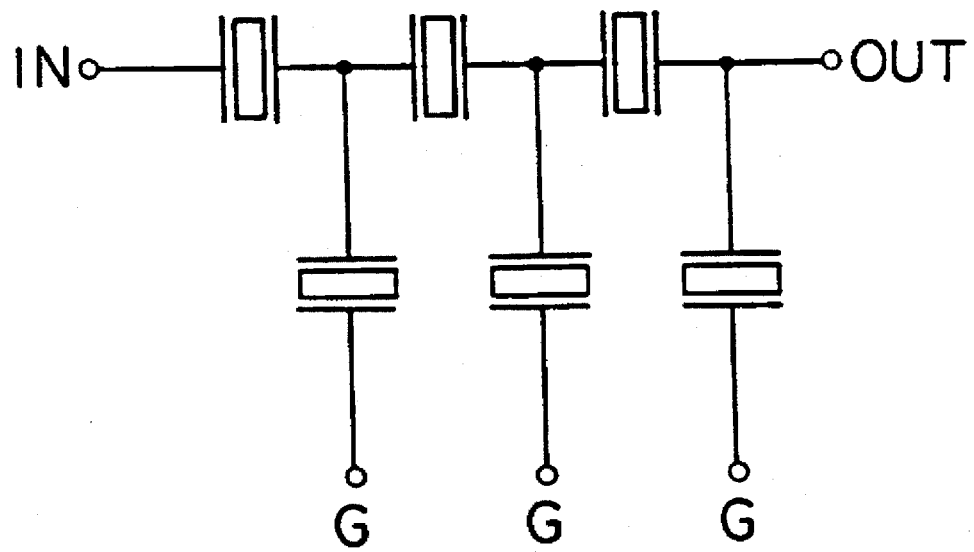
FIG. 33 illustrates the circuit structure of the ladder-type filter according to the first preferred embodiment.

As clearly understood from FIG. 30, the ladder-type filter 20 according to this preferred embodiment has a structure obtained by stacking a plurality of rectangular plate type members, and is provided with terminal electrodes 20a to 20l extending from the side surfaces to reach the upper and lower surfaces. It is possible to form the terminal electrodes 20a to 20l by applying and baking conductive paste, or through evaporation, plating or sputtering. Alternatively, a plurality of electrodes 21b may be previously formed on the upper surface of the case substrate 21 as shown in FIG. 29 with formation of a plurality of terminal electrode portions on the lower surface of the case substrate 25 so that an electrode material is thereafter applied to the side surfaces of the laminate as shown in FIG. 30, thereby forming the terminal electrodes 20a to 20l extending from the side surfaces to reach the upper and lower surfaces It is possible to drive the ladder-type filter 20 obtained in the aforementioned manner as that shown in a circuit diagram of FIG. 33, by connecting the terminal electrodes 20a to 20l as shown in FIG. 32 so that the terminal electrode 20a serves as an input end, the terminal electrodes 20k and 20j serve as output ends and the terminal electrodes 20l, 20f and 20b are connected to ground potentials.

In the ladder-type filter 20 according to this preferred embodiment, series and parallel resonators are formed by the piezo-resonators 26 to 28 and 31 to 33 having dynamic dampers and employing shear and width expansion vibration modes. Therefore, it is possible to readily widen a passband as compared with a ladder-type filter employing tuning fork type piezo-resonators.

Further, vibrational energy is effectively trapped in resonator portions located between dynamic dampers in the piezo-resonators having dynamic dampers, whereby the piezo-resonators can be readily coupled and integrated with each other through the holding parts, as described above.

Second Preferred Embodiment

Figure 34:
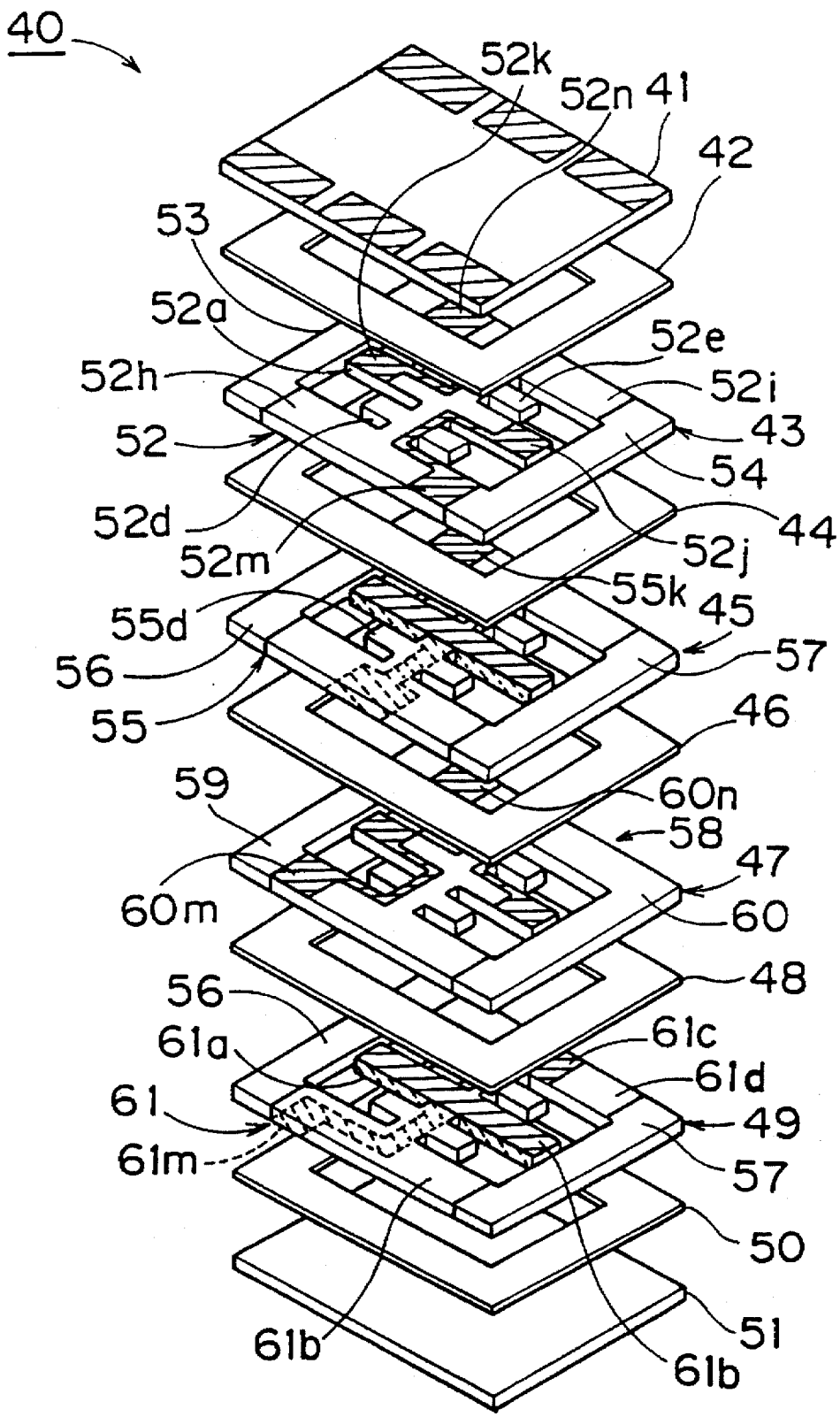
FIG. 34 is an exploded perspective view for illustrating a ladder-type filter according to a second preferred embodiment of the present invention.
Figure 35:
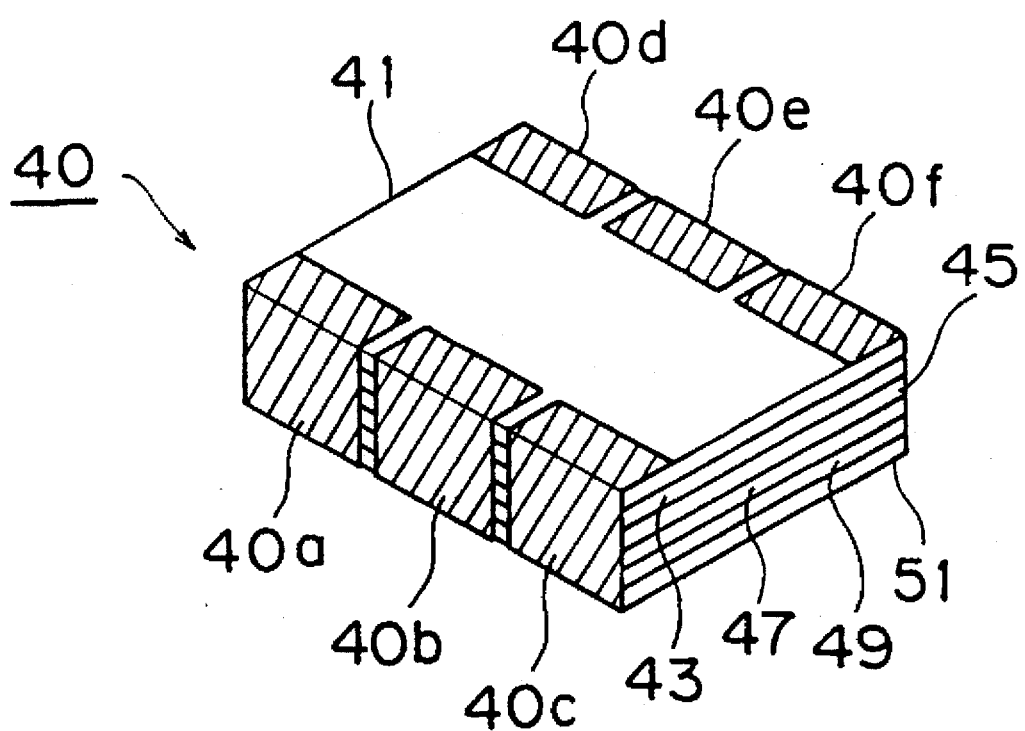
FIG. 35 is a perspective view showing the appearance of a T-connection type filter which is prepared according to the second preferred embodiment.

FIG. 34 is an exploded perspective view for illustrating a ladder-type filter 40 according to a second preferred embodiment of the present invention, and FIG. 35 is a perspective view showing its appearance. This ladder-type filter 40 is formed by successively stacking a case substrate 41, a cavity forming spacer 42, a first resonance plate 43, a cavity forming spacer 44, a second resonance plate 45, a cavity forming spacer 46, a third resonance plate 47, a cavity forming spacer 48, a fourth resonance plate 49, a cavity forming spacer 50 and a case substrate 51 in order from above.

The case substrates 41 and 51 are made of material which is similar to that for the case substrates 21 and 25 employed in the first preferred embodiment. However, the case substrates 41 and 51 are formed by flat plate type members, and provided with no cavities corresponding to the cavities 21a and 25a provided in the case substrates 21 and 25 of the first preferred embodiment. Therefore, the spacer 42 is inserted so as to provide a space for allowing vibration of a vibrating part of the first resonance plate 43 which is arranged under the case substrate 41. Similarly, the cavity forming spacer 50 is arranged on an upper surface of the case substrate 51 to ensure a space for allowing vibration of a vibrating part of the fourth resonance plate 49.

The cavity forming spacers 42 and 50, which are formed by rectangular frame type members having small thicknesses as shown in FIG. 34, can be made of synthetic resin or another proper insulating material, for example. The remaining cavity forming spacers 44, 46 and 48 can also be made of a material which is similar to that for the cavity forming spacers 42 and 50.

Figure 36A:
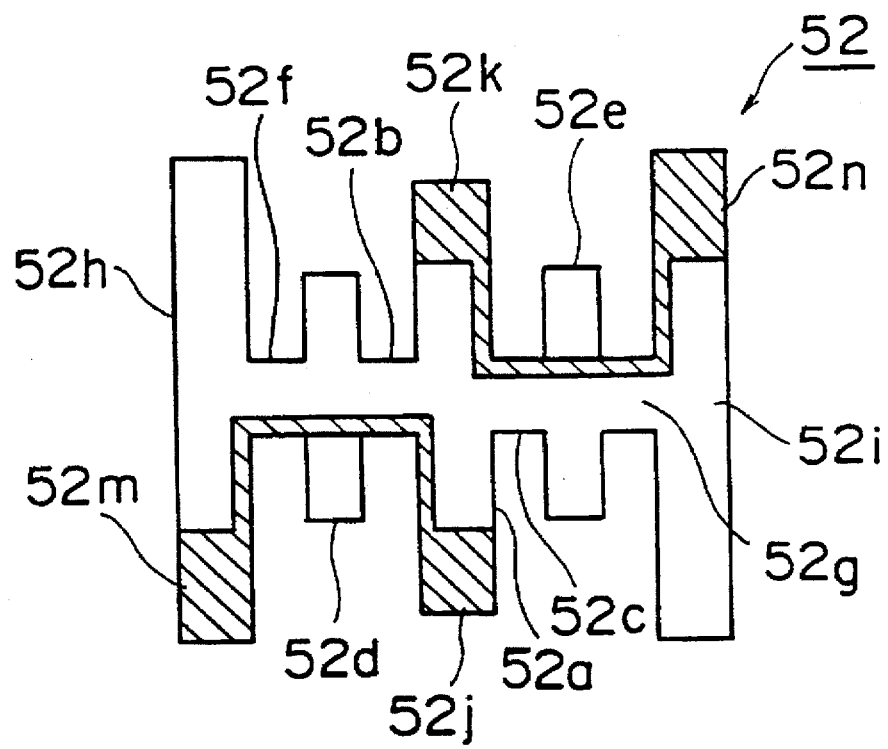
FIGS. 36A and 36B are plan views for illustrating piezo-resonators having dynamic dampers utilizing a length mode which are employed in the second preferred embodiment.

The first resonance plate 43 has a piezo-resonator 52 having dynamic dampers and which vibrates in a length vibration mode. As shown in FIG. 36A in a plan view, the piezo-resonator 52 is formed by a piezoelectric ceramic plate, and provided on its center with a piezoelectric vibrating part 52a which vibrates in the length vibration mode. The piezoelectric vibrating part 52a is in the form of an elongated rectangular plate, and is polarized so that axes of polarization are located along its longitudinal direction. Support parts 52b and 52c are connected to the longitudinal center of the piezoelectric vibrating part 52a, for supporting the piezoelectric vibrating part 52a. Dynamic dampers 52d and 52e, which are formed to be capable of being resonated in a bending mode, are provided on outer ends of the support parts 52b and 52c, respectively. Dimensions of the dynamic dampers 52d and 52e are determined so that the same are resonated by vibration leaking upon resonance of the piezoelectric vibrating part 52a to prevent vibrational energy from outward leakage beyond the dynamic dampers 52d and 52e.

Coupling parts 52f and 52g having relatively small widths are connected to outer sides of the dynamic dampers 52d and 52e, while holding parts 52h and 52i having relatively large areas are coupled to outer sides thereof.

Spacers 53 and 54 which are equal in thickness to the piezo-resonator 52 having dynamic dampers are bonded to and integrated with the holding parts 52h and 52i, thereby defining the first resonance plate 43. Dimensions of the holding parts 52h and 52i or shapes of the spacers 53 and 54 are selected so as to define spaces for allowing resonance of the piezoelectric vibrating part 52a.

The piezoelectric vibrating part 52a is provided on its upper surface with resonance electrodes 52j and 52k for exciting the piezoelectric vibrating part 52a, and these resonance electrodes 52j and 52k are electrically connected to electrodes 52m and 52n which are formed on the holding parts 52h and 52i through connecting conductive parts, respectively.

On the other hand, the second resonance plate 45 is formed by bonding spacers 56 and 57 to side portions of the piezo-resonator 55 having dynamic dampers. The spacers 56 and 57 are similar in structure to the aforementioned spacers 53 and 54.

Figure 36B:
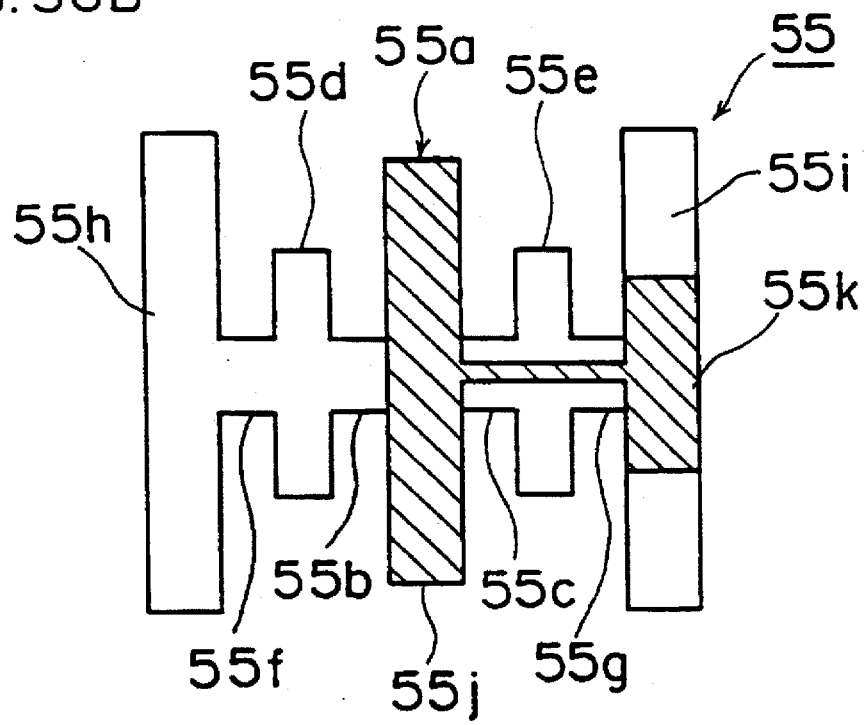

As shown in FIG. 36B in a plan view, the piezo-resonator 55 is provided on its center with an elongated rectangular plate type piezoelectric vibrating part 55a. Support parts 55b and 55c are connected to side portions of the piezoelectric vibrating part 55a and dynamic dampers 55d and 55e are formed on outer ends of the support parts 55b and 55c respectively, while holding parts 55h and 55i having relatively large areas are formed on sides of the dynamic dampers 55d and 55e through coupling parts 55f and 55g, respectively. Thus, the piezo-resonator 55 is similar in overall planar shape to the piezo-resonator 52 having dynamic dampers.

The former is different form the latter in that a resonance electrode 55j is formed entirely over the piezoelectric vibrating part 55a and another resonance electrode (not shown) is also formed entirely over the lower surface, while the piezoelectric ceramic plate is uniformly polarized in the piezoelectric vibrating part 55a along its thickness. This piezoelectric vibrating part 55a also vibrates in a length mode.

The resonance electrode 55j provided on the piezoelectric vibrating part 55a is electrically connected to an electrode 55k which is formed on the holding part 55i through a connecting conductive part, while that provided on the lower surface is electrically connected to an electrode which is formed on a lower surface of the holding part 55h through a connecting conductive part.

Referring again to FIG. 34, the third resonance plate 47 is different from the first resonance plate 43 merely in a manner of drawing out electrodes toward holding parts. Therefore, the above explanation of the first resonance plate 43 is also applied to a piezo-resonator 58 having dynamic dampers and spacers 59 and 60 forming the third resonance plate 47, to omit redundant description.

The fourth resonance plate 49 is also different from the second resonance plate 45 merely in a manner of drawing out electrodes toward holding parts. Briefly stated, an electrode 61c provided on a holding part 61d to be electrically connected to a resonance electrode 61b which is formed on an upper surface of a piezoelectric vibrating part 61a of the piezo-resonator 61 is formed on a central position of the holding part 61d. On the other hand, a resonance electrode (not shown) which is formed entirely over the lower surface of the piezoelectric vibrating part 61a is electrically connected to an electrode which is formed on a lower end of a holding part 61e.

Figure 37:
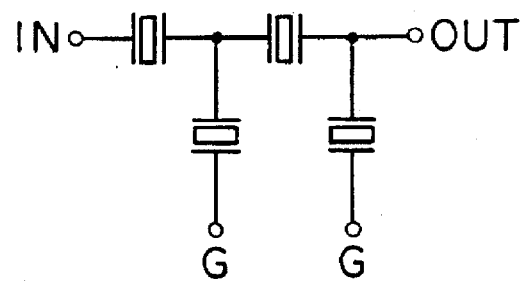
FIG. 37 illustrates a circuit structure of the ladder-type filter according to the second preferred embodiment.

The lead electrodes of the third and fourth resonance plates 47 and 49 are made different from those of the first and second resonance plates 43 and 45 for the following object. An external electrode 40a makes electrodes 60m and 61m shown in FIG. 34 conduct with each other, while another external electrode 40d makes electrodes 52n, 55k and 60n conduct with each other, whereby a two-stage ladder-type filter shown in FIG. 37 is constructed. The electrode 40d, which is a dummy electrode, has the aforementioned function. An external electrode 40f is a pure dummy electrode.

Also, in the second preferred embodiment, it is possible to complete the ladder-type filter 40 as a two-stage type one as shown in FIG. 35, by stacking the respective members and forming the external electrodes to extend from the side surfaces to reach the upper and lower surfaces, similarly to the first preferred embodiment. Referring to FIG. 35, numerals 40a to 40f denote the external electrodes. The spacers 42, 44, 46 and 48 having relatively small thicknesses are not shown in FIG. 35.

Thus, it is possible to drive the ladder-type filter 40 as a two-stage type one as shown in FIG. 37, by utilizing the external electrodes 40c and 40a as input and output ends respectively and connecting the external electrodes 40b and 40e to the ground potentials.

Third Preferred Embodiment

Figure 38:
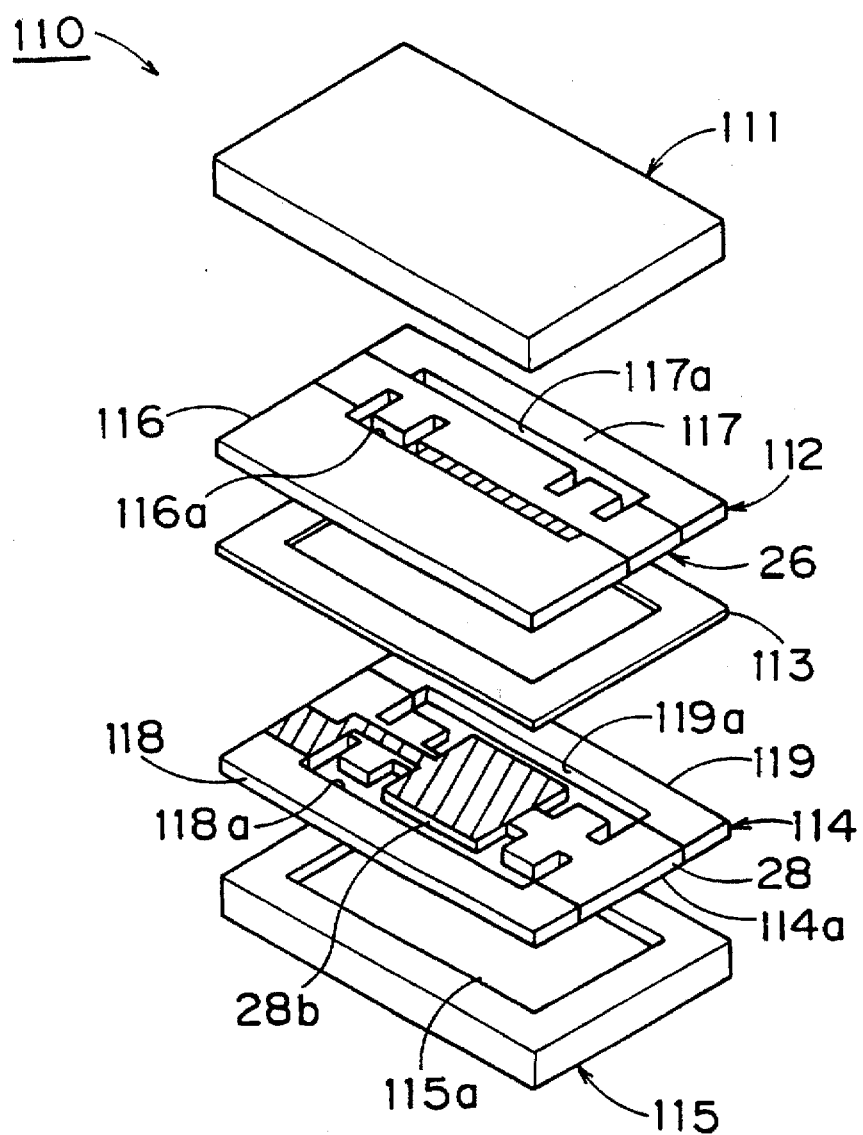
FIG. 38 is an exploded perspective view showing a ladder-type filter according to a third preferred embodiment of the present invention.
Figure 39:
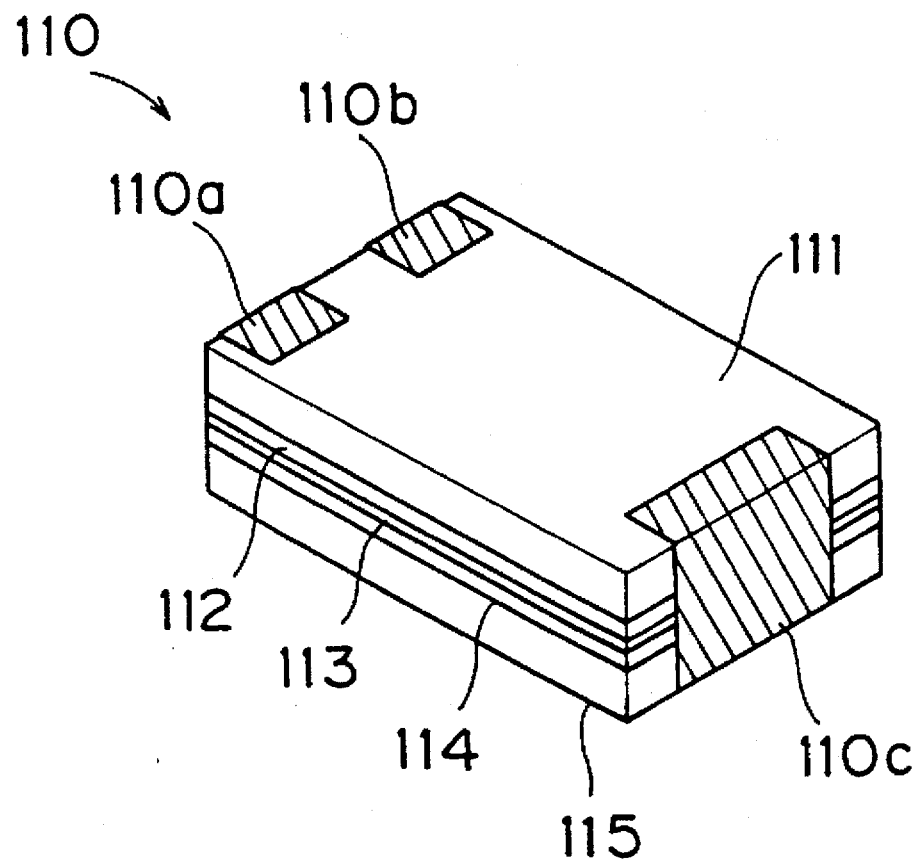
FIG. 39 is a perspective view showing the appearance of the ladder-type filter according to the third preferred embodiment.

FIG. 38 is an exploded perspective view showing a one-stage ladder-type filter 110 according to a third preferred embodiment of the present invention, and FIG. 39 is a perspective view showing its appearance.

In the ladder-type filter 110 according to this preferred embodiment, a case substrate 111, a resonance plate 112, a cavity forming spacer 113, a resonance plate 114 and a case substrate 115 are stacked with each other.

A cavity 115a is formed in an upper surface of the case substrate 115 and a similar cavity is formed also in a lower surface of the case substrate 111, thereby ensuring spaces for allowing vibration of vibrating parts of the resonance plates 112 and 114 as stacked. Due to interposition of the cavity forming spacer 113, further spaces are defined for allowing vibrating parts of the resonance plates 112 and 114.

The case substrates 111 and 115 and the cavity forming spacer 113 are formed similarly to those employed in the first preferred embodiment, and hence redundant description is omitted.

The resonance plate 112 is formed by pasting spacers 116 and 117 to both sides of a piezo-resonator 26 having dynamic dampers which is similar to that shown in FIG. 31A. The spacers 116 and 117 have notches 116a and 117a in side surfaces which are close to the piezo-resonator 26, thereby allowing vibration of a vibrating part of the piezo-resonator 26.

On the other hand, the resonance plate 114 is formed by pasting spacers 118 and 119 to both sides of a piezo-resonator 28 which is identical to that shown in FIG. 31B except that positions provided with electrodes are slightly different in portions drawing out resonance electrodes. The spacers 118 and 119 have notches 118a and 119a in side surfaces which are close to the piezo-resonator 28, similarly to the spacers 116 and 117.

In the piezo-resonator 28, a resonance electrode is also formed on a lower surface of a resonance part 28b so that an electrode which is electrically connected with this resonance electrode reaches an edge 114a of the resonance plate 114, although this structure is not necessarily clarified in FIG. 38.

Figure 40:
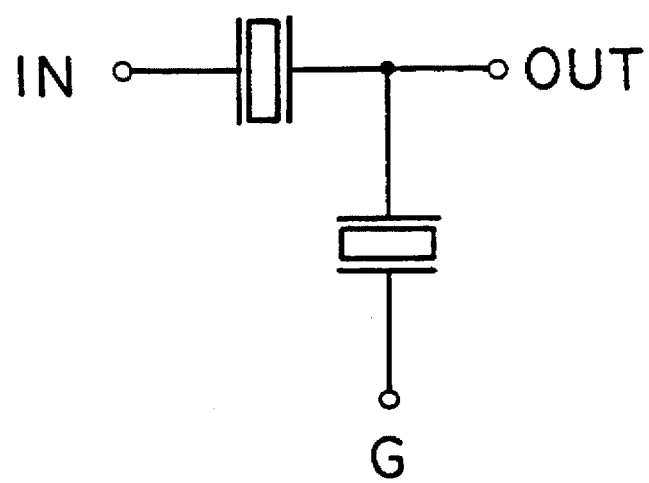
FIG. 40 illustrates a circuit structure of the ladder-type filter according to the preferred third embodiment.

The ladder-type filter 110 according to this preferred embodiment is completed by stacking the aforementioned respective members and forming external electrodes 110a, 110b and 110c on side surfaces of the laminate as formed, as shown in FIG. 39. Namely, it is possible to form a one-stage ladder-type filter as shown in FIG. 40, by connecting the external electrode 110a to a ground potential and utilizing the external electrode 110b and 110c as input and output ends, respectively.

When two or more resonance plates corresponding to each of the resonance plates 112 and 114 are stacked, it is possible to readily form a ladder-type filter having two or more stages.

Fourth Preferred Embodiment

Figure 41:
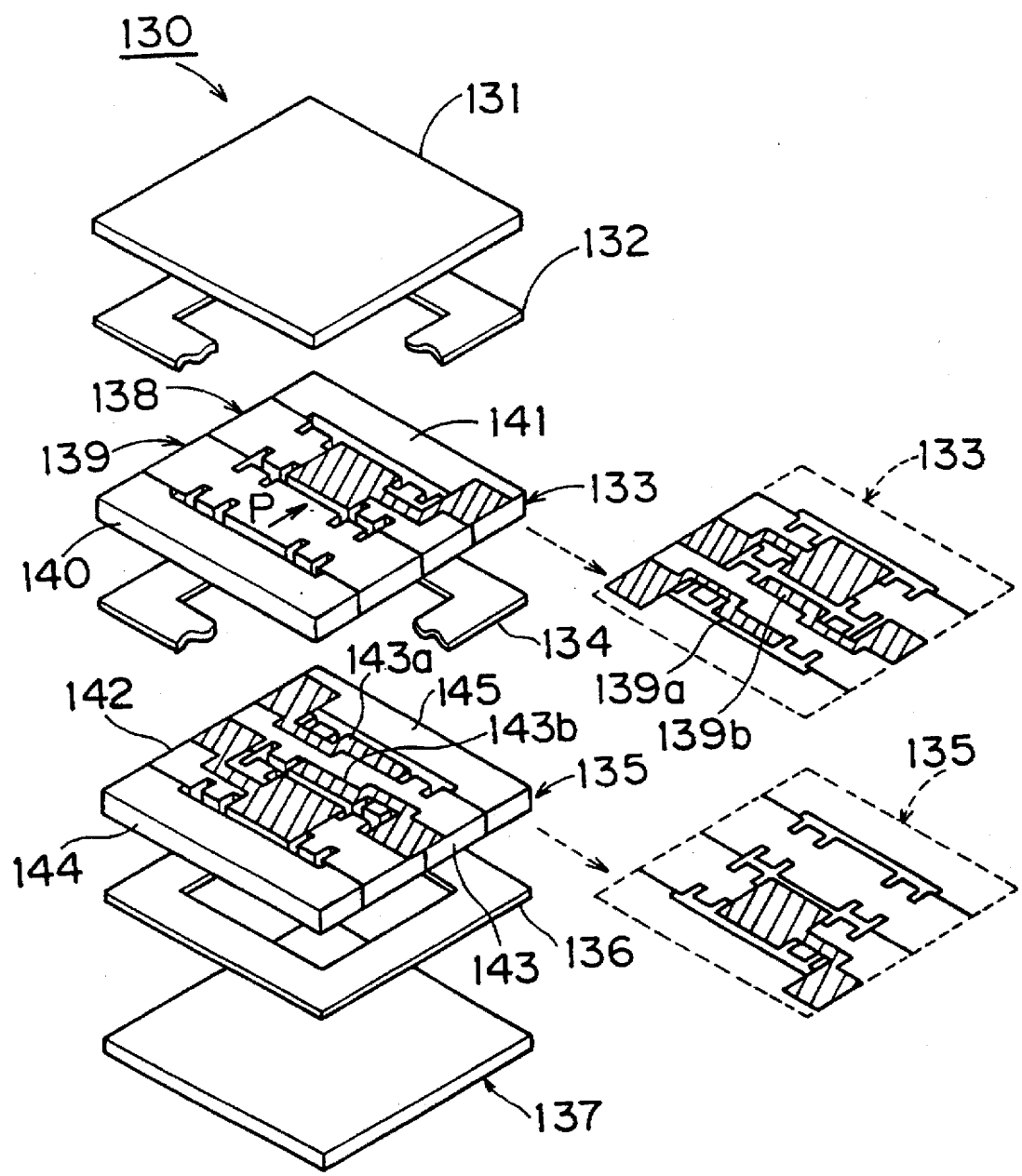
FIG. 41 is an exploded perspective view for illustrating a ladder-type filter according to a fourth preferred embodiment of the present invention.
Figure 42:
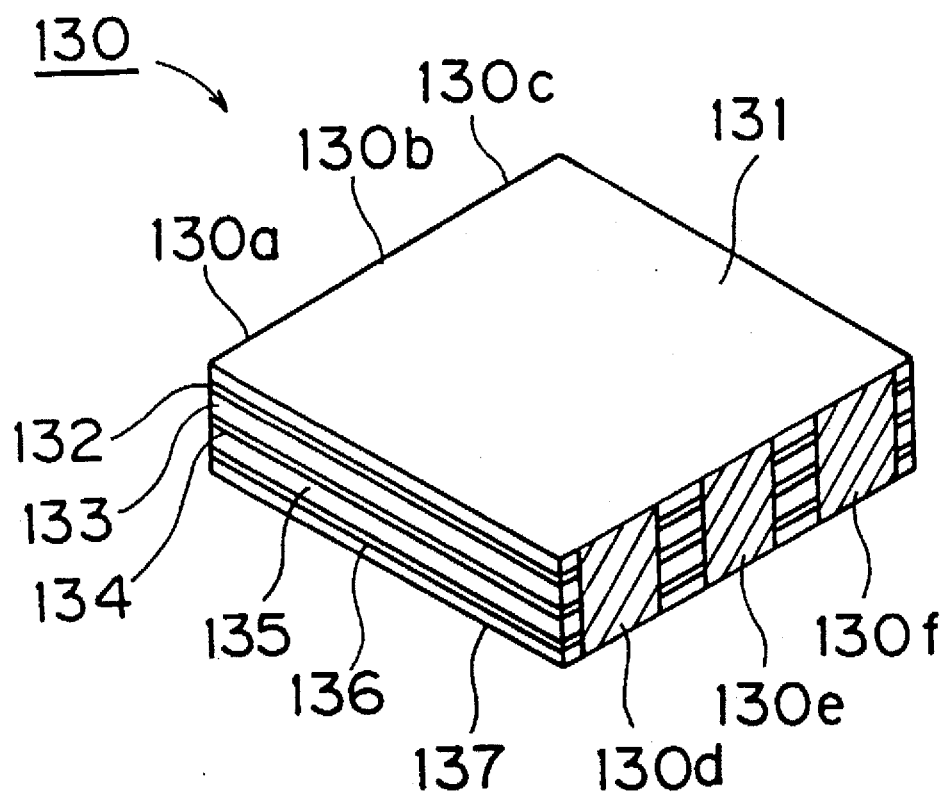
FIG. 42 is a perspective view showing the appearance of the ladder-type filter according to the fourth preferred embodiment.

FIG. 41 is an exploded perspective view for illustrating a ladder-type filter 130 according to a fourth preferred embodiment of the present invention, and FIG. 42 is a perspective view showing its appearance.

The ladder-type filter 130 is formed by stacking a case substrate 131, a cavity forming spacer 132, a first resonance plate 133, a cavity forming spacer 134, a second resonance plate 135, a cavity forming spacer 136 and a case substrate 137.

The case substrates 131 and 137 are made of flat plate type insulating ceramics or synthetic resin, while the cavity forming spacers 132, 134 and 136 are formed similarly to those employed in the second preferred embodiment.

The first resonance plate 133 is formed by integrating piezo-resonators 138 and 139 having dynamic dampers and utilizing a width expansion mode by bonding holding parts thereof with each other and pasting spacers 140 and 144 to outer sides of the integrated substance.

The piezo-resonator 138 is formed similarly to the piezo-resonator 28 having dynamic dampers and utilizing a width expansion mode employed in the first preferred embodiment. The piezo-resonator 139 having dynamic dampers and utilizing a width expansion mode with a longitudinal effect, is formed by providing resonance electrodes 139a and 139b on a pair of opposite ends on a lower surface of a resonance part in a piezoelectric ceramic plate having a planar shape which is similar to that of the piezo-resonator 138, as shown on a right side of FIG. 41. When an alternating voltage is applied across the resonance electrodes 139a and 139b, therefore, the piezo-resonator 130 operates as a width expansion mode resonator utilizing a piezoelectric longitudinal effect. The resonance electrodes 139a and 139b are drawn out to opposite edges of the resonance plate 133, respectively.

The second resonance plate 135 is formed by pasting holding parts of a piezo-resonator 142 having dynamic dampers and utilizing a width expansion mode and a piezo-resonator 143 having dynamic dampers and utilizing a longitudinal effect to each other, and further pasting spacers 144 and 145 on both sides thereof. In the second resonance plate 135, a pair of resonance electrodes 143a and 143b are formed on an upper surface of the piezo-resonator 143 having its dynamic dampers utilizing a longitudinal effect.

The ladder-type filter 130 according to this preferred embodiment is obtained by stacking the aforementioned respective members and forming external electrodes 130 to 130f on both end surfaces of the laminate as obtained, as shown in FIG. 42.

Figure 43:
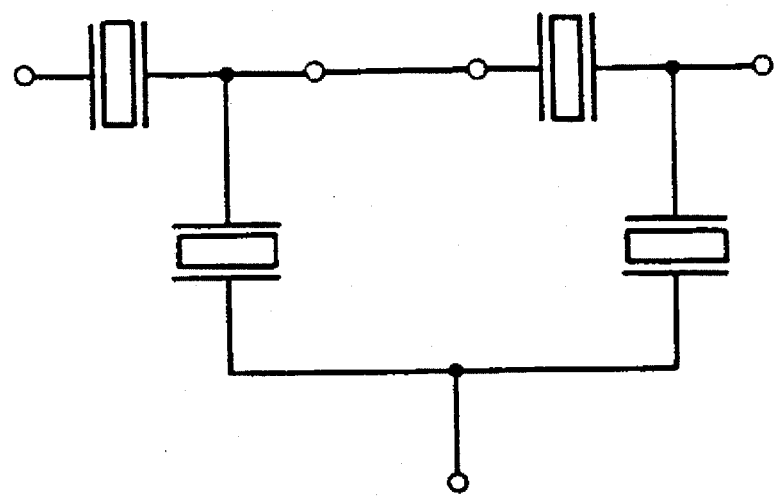
FIG. 43 illustrates a circuit structure of the ladder-type filter according to the fourth preferred embodiment.

Namely, a two-stage ladder-type filter shown in FIG. 43 is obtained by utilizing the external electrode 130c as an input end, connecting the external electrodes 130a and 130d in common for forming an output end, connecting the external electrodes 130e and 130f in common, and connecting the external electrode 130b to a ground potential.

Fifth Preferred Embodiment

Figure 44:
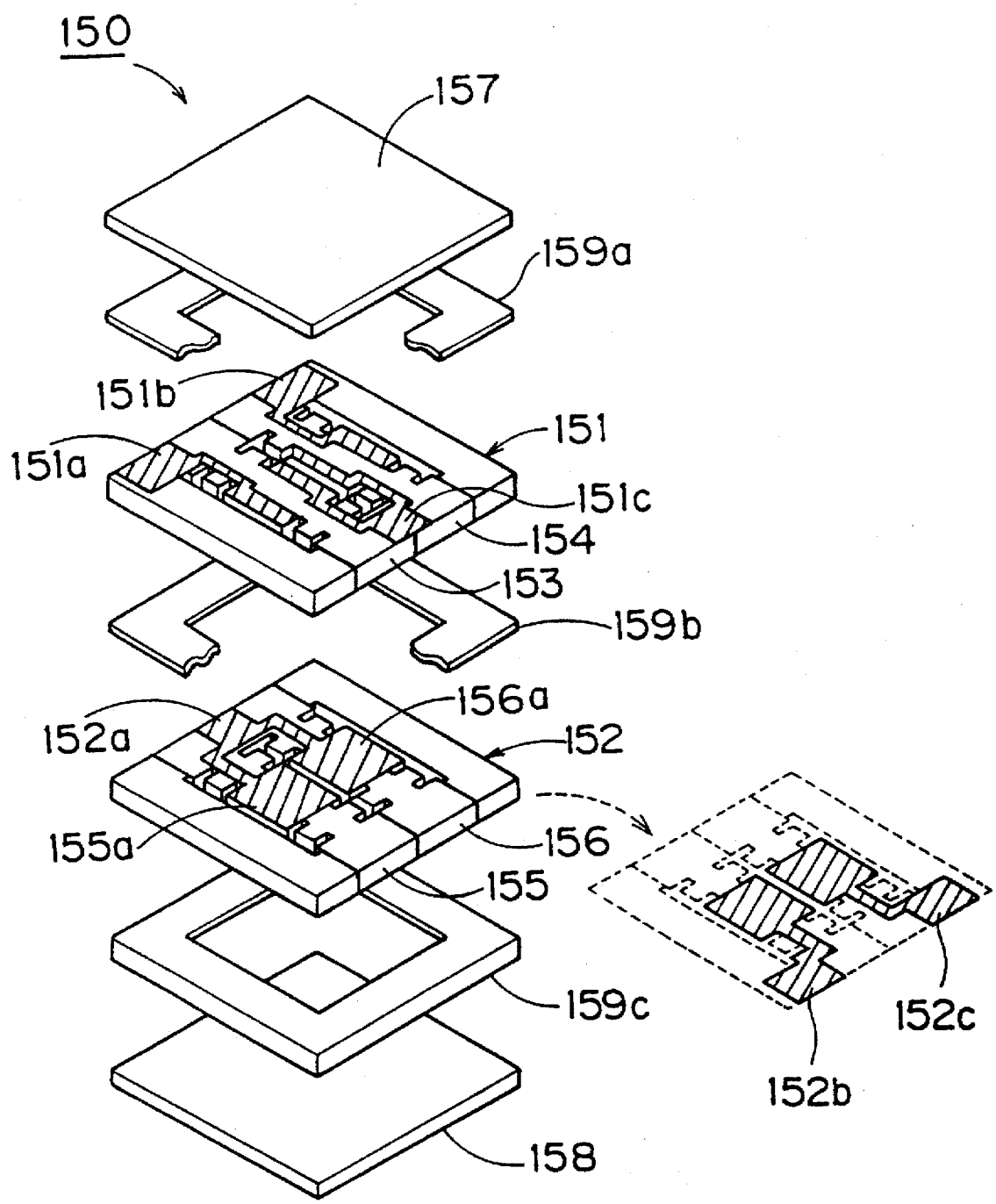
FIG. 44 is an exploded perspective view for illustrating a ladder-type filter according to a fifth preferred embodiment of the present invention.
Figure 45:
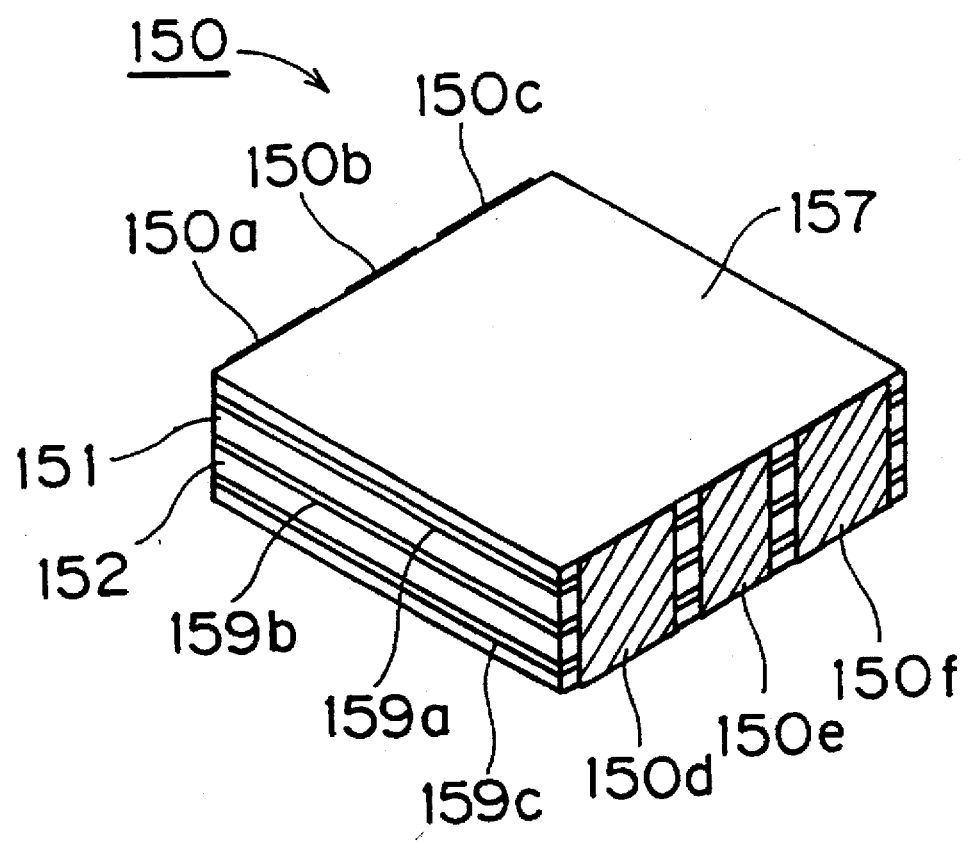
FIG. 45 is a perspective view showing the appearance of the ladder-type filter according to the fifth preferred embodiment.

FIG. 44 is an exploded perspective view showing a ladder-type filter 150 according to a fifth preferred embodiment of the present invention, and FIG. 45 is a perspective view showing its appearance.

This preferred embodiment corresponds to a modification of the ladder-type filter 130 according to the fourth preferred embodiment. Therefore, only portions different from those of the fourth preferred embodiment are described.

A first resonance plate 151 is formed by bonding holding parts of piezo-resonators 153 and 154 having dynamic dampers utilizing a piezoelectric longitudinal effect for integrating the same with each other. The piezo-resonators 153 and 154 are similar in structure to the piezo-resonator 143 employed in the fourth preferred embodiment.

On the other hand, a second resonance plate 152 is formed by bonding holding parts of width expansion mode piezo-resonators 155 and 156 having dynamic dampers utilizing a piezoelectric transverse effect for integrating the same with each other.

The piezo-resonators 155 and 156 are similar in structure to the piezo-resonator 138 employed in the fourth preferred embodiment.

In the first resonance plate 151, electrodes 151a and 151b are formed on its upper surface along one edge and these electrodes 151a and 151b are electrically connected to first resonance electrodes of the piezo-resonators 153 and 154, respectively- On the other hand, an electrode 151c is formed along another edge of the resonance plate 151, and this electrode 151c is electrically connected to second resonance electrodes of the piezo-resonators 153 and 154.

In the second resonance plate 152, an electrode 152a is formed along one edge to be electrically connected to resonance electrodes 155a and 156a of the piezo-resonators 155 and 156. On a lower surface of the resonance plate 152, on the other hand, electrodes 152 and 152c are formed along another edge to be electrically connected to resonance electrodes provided on lower surfaces of the piezo-resonators 155 and 156, respectively.

Numerals 157 and 158 denote case substrates, and numerals 159a to 159c denote cavity forming spacers.

The ladder-type filter 150 according to the fifth preferred embodiment is obtained by forming external electrodes 150a to 150f on a laminate which is obtained by stacking the aforementioned respective members with each other, as shown in FIG. 45.

It is possible to drive the ladder-type filter 150 as a two-stage type filter similarly to the fourth preferred embodiment, by connecting the external electrodes 150a to 150f thereto.

Sixth Preferred Embodiment

Figure 46:
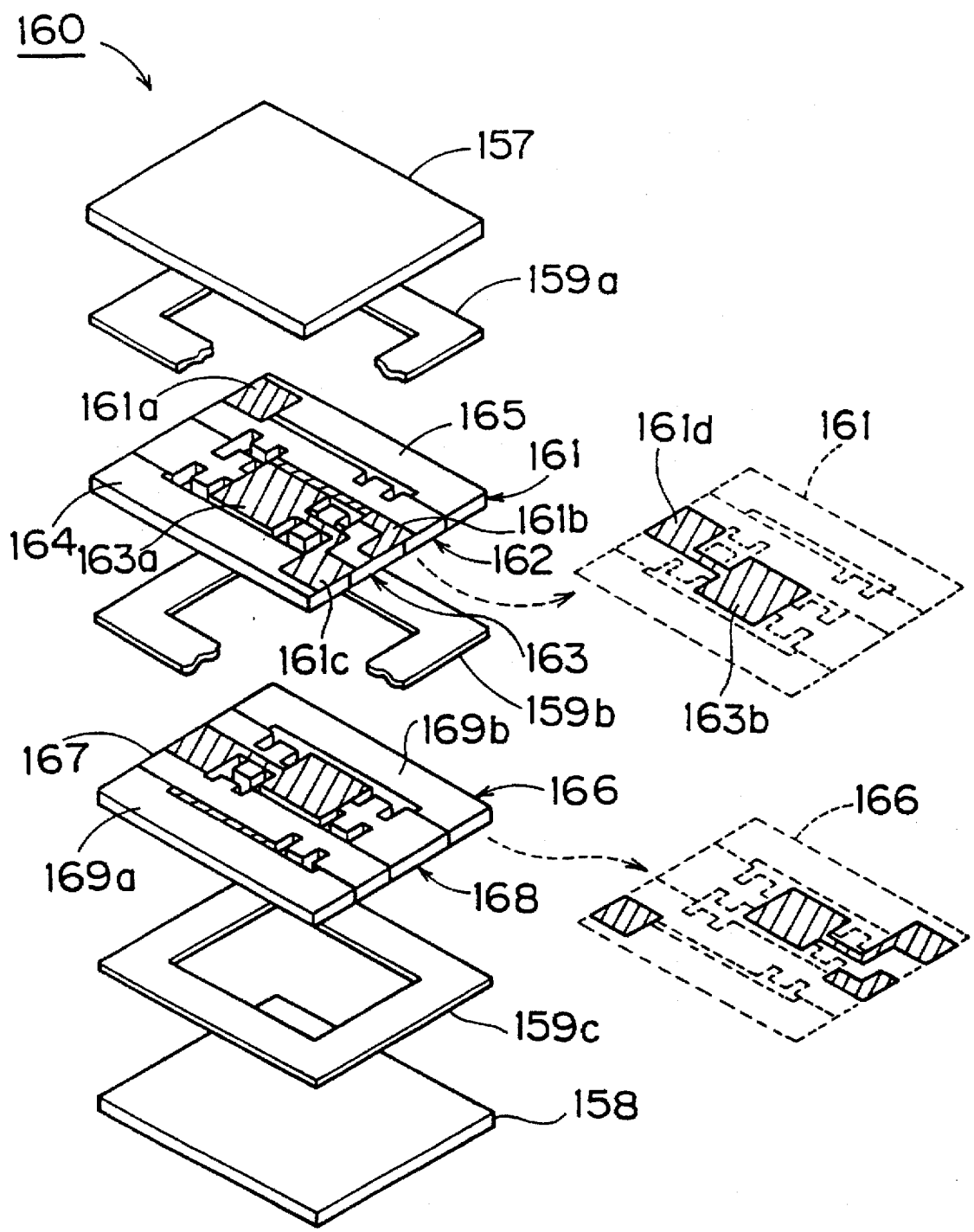
FIG. 46 is an exploded perspective view for illustrating a ladder-type filter according to a sixth preferred embodiment of the present invention.
Figure 47:
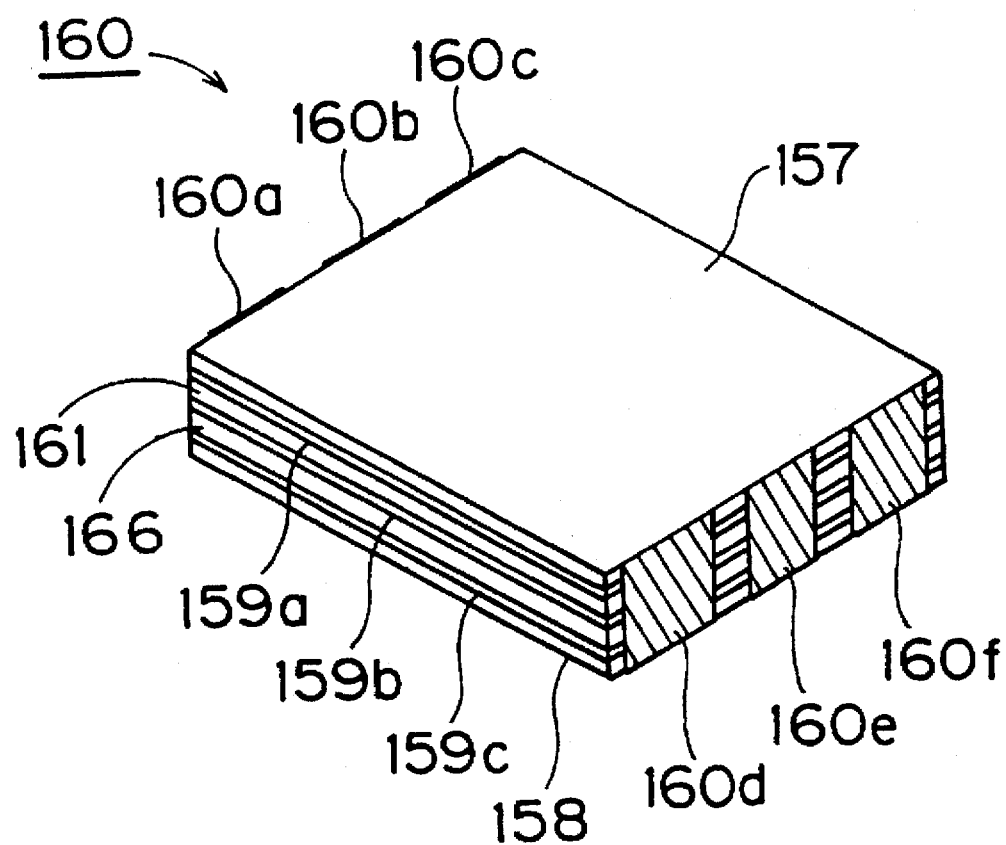
FIG. 47 is a perspective view showing the appearance of the ladder-type filter according to the sixth preferred embodiment.

FIG. 46 is an exploded perspective view for illustrating a ladder-type filter 160 according to a sixth preferred embodiment of the present invention, and FIG. 47 is a perspective view showing its appearance.

The ladder-type filter 160 according to this preferred embodiment is similar in structure to that according to the fourth embodiment, except that first and second resonance plates 161 and 166 are different in structure from those of the fourth preferred embodiment.

Referring to FIG. 46, holding parts of a piezo-resonator 162 having dynamic dampers utilizing a shear mode and a piezo-resonator 163 having dynamic dampers and utilizing a width expansion mode are bonded with each other in the first resonance plate 161, to be integrated with each other. Spacers 164 and 165 are pasted to outer sides of the piezo-resonators 162 and 163, respectively.

The piezo-resonator 162 is similar in structure to the piezo-resonator 26 (see FIG. 17A) utilizing the shear mode, which is employed in the first preferred embodiment. A resonance electrode which is formed on one side surface of the piezo-resonator 162 is electrically connected to an electrode 161a which is formed along one edge of the resonance plate 161. On the other hand, a resonance electrode which is formed on another side surface is electrically connected to an electrode 161b which is formed along another edge of the resonance plate 161.

The piezo-resonator 163 having dynamic dampers and utilizing a width expansion mode is similar in structure to the piezo-resonator 138 employed in the fourth preferred embodiment. A resonance electrode 163a provided on an upper surface of this piezo-resonator 163 is electrically connected to an electrode 161c, which is formed along the same edge as the electrode 161b.

As shown in broken lines on the right side of FIG. 46, on the other hand, a resonance electrode 163b which is formed on a lower surface of the piezo-resonator 163 is electrically connected to an electrode 161d which is formed along one edge of the resonance plate 161 on its lower surface side.

The second resonance plate 166 has a structure corresponding to that obtained by inverting the first resonance plate 161. Holding parts of a piezo-resonator 167 having dynamic dampers utilizing a shear mode and a piezo-resonator 168 having dynamic dampers and utilizing a width expansion mode are bonded to each other to be integrated with each other, and spacers 169a and 169b are pasted to outer sides of the laminate as obtained.

Since this structure corresponds to that obtained by inverting the first resonance plate 161, electrodes provided on its both major surfaces are vertically inverted as compared with those of the first resonance plate 161.

The ladder-type filter 160 shown in FIG. 47 is obtained by stacking the aforementioned respective members and forming terminal electrodes 160a to 160f on the laminate as obtained. Also in this preferred embodiment, it is possible to drive the ladder-type filter 160 as a two-stage type filter by utilizing the external electrode 160c as an input end, connecting the external electrode 160b to a ground potential and connecting the external electrodes 160e and 160f in common.

Seventh Preferred Embodiment

Figure 48:
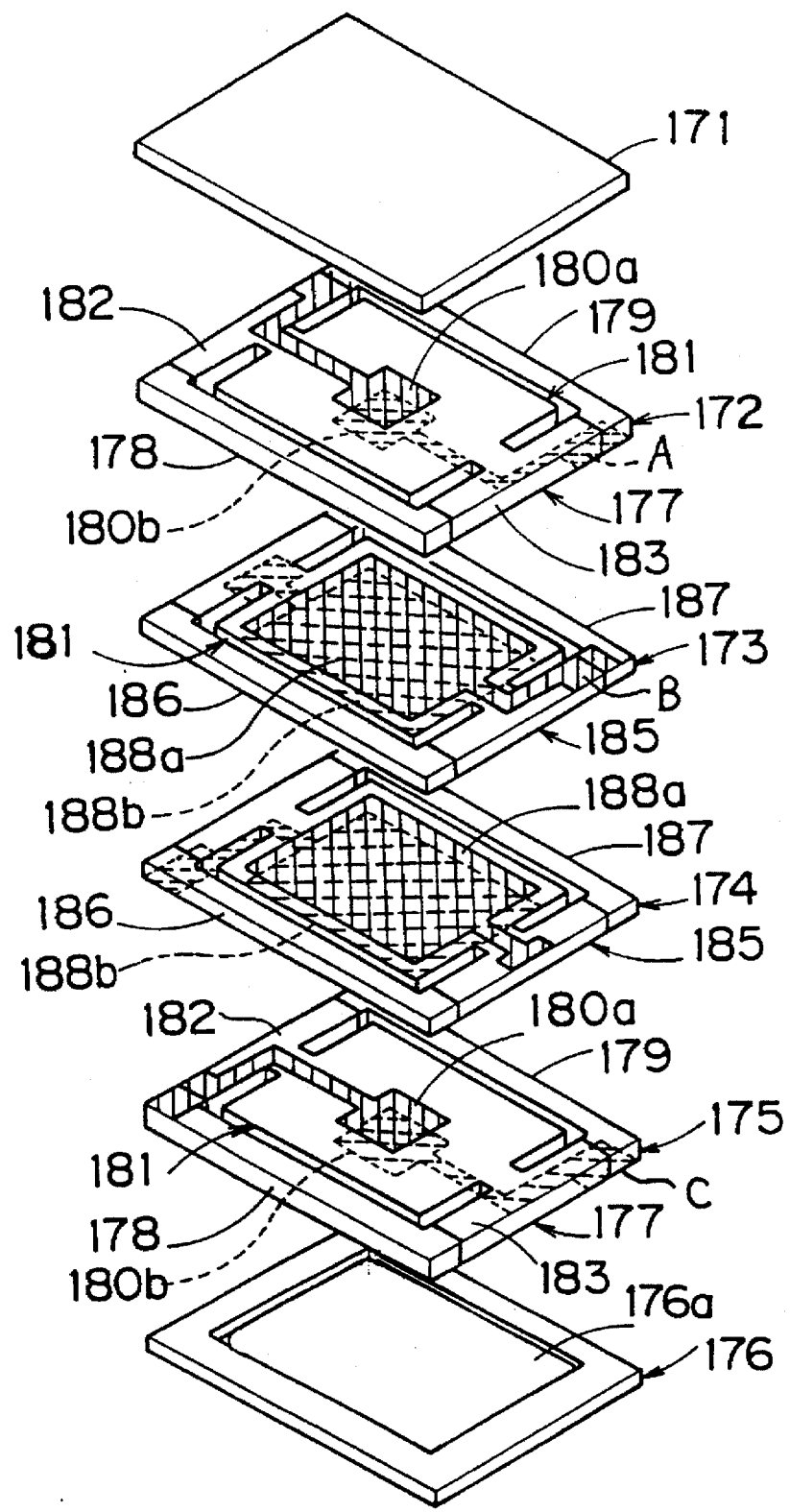
FIG. 48 is an exploded view for illustrating a ladder-type filter according to a seventh preferred embodiment of the present invention.
Figure 49:
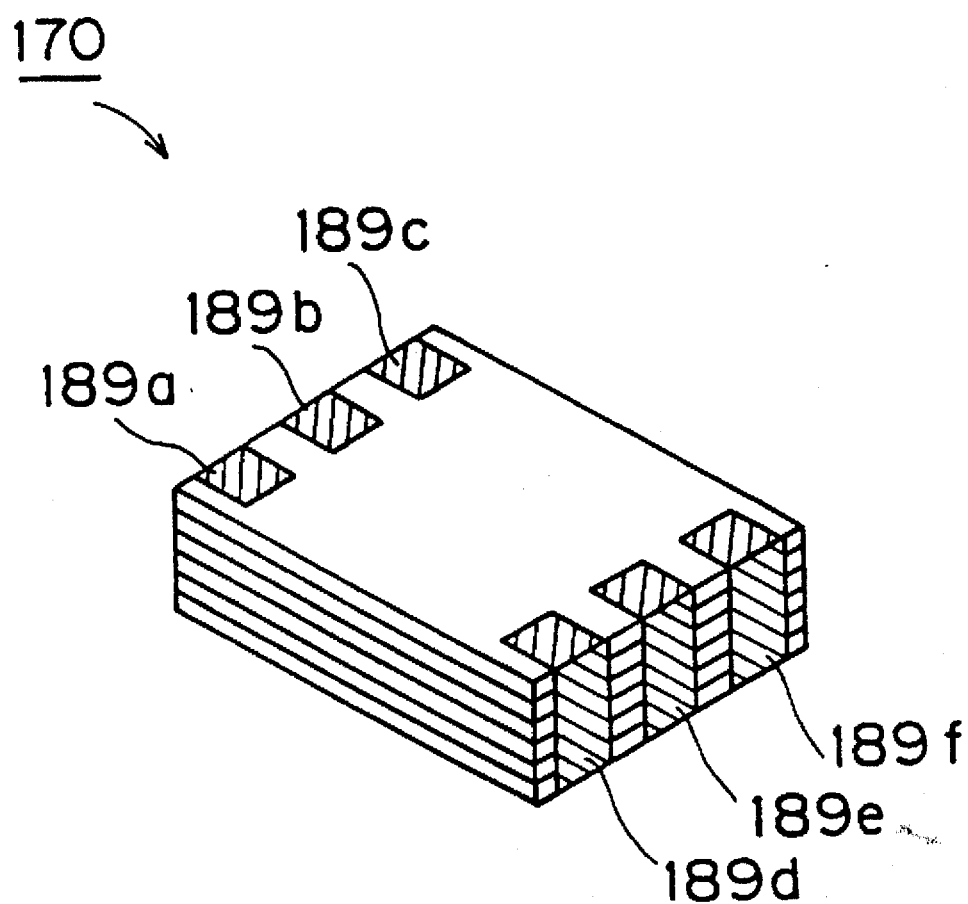
FIG. 49 is a perspective view showing the appearance of the ladder-type filter according to the seventh preferred embodiment.

FIG. 48 is an exploded perspective view showing a ladder-type filter 170 according to a seventh preferred embodiment of the present invention, and FIG. 49 is a perspective view showing its appearance.

According to this preferred embodiment, a first case substrate 171, resonance plates 172 to 175 and a case substrate 176 are stacked with each other.

The case substrates 171 and 176 and the resonance plates 172 to 175 are adhered to each other by applying an adhesive in the region of the rectangle from a location on one or both surfaces of these members to form a space for preventing suppression of vibration of the resonators.

The resonance plate 172 is formed by bonding first and second spacer plates 178 and 179 to side portions of a first type energy trap piezo-resonator 177. The piezo-resonator 177 is formed by coupling holding parts 182 and 183 to a rectangular plate type piezoelectric vibrating part 181 through support parts. In the piezoelectric vibrating part 181, first and second resonance electrodes 180a and 180b are formed on its upper and lower surfaces, respectively. Also in this preferred embodiment, a ratio b/a is set to be in a range of ±10% from a value satisfying the equation (1) in the upper surface of the piezoelectric vibrating part 181, assuming that a and b represent lengths of shorter and longer sides, respectively. Thus, vibrational energy is effectively trapped in the piezoelectric vibrating part 181.

The resonance plate 175 is substantially similar in structure to the resonance plate 172. However, the former is different from the latter in positions of lead electrodes which are formed on holding parts 182 and 183 to be electrically connected to resonance electrodes 180a and 180b.

In the resonance plates 172 and 175, the first and second resonance electrodes 180a and 180b are formed in areas considerably smaller than those of major surfaces of the piezoelectric vibrating part 181. Therefore, capacitances between the electrodes 180a and 180b are made relatively small.

In the resonance plate 173, on the other hand, a first type of energy trap piezo-resonator 185 utilizing a width expansion mode is employed and first and second spacer plates 186 and 187 are bonded to side portions of the piezo-resonator 185. The piezo-resonator 185 is similar in structure to the piezo-resonator 177, except for the resonance electrodes. Therefore, identical portions are denoted by the same reference numerals, to omit redundant description. In the piezo-resonator 185, first and second resonance electrodes 188a and 188b are formed on upper and lower surfaces of a piezoelectric vibrating part 181 to have considerably large areas but not to reach outer peripheral edges. Therefore, a capacitance between the resonance electrodes 188a and 188b is considerably larger than that between the resonance electrodes 180a and 180b of the piezo-resonator 177.

The piezo-resonator 185 is also provided with the piezoelectric vibrating part 181 for forming a first type energy trap piezo-resonator, whereby vibrational energy is effectively trapped in the piezoelectric vibrating part 181.

The ladder-type filter 170 according to this embodiment is obtained by stacking the case substrates 171 and 176 and the resonance plates 172 to 175 and forming prescribed external electrodes.

As shown in FIG. 49, external electrodes 189a to 189c, as well as, 189d to 189f are formed on side surfaces of the laminate forming the ladder-type filter 170. It is possible to form the ladder-type filter 170 as a two-stage type filter by employing the external electrode 189a as an output end, connecting the external electrodes 189b and 189e to ground potentials, and employing the external electrode 189c as an input end. In this case, the piezo-resonators 177 form series resonators, and the piezo-resonators 185 having relatively large capacitances form parallel resonators. In addition, although the electrode 189d has a function connecting terminal electrodes A to C, the external electrodes 189d and 189f, which are dummy external electrodes, are not employed for electrodes for connecting to outer circuits in driving the ladder-type filter 170.

Eighth Preferred Embodiment

Figure 50:
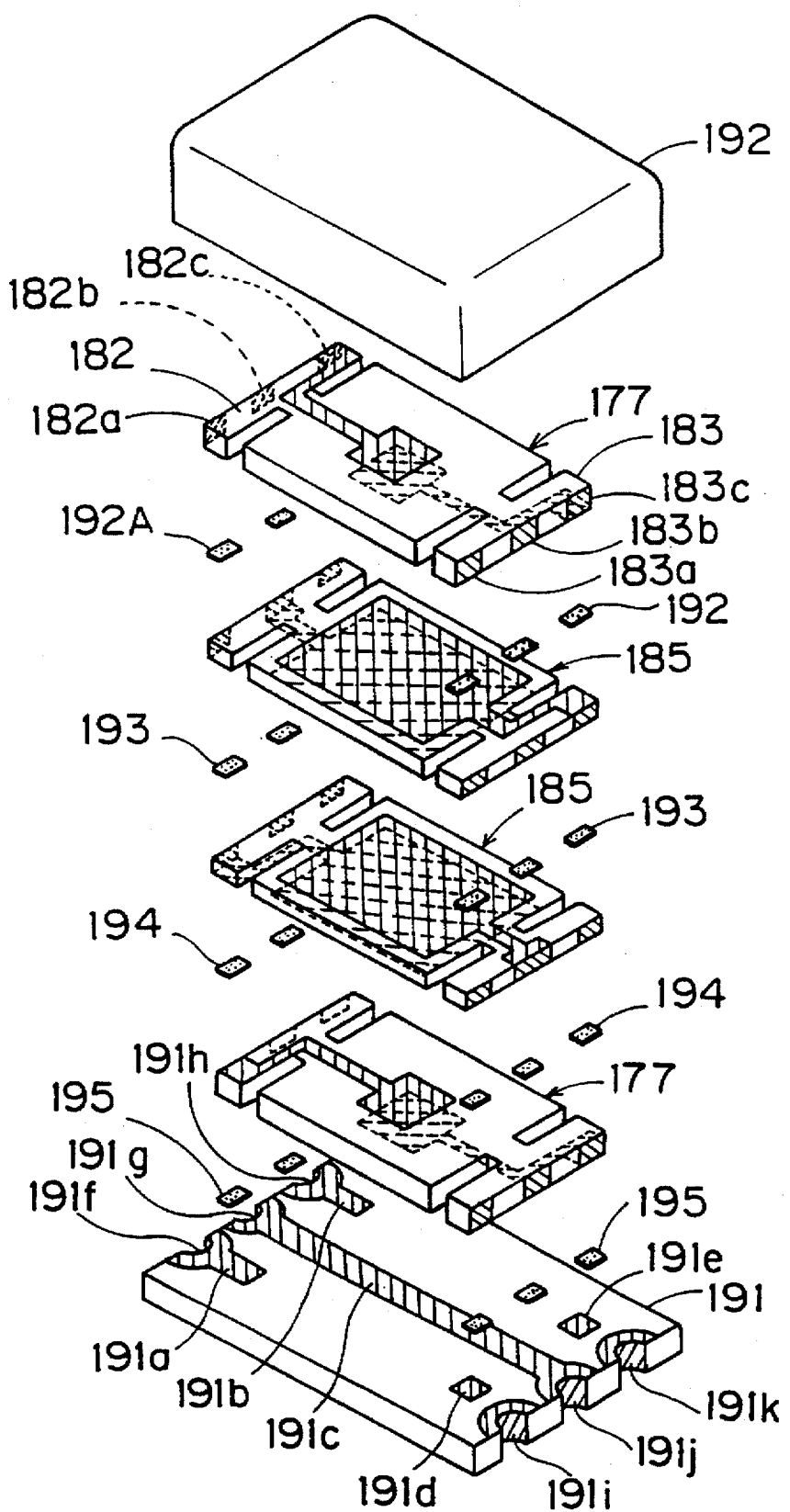
FIG. 50 is an exploded perspective view for illustrating a ladder-type filter according to an eighth preferred embodiment.

FIG. 50 is an exploded perspective for illustrating a ladder-type filter according to a eighth preferred embodiment of the present invention. In the ladder-type filter according to this preferred embodiment, a plurality of piezo-resonators are stacked in a space which is defined by a base substrate 191 and a cap member 192. The base substrate 191 is made of a proper insulating material such as insulating ceramics, i.e., alumina or synthetic resin. Connecting conductive parts 191a to 191e are formed on the base substrate 191 in a dispersed manner. These connecting conductive parts 191a to 191e are electrically connected to lead electrodes of the piezo-resonators as described later, or external electrodes 191f to 191h and 191j which are formed on side surfaces of the base substrate 191.

The cap member 192 is made of a suitable material such as synthetic resin or a metal, and has an opening in its lower portion. The opening of the cap member 192 is made smaller than the area of an upper surface of the base substrate 191, so that the lower end surface of the cap member 192 is bonded to the upper surface of the base substrate 191 by an insulating adhesive or the like. Thus, the cap member 192 is integrated with the base substrate 191. Alternatively, the opening of the cap member 192 may be formed to have a size such that the opening is in contact with the side surfaces of the base substrate 191.

According to this preferred embodiment, pairs of piezo-resonators 177 and 185 corresponding to those employed in the seventh preferred embodiment are employed and stacked as shown in FIG. 50. Conductive adhesives or the like 192A to 195 are employed to define spaces (not shown) for allowing vibration of the vertically arranged piezo-resonators 177 and 185 between the piezo-resonators 177 and the base substrate 191. Namely, the conductive adhesives 192A to 195, which are typically shown in FIG. 50, are applied FIG. 50, are applied to the piezo-resonators 177 and 185 in stacking. For example, the conductive adhesives 192A, which are adapted to bond the upper piezo-resonators 177 and 185 with each other, are interposed to have prescribed thicknesses between holding parts of these piezo-resonators 177 and 185. Thus, a space of a prescribed thickness is defined between the upper piezo-resonators 177 and 185, to allow vibration of piezoelectric vibrating parts of these piezo-resonators 177 and 185. Further, the conductive adhesives 192 are arranged to reach outer peripheral edges of holding parts 182 and 183 of the upper piezo-resonator 177 to be electrically connected to electrodes 182a to 182c and 183a to 183c which are provided on side surfaces of the holding parts 182 and 183, as shown in FIG. 50. The remaining conductive adhesives 193 to 195 are also formed to have prescribed thicknesses, to define spaces for allowing vibration of piezoelectric vibrating parts of the piezo-resonators positioned above or under the same.

Further, the conductive adhesives 193 to 195 are also arranged to be electrically connected to electrodes provided on side surfaces of the piezo-resonators, the connecting conductive parts 191a to 191e provided on the base substrate 191, or the external electrodes 191f to 191k which are provided on the side surfaces of the base substrate 191.

Also in this preferred embodiment, the pairs of first type energy-trap piezo-resonators 177 and 185 are stacked to form a two-stage ladder-type filter, as described above. Further, the plurality of piezo-resonators 177 and 185 are enclosed in a space defined by connecting the base substrate 191 and the cap member 192 with each other, whereby a ladder-type filter which is excellent in moisture resistance can be easily constructed.

Ninth Preferred Embodiment

Figure 51:
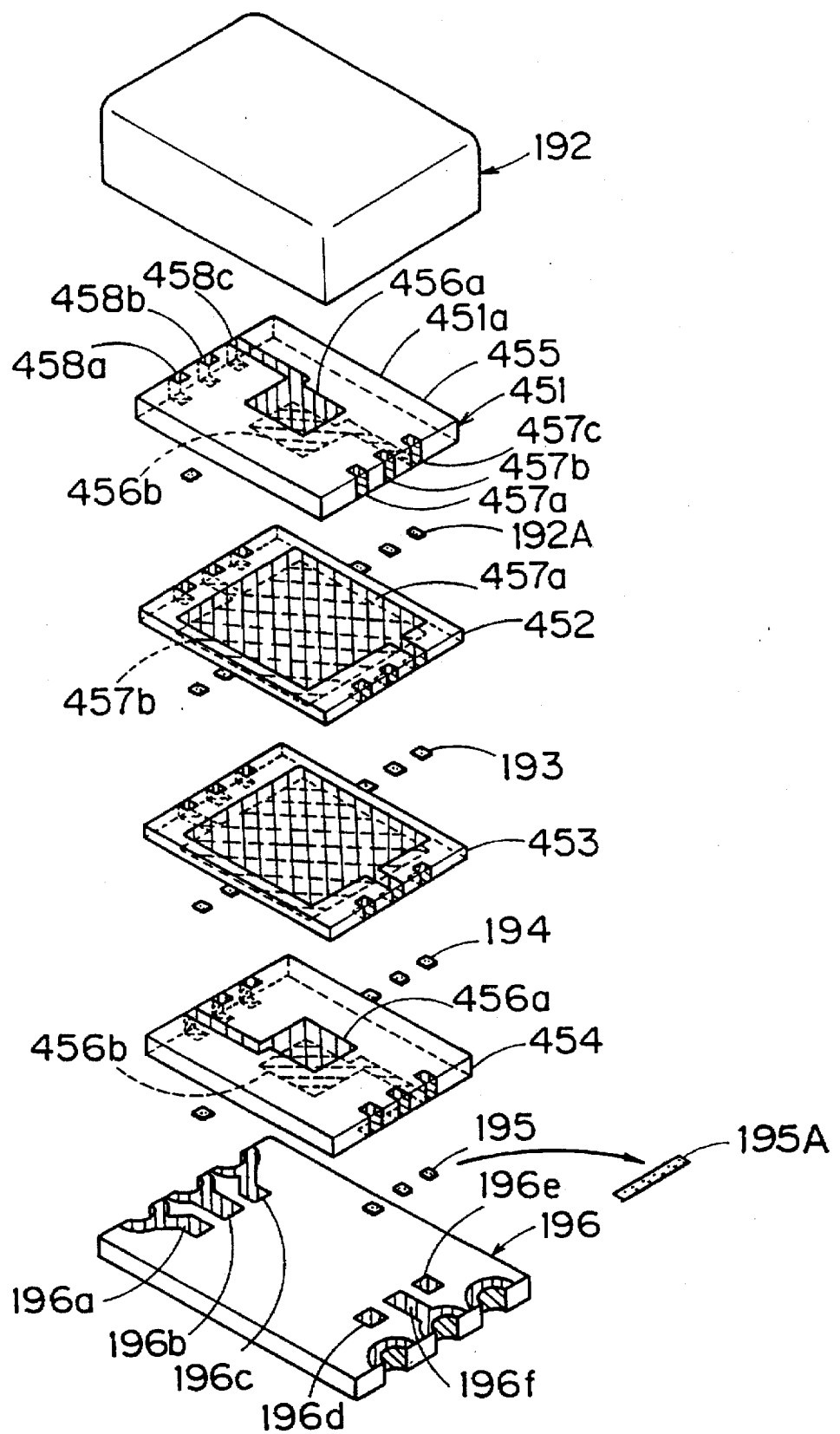
FIG. 51 is an exploded perspective for illustrating a ladder-type filter according to the ninth preferred embodiment of the present invention.

FIG. 51 is an exploded perspective view showing a ladder-type filter according to a ninth preferred embodiment of the present invention.

The ladder-type filter according to the ninth preferred embodiment corresponds to a modification of that according to the eighth preferred embodiment.

Also in this preferred embodiment, a chip-like ladder-type filter is formed by a base substrate 196, which is similar in structure to the base substrate 191 except for shapes of connecting conductive parts provided on its upper surface, and a cap member 192.

The base substrate 196 is provided thereon with connecting conductive parts 196a to 196f, which are arranged to be electrically connected with external electrodes provided on side surfaces of the base substrate 196, or a piezo-resonator which is arranged above the same.

According to this preferred embodiment, a plurality of plate type piezo-resonators 451 to 454 are stacked with each other. Similarly to the eighth preferred embodiment, conductive adhesives or the like 192A to 195 are employed for bonding the piezo-resonator 454 with the base substrate 196. The conductive adhesives 192 to 195 are illustrated in floating states also in FIG. 51, while these are applied to upper or lower surfaces of the piezo-resonators 451 to 454 or a lower surface of the base substrate 196 to have prescribed thicknesses in practice, similarly to the eight preferred embodiment. In addition, if anisotropically conductive adhesive is used in lieu of adhesives 192A to 195, the adhesives do not have to be divided as shown in a side portion of FIG. 51, wherein one adhesive 195A is shown. Such an anisotropically conductive adhesive may be used in the eighth preferred embodiment.

The feature of this preferred embodiment resides in that each of the piezo-resonators 451 to 454 is formed by only a piezoelectric vibrating part of the aforementioned first type energy trap piezo-resonator, i.e., a piezo-resonator utilizing a width expansion mode. The piezo-resonator 451 is formed by a rectangular piezoelectric ceramic plate 455 which is polarized along its thickness. An upper surface 451a of the piezoelectric ceramic plate 455 has a rectangular shape, which is so decided that a ratio b/a is in a range of ±10% form a value satisfying the above equation (1) assuming that a and b represent lengths of shorter and long sides thereof respectively and σ represents the Poisson's ratio of the material forming the piezoelectric ceramic plate 455. Further, first and second resonance electrodes 456a and 456b are formed on upper and lower surfaces of the piezoelectric ceramic plate 455 in areas considerably smaller than those of the major surfaces, similarly to the piezo-resonators 177.

When an alternating voltage is applied across the first and second resonance electrodes 456a and 456b, the piezo-resonator 451 vibrates in a width expansion mode by a piezoelectric transverse effect. In this case, nodal points of the vibration are located at centers of shorter side surfaces of the piezoelectric ceramic plate 455. According to this preferred embodiment, therefore, lead electrodes 457a to 457c and 458a to 458c are formed on central regions of the shorter side surfaces, for bonding the piezo-resonator 451.

The piezo-resonator 454 is substantially similar in structure to the piezo-resonator 451. The former is different from the latter merely in directions of drawing out first and second resonance electrodes 456a nd 456b which are formed on upper and lower surfaces thereof.

The piezo-resonator 452 is also similar in structure to the piezo-resonator 451, except that first and second resonance electrodes 457a and 457b are formed to have considerably larger dimensions as compared with the resonance electrodes 456a and 456b. Further, the piezo-resonator 453 is similar in structure to the piezo-resonator 452, except that electrodes are drawn out in different directions.

When an alternating voltage is applied across first and second resonance electrodes provided on both major surfaces, therefore, vibration of a width expansion mode is excited also in each of the piezo-resonators 452 to 454.

Resonance energy based on this vibration is effectively trapped in each of the piezo-resonators 452 to 454.

The piezo-resonators 451 to 454 have nodal points of vibration which are present in central regions of shorter side surfaces, respectively, as described above, whereby it is possible to stack and fix the piezo-resonators 451 to 454 with and to each other with substantially no influence exerted on resonance characteristics, by bonding the same in portions provided with lead electrodes 457a to 457c and 458a to 458c through the conductive adhesives or the like 192A to 195 as described above.

Also in this preferred embodiment, it is possible to form a two-stage ladder-type filter, similarly to the ladder-type filters according to the seventh and eighth preferred embodiments.

According to this preferred embodiment, further, the piezo-resonators 451 to 454 are formed by only piezoelectric vibrating parts of first type piezo-resonators, whereby these piezo-resonators 451 to 454 can be extremely readily manufactured, with improvement in mechanical strength.

While the piezo-resonators 451 to 454 are described as being formed only by piezoelectric vibrating parts of first type energy trap piezo-resonators in the ninth preferred embodiment, it is also possible to form a ladder-type filter similarly to this embodiment by employing only piezoelectric vibrating parts of second type energy piezo-resonators. Namely, the piezo-resonators 451 to 454 may be replaced by those employing only piezoelectric vibrating parts of the aforementioned second type energy trap piezo-resonators.

While the first to sixth preferred embodiments have been described with reference to ladder-type filters employing piezo-resonators having dynamic dampers, the piezo-resonators provided in the first and third to sixth preferred embodiments may not be provided with dynamic dampers.

<Third Type Energy Trap Piezo-Resonator>

A third type piezo-resonator employed in the preferred embodiments of the present invention is a piezo-resonator utilizing a new vibration mode which has been discovered by the inventor. The newly discovered vibration mode is now described with reference to FIGS. 52 to 56.

Figure 52:
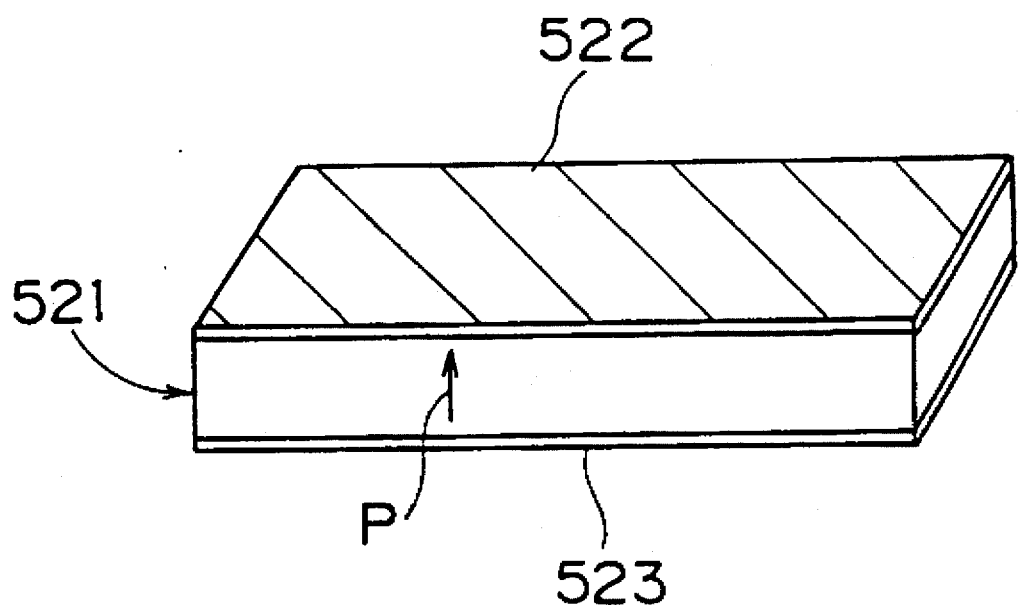
FIG. 52 is a perspective view showing a piezoelectric plate as a model for illustrating a third type piezo-resonator.

Consider a model comprising a rectangular piezoelectric plate 521 and electrodes 522 and 523 which are formed entirely over the major surfaces thereof, as shown in FIG. 52. The piezoelectric plate 521 has a rectangular planar shape provided with rectangular upper and lower surfaces. Further, the piezoelectric plate 521 is uniformly polarized along its thickness, i.e., along arrow P.

Figure 53:
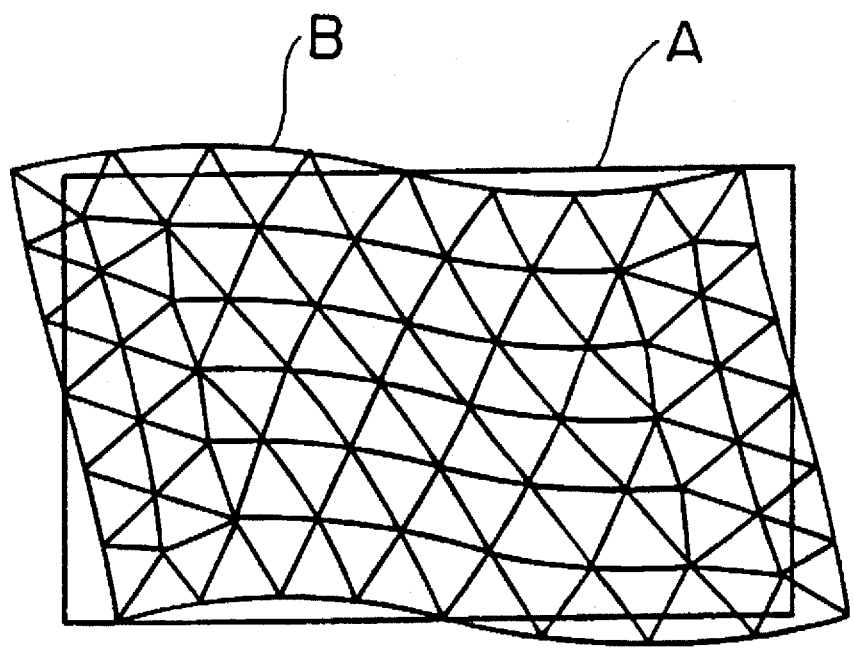
FIG. 53 is typical plan view showing a displaced state of the piezoelectric plate appearing in FIG. 52 which is analyzed by a finite element method.

It has been recognized that a vibration mode shown in FIG. 53 is excited in a certain range of the planar shape of the piezoelectric plate 521 by analyzing secondary harmonics of bending vibration on the upper and lower surface of the plate 521 by a finite element method in a case of applying an alternating voltage across the electrodes 522 and 523 thereby making the piezoelectric plate 521 vibrate. Referring to FIG. 53 showing the vibration mode which was analyzed by the finite element method, the original shape of the piezoelectric plate 521 is shown by lines A, and vibration is repeated between a displaced state shown by lines B and a state opposite to that shown by the lines B.

Figure 54:
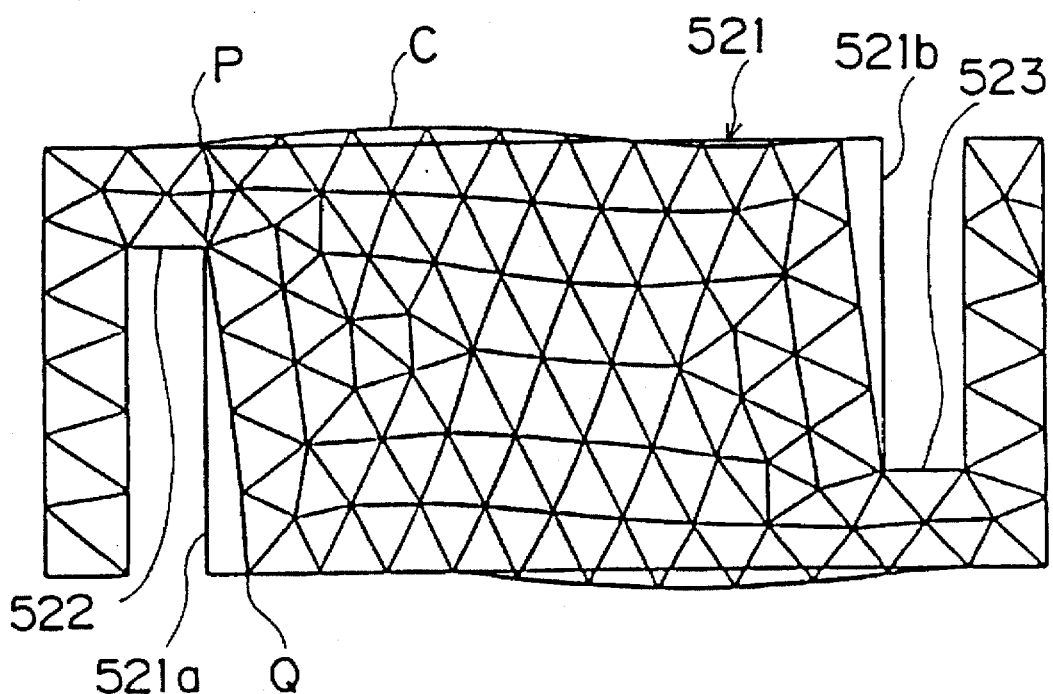
FIG. 54 is a typical sectional view showing a displaced state of the piezoelectric plate appearing in FIG. 52, which is coupled with support parts and holding parts, analyzed by a finite element method.

It has been confirmed that vibrational energy is trapped as shown in FIG. 54 when the piezoelectric plate 521 excited in the aforementioned bending mode vibration of secondary harmonics is held on single ends of a pair of side surfaces along a pair of shorter edges. Referring to FIG. 54 showing displacement distribution analyzed by a finite element method, a coupling part 522 is coupled to a side surface 521a on a shorter side of the piezoelectric plate 521. Another coupling part 523 is coupled to an end of another side surface 521b along another shorter side. In this case, the coupling parts 522 and 523 are coupled to both ends of a diagonal line on an upper surface of the piezoelectric plate 521.

As clearly understood from FIG. 54, no displacement is propagated to portions outward beyond the coupling parts 522 and 523 in a displaced stated C when the coupling parts 522 and 523 are coupled to hold the piezoelectric plate 521 by these parts 522 and 523. In other words, it is understood that it is possible to trap bending mode vibration of secondary harmonics of the piezoelectric plate 521 in a resonance portion between the coupling parts 522 and 523.

Figure 55:
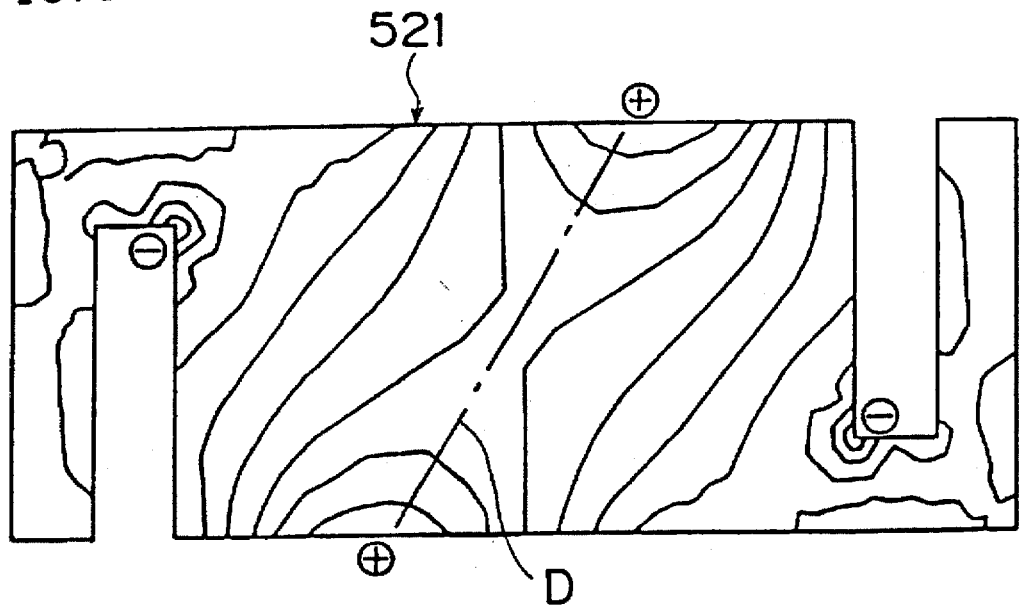
FIG. 55 is a plan view showing charge distribution in the displaced state shown in FIG. 54.

FIG. 55 shows charge distribution in the displaced state C shown in FIG. 54. A region of positive polarity extends on the upper surface of the piezoelectric plate 521 in a direction along a phantom line D, which extends substantially along one diagonal line. Further, portions having strong negative polarity potentials appear in portions close to corners of the other diagonal line.

In order to strongly excite vibration between the displaced state C shown in FIG. 54 and a state reverse thereto by coupling the aforementioned coupling parts 522 and 523, therefore, resonance electrodes may conceivably be formed in response to the charge distribution shown in FIG. 55.

When the coupling parts 522 and 523 are coupled to the rectangular piezoelectric plate 521 and a voltage is applied across electrodes provided on both surfaces, bending mode vibration of secondary harmonics is strongly excited and energy of this vibration is trapped in the vibrating portion between the coupling parts 522 and 523. It has been recognized that such an effect is attained only when the dimensions of the piezoelectric plate 521 are in specific preferred ranges.

The inventor has employed samples of the piezoelectric plate 521 having various dimensions to excite vibration repeated between the displaced state C shown in FIG. 54 and a state reverse thereto in each sample, whereby it has been recognized that such vibration is strongly excited and vibrational energy is effectively trapped in the portion up to the first and second coupling parts 522 and 523 when the ratio b/a is at a value satisfying the above equation (3) assuming that a and b represent lengths of shorter and longer sides of the rectangular surface of the piezoelectric plate 521, respectively, and $\sigma$ represents the Poisson's ratio of the material forming the piezoelectric plate 521. Namely, the inventor has prepared samples from various piezoelectric materials at various ratios b/a, to analyze displaced states by the finite element method, as shown in FIG. 54. As the result, it has been confirmed that the ratio b/a and the Poisson's ratio $\sigma$ of the material forming the piezoelectric plate 521 may satisfy the relation shown in FIG. 56A, in order to effectively trap the aforementioned bending mode vibration of secondary harmonics within the portion between the coupling parts 522 and 523. From the result shown in FIG. 56A, it is understood that the lengths a and b of the shorter and longer sides may be selected so that the ratio b/a is as follows:

$$b/a = 0.3\sigma + 1.48$$

Further, the inventor has discovered that vibrational energy is trapped similarly to the above also when the ratio b/a is an integral number n times the value $(0.3\sigma + 1.48)$.

Figure 56A:
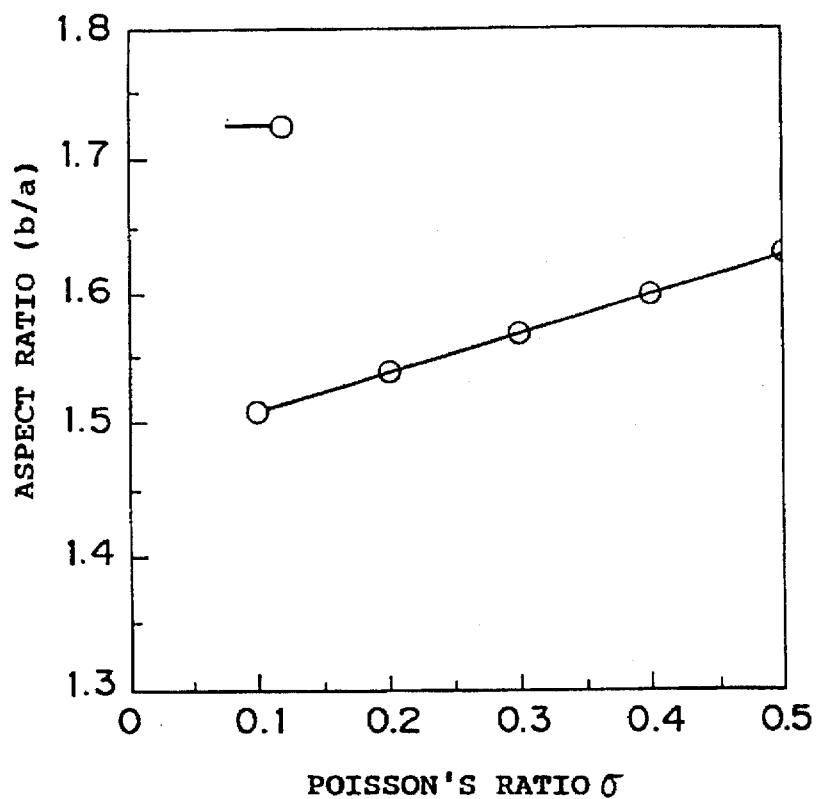
FIG. 56A and 56B respectively illustrate relation between the Poisson's ratios and the ratios b/a, and relation between integers n and the amount of relative displacement.
Figure 56B:
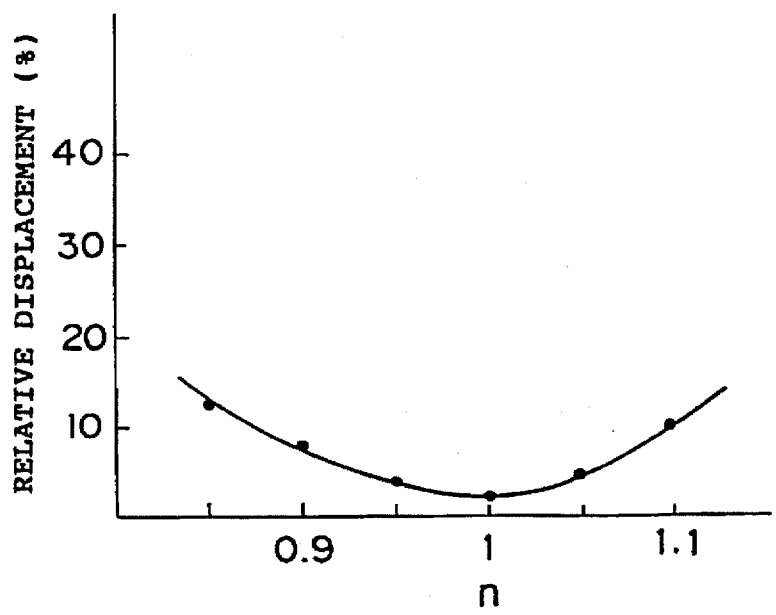

The inventor has further employed a piezoelectric plate comprising a piezoelectric material having a certain Poisson's ratio $\sigma$ and changed the integer n to a non-integer number in the equation (3) over a range of 0.85 to 1.11, to measure a ratio of an amount of displacement at a point P exhibiting the minimum value to that of a point Q exhibiting the maximum value shown in FIG. 54, i.e., relative displacement (%). FIG. 56B shows the result.

It is clearly understood from FIG. 56B that the relative displacement is not more than 10% when the value for the non-integer number n is within a range of about 0.9 to 1.1. On the other hand, it has been recognized that substantially no problem is caused in the formation of a resonator when the relative displacement is not more than 10%. Therefore, it is possible to effectively trap vibrational energy in a piezoelectric vibrating part when the ratio b/a is in a range of ±10% from a value satisfying the equation (1).

As hereinabove described, it has been recognized that it is possible to provide a piezo-resonator which is excellent in energy trap efficiency by bringing the ratio b/a into a range of ±10% from a value satisfying the equation (3) in a piezoelectric vibrating part having lengths a and b of shorter and longer sides with a Poisson's ratio σ of the material forming the piezoelectric plate. As to the aforementioned bending mode vibration of secondary harmonics, it has been confirmed that nodal points of this vibration are present in a center of the rectangular surface and centers of side surfaces along both shorter sides when no coupling parts 522 and 523 are coupled to the piezoelectric plate 521.

Example of Third Type Piezo-Resonator

Figure 57:
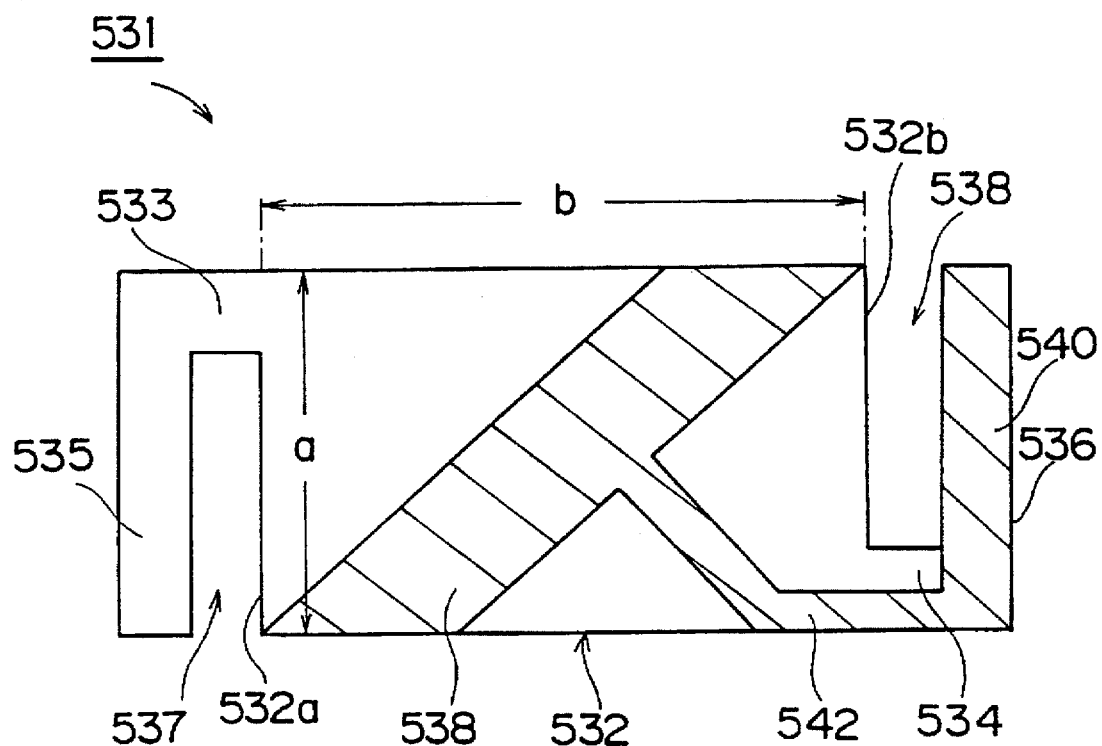
FIG. 57 is a plan view showing an example of a third piezo-resonator.
Figure 58:
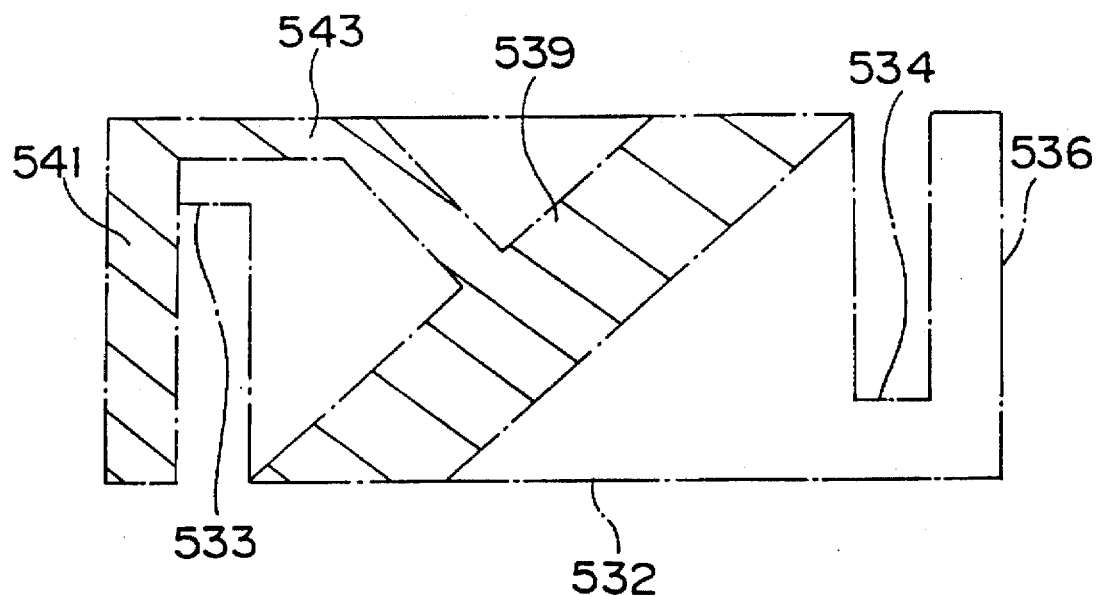
FIG. 58 is a typical plan view showing the shape of an electrode provided on a lower surface of the piezo-resonator shown in FIG. 57, through a piezoelectric plate.

FIG. 57 is a plan view showing an example of a third type piezo-resonator 531, and FIG. 58 is a typical plan view showing a shape of an electrode provided on a lower surface through a piezoelectric plate.

The piezo-resonator 531 has a rectangular piezoelectric plate 532, support parts 533 and 534, and holding parts 535 and 536. The piezoelectric plate 532 is preferably made of a piezoelectric material such as lead titanate zirconate piezoelectric ceramics, for example, and uniformly polarized along its thickness when the same is made of piezoelectric ceramics. This piezoelectric plate 532 has a rectangular planar shape, and the first support part 533 is coupled to an end of a first side surface 532a along a shorter side, while the second support part 534 is coupled to an end of a second side surface 532b along another shorter side. Further, the holding parts 535 and 536 having larger areas than the support parts 533 and 534 are coupled to outer sides of the support parts 533 and 534, respectively.

In the piezo-resonator 531, the piezoelectric plate 532, the first and second support parts 533 and 534 and the first and second holding parts 535 and 536 are formed by preparing a single piezoelectric plate and providing grooves 537 and 538 in this piezoelectric plate. Namely, the piezoelectric plate 532, the first and second support parts 533 and 534 and the holding parts 535 and 536 are integrally formed by the same material. Alternatively, the piezoelectric plate 532, the first and second support parts 533 and 534 and the first and second holding parts 535 and 536 maybe formed by separate members, to be bonded and integrated to and with each other by an adhesive or the like.

The piezoelectric plate 532 has a rectangular planar shape, which is so formed that a ratio b/a is in a range of ±10% from a value satisfying the equation (3) assuming that a and b represent lengths of shorter and longer sides of the rectangular surface and σ represents the Poisson's ratio of the material forming the piezoelectric plate 532.

A first resonance electrode 538 is formed on an upper surface of the piezoelectric plate 532, while a second resonance electrode 539 is formed on a lower surface to be opposed to the first resonance electrode 538 through piezoelectric plate 532. The first and second resonance electrodes 538 and 539 are formed to substantially meet the positive polarity region shown in FIG. 55. Namely, the first and second resonance electrodes 538 and 539 extend in a direction along the phantom line D shown in FIG. 55, i.e., a direction substantially along one of the diagonal lines.

A lead electrode 540 is formed on the second holding part 536, while a lead electrode 541 is formed on a lower surface of the first holding part 535. The first resonance electrode 538 is electrically connected to the lead electrode 540 through a connecting conductive part 542, while the second resonance electrode 539 is electrically connected to the lead electrode 541 through a connecting conductive part 543.

When an alternating voltage is applied across the lead electrodes 540 and 541 in the piezo-resonator 531, the alternating voltage is applied across the first and second resonance electrodes 538 and 539, thereby strongly exciting the aforementioned bending mode vibration of secondary harmonics.

In this case, the ratio b/a of the lengths of the longer and shorter sides of the piezoelectric plate 532 is set in the range of ±10% from the value satisfying the equation (3), whereby vibration is effectively trapped in a portion up to the support parts 533 and 534. Even if the piezoelectric plate 532 is mechanically held through the holding parts 535 and 536, therefore, resonance characteristics are hardly deteriorated. In other words, it is possible to provide an energy trap type piezo-resonator 531 effectively trapping vibrational energy in the portion up to the support parts 533 and 534.

Tenth Preferred Embodiment

Figure 59:
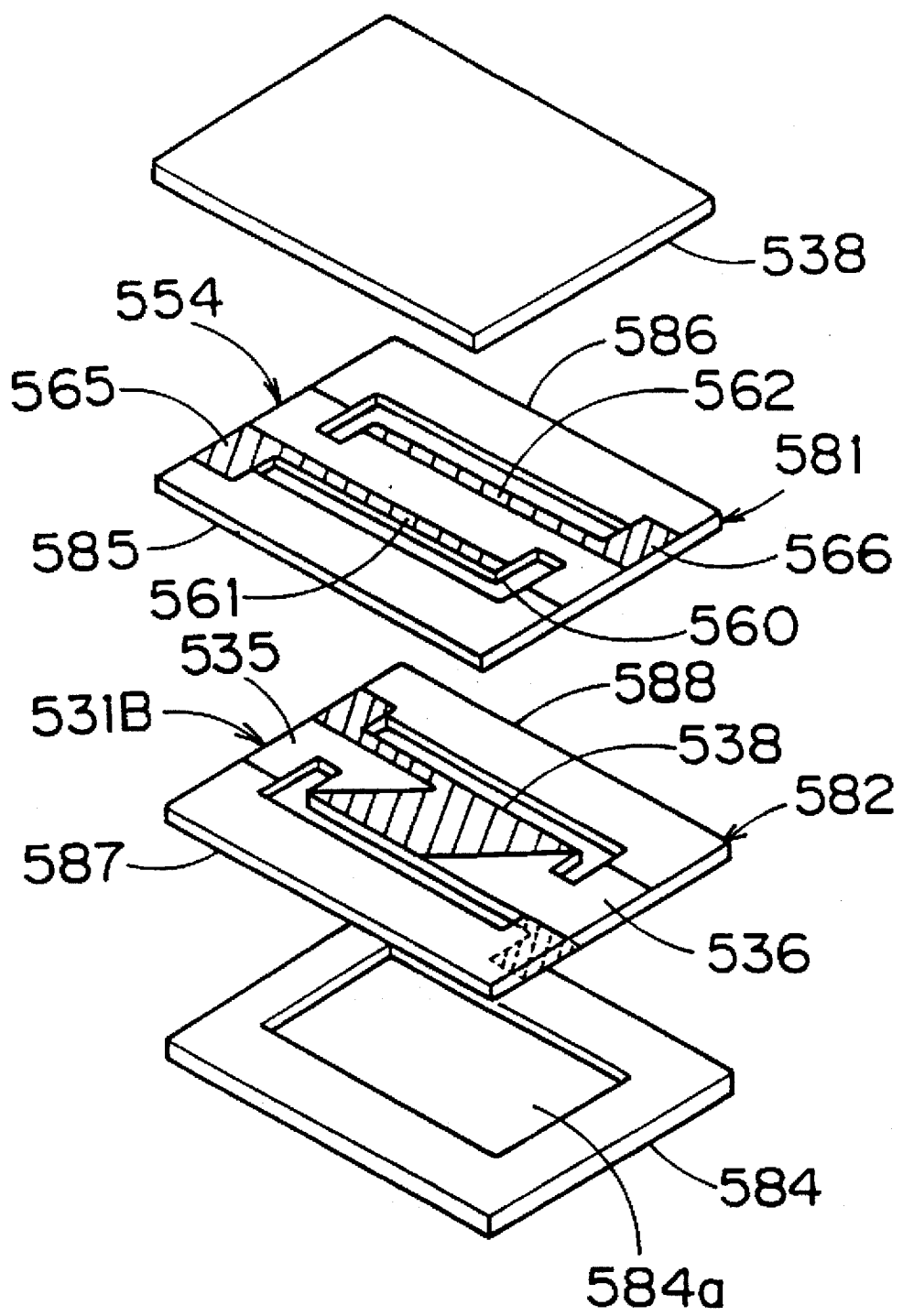
FIG. 59 is an exploded perspective view for illustrating a ladder-type filter according to a tenth preferred embodiment the present invention.
Figure 60:
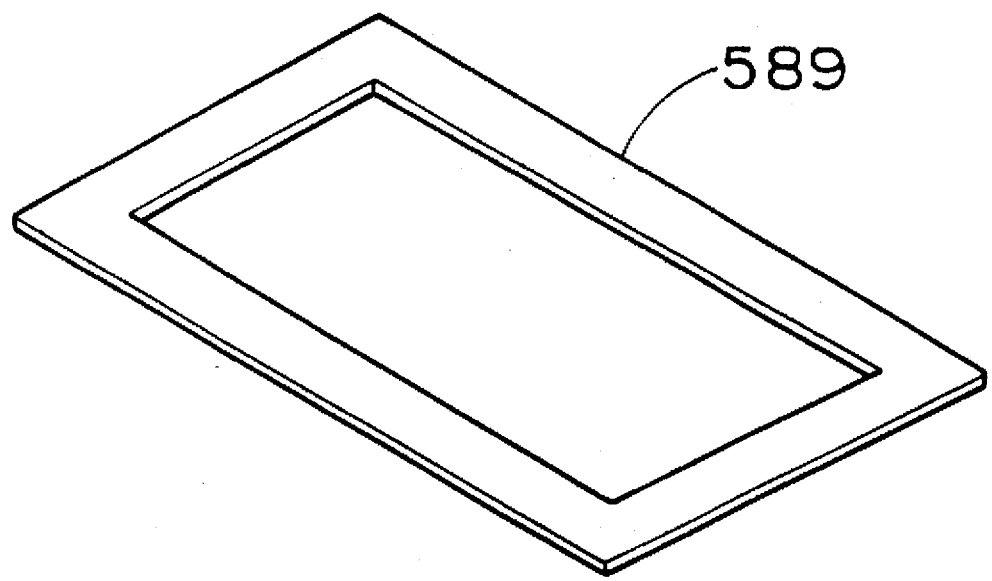
FIG. 60 is a perspective view showing a spacer.
Figure 61:
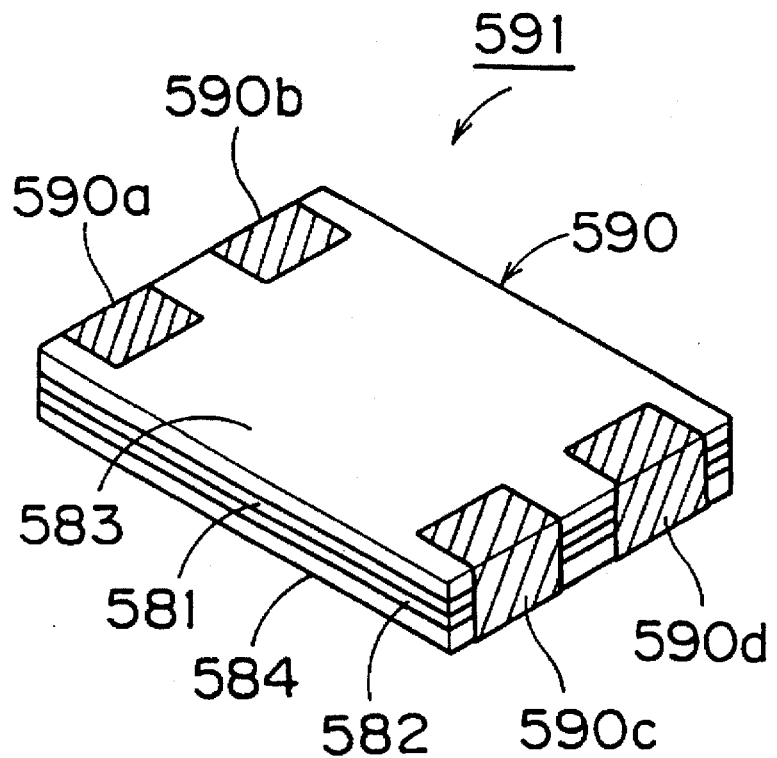
FIG. 61 is a perspective view showing the appearance of the ladder-type filter according to the tenth preferred embodiment.

FIGS. 59 to 61 are an exploded perspective view for illustrating a ladder-type filter according to a tenth preferred embodiment of the present invention, a perspective view showing a spacer, and a perspective view showing the appearance of the ladder-type filter, respectively.

Referring to FIG. 59, resonance plates 581 and 582 and first and second case substrates 583 and 584 are stacked with each other in the tenth preferred embodiment. A cavity 584a is formed on an upper surface of the second case substrate 584, while a cavity is also formed on a lower surface of the first case substrate 583.

The resonance plate 581 has a structure such that first and second spacer plates 585 and 586 are bonded to both side edges of a second type piezo-resonator 554 utilizing a shear mode. On the other hand, the resonance plate 582 has a structure such that first and second spacer plates 587 and 588 are bonded to both side portions of a third type piezo-resonator 531B.

The piezo-resonator 531B is substantially similar in structure to the piezo-resonator 531 shown in FIG. 57. The former is different from the latter merely in shapes of connecting conductive parts and positions provided with lead electrodes.

The first and second spacer plates 585, 586, 587 and 588 are similar in structure to the first and second spacer plates 29 and 30 shown in FIG. 29.

In the ladder-type filter according to this preferred embodiment, the first and second resonance plates 581 and 582 are stacked with each other through a spacer 589 shown in FIG. 60.

The spacer 589, which is in the form of a rectangular frame, is inserted for ensuring a space for allowing vibration of vibrating parts of the piezo-resonator 554 and the first piezo-resonator 531B after stacking the first and second resonance plates 581 and 582 with each other.

It is possible to obtain a laminate 590 shown in FIG. 61 by stacking the resonance plates 581 and 582 as described above and further pasting the first and second case substrates 583 and 584 to upper and lower portions of the laminate structure. Further, it is possible to obtain a ladder-type filter 591 by forming external electrodes 590a, 590b, 590c, and 590d on both side surfaces of the laminate 590.

Figure 62:
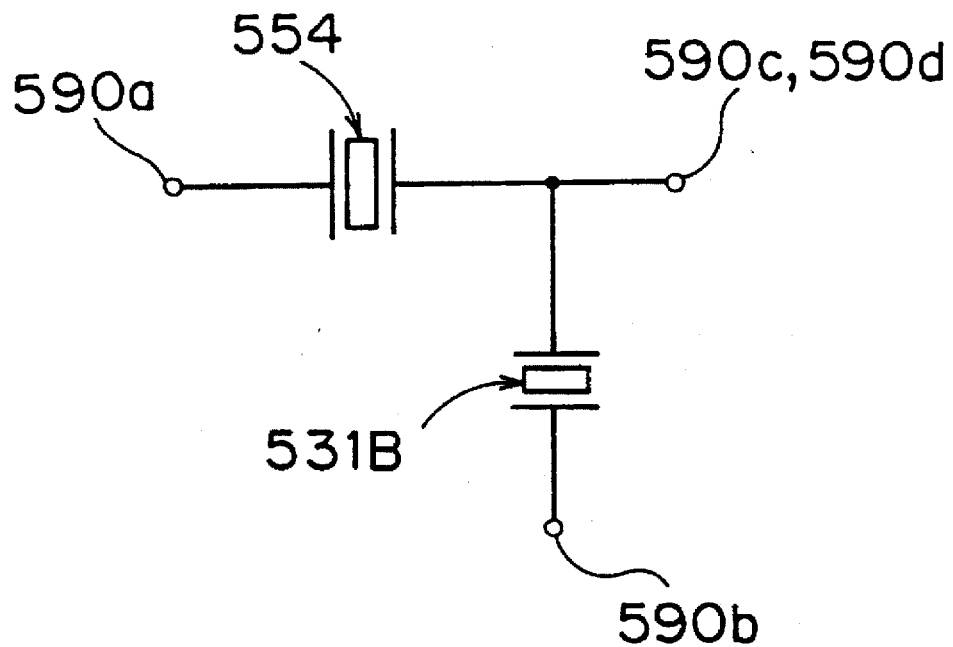
FIG. 62 illustrates a circuit structure of the ladder-type filter according to the tenth preferred embodiment.

It is possible to drive this ladder-type filter 591 as a one-stage ladder-type filter shown in FIG. 62, by employing the external electrode 590a as an input end, connecting the external electrode 590b to a reference potential and connecting the external electrodes 590c and 590d in common for employing the same as an output end.

Other Preferred Embodiments

As clearly understood from the aforementioned first to tenth preferred embodiments, at least two piezo-resonators are stacked with each other in the inventive ladder-type filter. Thus, it is possible to readily obtain a chip-like ladder-type filter. In each of the first to fourth type piezo-resonators, further, vibrational energy is effectively trapped in the piezoelectric vibrating part as described above, whereby resonance characteristics of the piezo-resonator are hardly deteriorated even if the resonators are mechanically supported at the holding parts. Therefore, it is possible to effectuate the resonance characteristics of each piezo-resonator as desired by connecting the same to other members at the holding parts as described with reference to each of the first to tenth preferred embodiments. Thus, it is possible to reliably provide a ladder-type filter having stable characteristics.

While a first piezo-resonator and an additional piezo-resonator are bonded with each other as needed and first and second spacer plates are bonded to both sides thereof to define a resonance plate in each of the first to tenth preferred embodiments, the resonance plate may alternatively be integrally formed by the same material. In the preferred embodiment shown in FIG. 29, for example, a rectangular piezoelectric plate may be prepared so that the same is worked with a laser beam or the like to meet the planar shape of the resonance plate 22 and provided with prescribed electrode patterns on both surfaces, thereby obtaining the resonance plate 22. In this case, it is possible to omit bonding portions provided on outer peripheral edges of the resonance plate 22 since the resonance plate 22 is formed by an integral member, thereby improving moisture resistance of the chip-like filter. In other words, it is possible to reliably prevent infiltration of moisture from side portions of the resonance plate 22 in the chip-like filter as obtained.

While a fourth type piezo-resonator utilizing a shear mode is shown in each of the first to third preferred embodiments as a piezo-resonator which is combined with a first type piezo-resonator, this piezo-resonator may alternatively be prepared from another energy trap type piezo-resonator such as that utilizing a width expansion mode or a length expansion mode, for example.

Figure 63:
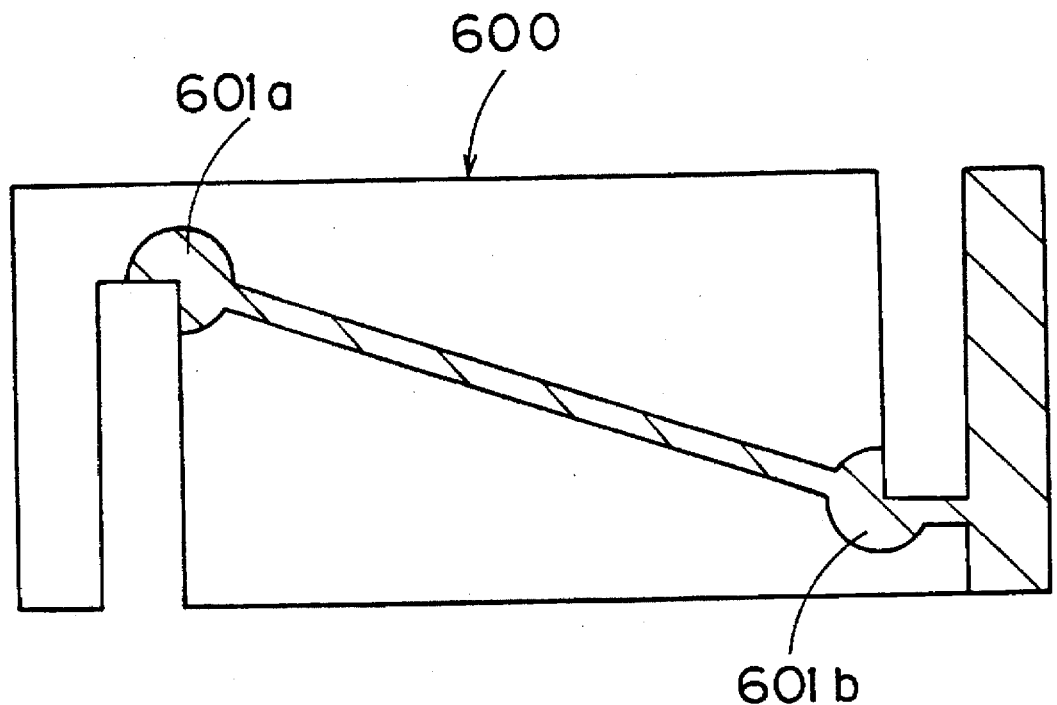
FIGS. 63 is a plan view for illustrating another example of the third type piezo-resonator.
Figure 64:
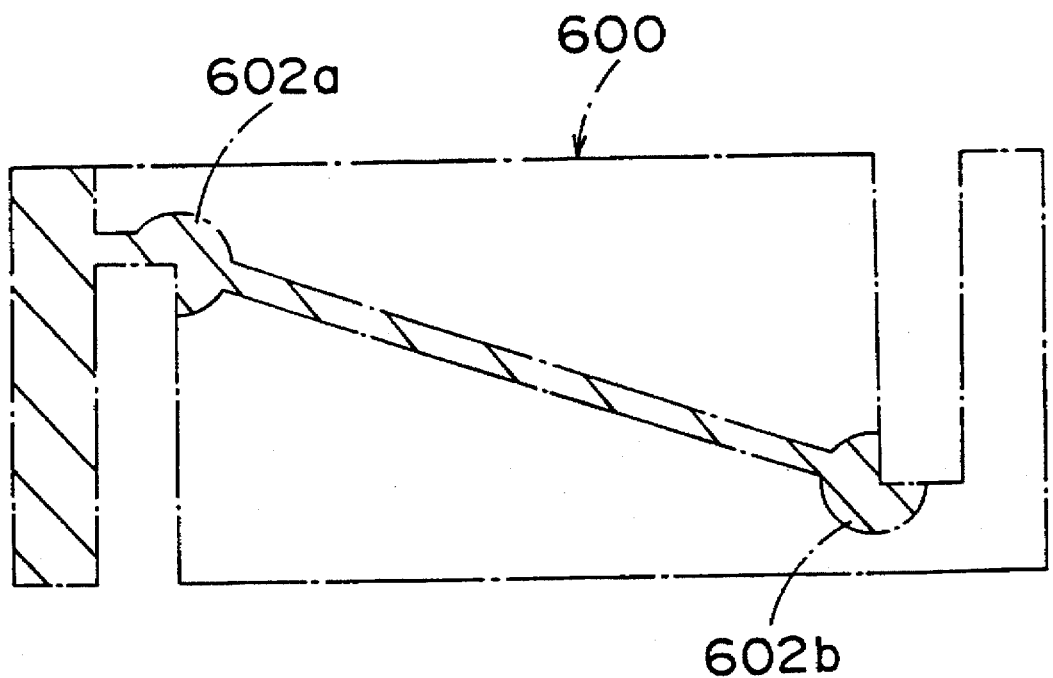
FIG. 64 is a plan view showing the shapes of a lower electrode of the third type piezo-resonator through a piezoelectric plate.

Further, the electrode shapes of the third type piezo-resonator are not restricted to those shown in FIGS. 57 and 58. As shown in FIGS. 63 and 64, for example, a pair of first resonance electrodes 601a and 601b may be formed on an upper surface of a piezoelectric vibrating part 600 so that a pair of second resonance electrodes 602a and 602b are formed on a lower surface to be opposed to the first resonance electrodes 601a and 601b, respectively. In this case, the first and second resonance electrodes 601a to 602b are formed in portions having strong negative polarity in the charge distribution shown in FIG. 55. Therefore, bending mode vibration of degree 2 n is reliably excited so that energy is trapped in the piezoelectric vibrating part 600, although the same is out of phase with the piezo-resonator 531 shown in FIG. 57.

Although the preferred embodiments of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ladder-type filter comprising at least one series resonator forming a series arm and at least one parallel resonator forming a parallel arm, said ladder-type filter comprising:

at least one plate type resonator; and at least one additional plate type resonator being stacked on said at least one resonator, at least one of said series and parallel resonators being an energy trap type resonator having a plate type piezoelectric vibrator, a support part being coupled to said piezoelectric vibrator, and a holding part being coupled to said support part;

wherein said at least one of said series and parallel resonators is an energy trap type piezoelectric vibrator utilizing a shear mode, said piezoelectric vibrator having a plate type piezoelectric member being polarized in one direction and first and second resonance electrodes being formed on said piezoelectric member for applying an alternating voltage in a direction being perpendicular to said polarization direction, a piezoelectric surface being parallel to said polarization direction having a rectangular shape with a ratio b/a being set in a range of ±10% from the following value:

$$b/a = n(0.3\sigma + 1.48)$$

assuming that a and b represent lengths of shorter and longer sides of said rectangular surface, σ represents the Poisson's ratio of said piezoelectric member and n represents an integer.

2. A ladder-type filer in accordance with claim 1, further comprising a dynamic damper being provided between said holding part and said support part.

3. A ladder-type filter in accordance with claim 1, further comprising first and second base substrates, said at least one resonator and said at least one additional resonator being held between said first and second base substrates.

4. A ladder-type filter in accordance with claim 1, further comprising a base substrate and a cap member being fixed onto said base substrate, at least two said series resonators being stacked on said base substrate, said cap member being fixed to said base substrate to enclose said plurality of resonators being stacked with each other.

5. A ladder-type filter in accordance with claim 1, wherein said support part and said holding part are coupled onto each side of said piezoelectric vibrator.

6. A ladder-type filter in accordance with claim 5, further comprising first and second base substrates, said at least one resonator and said at least one additional resonator being held between said first and second base substrates.

7. A ladder-type filter in accordance with claim 5, further comprising a base substrate and a cap member being fixed onto said base substrate, at least two said series resonators being stacked on said base substrate, said cap member being fixed to said base substrate to enclose said plurality of resonators being stacked with each other.

8. A ladder-type filter in accordance with claim 1, wherein every one of said series and parallel resonators has a plate type piezoelectric vibrator, as well as a support part being coupled to said piezoelectric vibrator and a holding part being coupled to said support part arranged on each side of said piezoelectric vibrator.

9. A ladder-type filter in accordance with claim 8, wherein first and second spacer plates are coupled to sides of said holding parts thereby defining a resonance.

10. A ladder-type filter in accordance with claim 9, wherein said piezoelectric vibrators and said first and second spacer plates defining said resonance plate are integrally formed by the same member.

11. A ladder-type filter in accordance with claim 8, wherein at least one additional piezoelectric vibrator is coupled to at least one side of said holding parts, said holding parts being provided on both sides of said piezoelectric vibrators to allow vibration thereof.

12. A ladder-type filter in accordance with claim 11, wherein first and second spacer plates are coupled to sides of said piezoelectric vibrators, thereby defining a resonance plate.

13. A ladder-type filter in accordance with claim 12, wherein a plurality of said piezoelectric vibrators and said first and second spacer plates defining said resonance plate are integrally formed by the same member.

14. A ladder-type filter in accordance with claim 1, further comprising:

first and second resonance electrodes being provided on said piezoelectric vibrator, and a lead electrode being formed on said holding part, said first and second resonance electrodes being electrically connected to said lead electrode.

15. A ladder-type filter in accordance with claim 14, further comprising a plurality of external electrodes being formed on its outer surface, said plurality of external electrodes being electrically connected to prescribed said lead electrodes.

* * * * *